(12) United States Patent
Stoessel et al.

(10) Patent No.: US 10,454,040 B2
(45) Date of Patent: Oct. 22, 2019

(54) MATERIALS FOR ELECTRONIC DEVICES

(71) Applicant: Merck Patent GmbH, Darmstadt (DE)

(72) Inventors: Philipp Stoessel, Frankfurt am Main (DE); Frank Voges, Bad Duerkheim (DE); Arne Buesing, Frankfurt am Main (DE); Christof Pflumm, Darmstadt (DE); Teresa Mujica-Fernaud, Darmstadt (DE); Jonas V. Kroeber, Frankfurt am Main (DE)

(73) Assignee: Merck Patent GmbH (DE)

( * ) Notice: Subject to any disclaimer, the term of this patent is extended or adjusted under 35 U.S.C. 154(b) by 362 days.

(21) Appl. No.: 14/428,772

(22) PCT Filed: Aug. 20, 2013

(86) PCT No.: PCT/EP2013/002501
§ 371 (c)(1),
(2) Date: Mar. 17, 2015

(87) PCT Pub. No.: WO2014/044344
PCT Pub. Date: Mar. 27, 2014

(65) Prior Publication Data
US 2015/0236261 A1  Aug. 20, 2015

(30) Foreign Application Priority Data

Sep. 18, 2012 (EP) .................................... 12006553

(51) Int. Cl.
| | | |
|---|---|---|
| *H01L 51/00* | (2006.01) | |
| *C09K 11/06* | (2006.01) | |
| *H05B 33/22* | (2006.01) | |
| *H01L 51/50* | (2006.01) | |
| *H01L 51/52* | (2006.01) | |

(52) U.S. Cl.
CPC ............ *H01L 51/006* (2013.01); *C09K 11/06* (2013.01); *H01L 51/0056* (2013.01); *H01L 51/0059* (2013.01); *H01L 51/0061* (2013.01); *H01L 51/0071* (2013.01); *H01L 51/0072* (2013.01); *H01L 51/0094* (2013.01); *H01L 51/5056* (2013.01); *H05B 33/22* (2013.01); *C09K 2211/1014* (2013.01); *H01L 51/0058* (2013.01); *H01L 51/0067* (2013.01); *H01L 51/0073* (2013.01); *H01L 51/0074* (2013.01); *H01L 51/5012* (2013.01); *H01L 51/5064* (2013.01); *H01L 51/5072* (2013.01); *H01L 51/5088* (2013.01); *H01L 51/5096* (2013.01); *H01L 51/5221* (2013.01); *H01L 2251/301* (2013.01); *H01L 2251/308* (2013.01); *Y02E 10/549* (2013.01)

(58) Field of Classification Search
CPC ............ H01L 51/006; H01L 51/0056; H01L 51/0071; H01L 51/0094; H01L 51/0061; H01L 51/0059; H01L 51/0072; H01L 51/5056; H01L 51/0067; H01L 51/0073; H01L 51/0074; H01L 51/5012; H01L 51/5064; H01L 51/5072; H01L 51/5088; H01L 51/5096; H01L 2251/308; H01L 2251/301; H01L 51/5221; H01L 51/0058; H05B 33/22; Y02E 10/549; C09K 2211/1014; C09K 11/06

See application file for complete search history.

(56) References Cited

U.S. PATENT DOCUMENTS

| | | | | |
|---|---|---|---|---|
| 4,127,412 | A * | 11/1978 | Rule ...................... | G03G 5/06 430/73 |
| 2003/0016718 | A1* | 1/2003 | Toda ...................... | H01S 3/06 372/66 |
| 2005/0056859 | A1* | 3/2005 | Liu ...................... | H01L 51/0021 257/103 |
| 2006/0105200 | A1* | 5/2006 | Poplavskyy ........... | B82Y 10/00 428/690 |
| 2008/0093986 | A1* | 4/2008 | Inoue ..................... | C09D 11/50 313/504 |
| 2008/0206598 | A1* | 8/2008 | Ohsawa ................ | H01L 51/006 428/690 |
| 2012/0326141 | A1 | 12/2012 | Pflumm et al. | |

FOREIGN PATENT DOCUMENTS

| | | |
|---|---|---|
| EP | 650955 A1 | 5/1995 |
| EP | 18349415 A1 | 9/2007 |
| EP | 1885008 A1 | 2/2008 |
| JP | H0705395 A | 2/1995 |
| JP | 2001226331 A | 8/2001 |
| JP | 2006-344544 | 12/2006 |
| JP | 2008-046167 | 2/2008 |
| JP | 2008-291011 | 12/2008 |
| JP | 2010-164951 | 7/2010 |
| JP | 2010222268 A | 10/2010 |
| WO | WO-2011/110262 A1 | 9/2011 |

OTHER PUBLICATIONS

International Search Report for PCT/EP2013/002501 dated Nov. 27, 2013.
Nikulin, M., et al., "The cocrystal 10-(2-methyl-4-phenyl-1H-inden-6-yl)-10H-phenothiazine-10-(2-methyl-7phenyl-1H-inden-5-yl)-10H-phenothiazine (05.4/0.46)", Acta Crystallographics Section: Structure Reports Online, 2008, E64, pp. 2317, sup.-1-sup-14.
Japanese Office Action for Application No. 2015-532315, dated Jun. 13, 2017.

* cited by examiner

*Primary Examiner* — Alexander C Kollias
(74) *Attorney, Agent, or Firm* — Drinker Biddle & Reath LLP

(57) ABSTRACT

The invention relates to a mixture containing at least two different triaryl amino compounds of formula (I). The mixture is suitable for use in an electronic device, preferably in an organic electroluminescent device, and in particular for use as a hole transport layer.

16 Claims, No Drawings

MATERIALS FOR ELECTRONIC DEVICES

CROSS-REFERENCE TO RELATED APPLICATIONS

This application is a national stage application (under 35 U.S.C. § 371) of PCT/EP2013/002501, filed Aug. 20, 2013, which claims benefit of European Application No. 12006553.7, filed Sep. 18, 2012, both of which are incorporated herein by reference in their entirety.

The present application relates to a mixture comprising at least two different compounds of a formula (I). The mixture is suitable for use in electronic devices, in particular organic electroluminescent devices, in particular in a hole-transporting layer.

Electronic devices in the sense of this application are taken to mean, in particular, so-called organic electronic devices which comprise organic semiconductor materials as functional materials. Again in particular, these are taken to mean organic electroluminescent devices (OLEDs) and other electronic devices mentioned below.

OLEDs already achieve excellent results in many aspects, but there continues to be a need for improvement, in particular with respect to power efficiency, lifetime and colour coordinates of the emitted light. In order to improve the properties, there is considerable interest in novel materials and mixtures for use in the devices.

The prior art discloses the use of simple triarylamino compounds, such as, for example, tris(para-biphenyl)amine or tris(para-triphenyl)amine (JP 1995/053955 A) in OLEDs. Also known is the use of simple triarylamino compounds which have para- and meta-links of the individual phenyl groups (WO 2006/123667 A1 and JP 2010/222268 A). The said compounds are preferably used as hole-transport materials. They are simple and inexpensive to prepare in high purity and are therefore very attractive for use as functional materials in OLEDs.

However, the said compounds have the property of partially crystallising on heating above the glass transition temperature. This typically results in impairment of the performance data of the OLEDs in operation, since operation is accompanied by warming of the OLEDs.

The technical object is therefore to provide materials which enable constant retention of the performance data of the OLEDs in operation, i.e. on warming as a result of operation or on warming of the OLED owing to other causes, for example elevated ambient temperatures.

This object is achieved in accordance with the invention by a mixture comprising two or more different compounds of the formula (I)

formula (I)

where the following applies to the compounds of the formula (I):

$Ar^1$ is on each occurrence, identically or differently, an aromatic or heteroaromatic ring system having 5 to 60 aromatic ring atoms, which may be substituted by one or more radicals $R^1$;

$R^1$ is on each occurrence, identically or differently, H, D, F, $C(=O)R^2$, CN, $Si(R^2)_3$, $P(=O)(R^2)_2$, $S(=O)R^2$, $S(=O)_2R^2$, a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals $R^2$ and where one or more $CH_2$ groups in the above-mentioned groups may be replaced by $-R^2C=CR^2-$, $-C\equiv C-$, $Si(R^2)_2$, $C=O$, $C=S$, $C=NR^2$, $-C(=O)O-$, $-C(=O)NR^2-$, $P(=O)(R^2)$, $-O-$, $-S-$, SO or $SO_2$ and where one or more H atoms in the above-mentioned groups may be replaced by D, F or CN, or an aromatic or heteroaromatic ring system having 5 to 30 aromatic ring atoms, which may in each case be substituted by one or more radicals $R^2$, or an aryloxy or heteroaryloxy group having 5 to 30 aromatic ring atoms, which may be substituted by one or more radicals $R^2$, where two or more radicals $R^1$ may be linked to one another and may form a ring;

$R^2$ is on each occurrence, identically or differently, H, D, F or an aliphatic, aromatic or heteroaromatic organic radical having 1 to 20 C atoms, in which, in addition, one or more H atoms may be replaced by D or F; two or more substituents $R^2$ here may be linked to one another and may form a ring;

where one, two or three groups $Ar^1$ are selected, identically or differently, from aromatic ring systems having 12 to 60 aromatic ring atoms, which may be substituted by one or more radicals $R^1$.

The mixtures have the surprising advantage that they have little or no tendency towards crystallisation on heating above the glass transition temperature. OLEDs comprising the mixture according to the invention have they the surprising advantage that they retain their performance data even on warming. Furthermore, OLEDs comprising the mixture according to the invention have the advantage that they have a reduced voltage with otherwise constant performance data.

The following definitions apply:

An aryl group in the sense of this invention contains 6 to 60 aromatic ring atoms; a heteroaryl group in the sense of this invention contains 5 to 60 aromatic ring atoms, at least one of which is a heteroatom. The heteroatoms are preferably selected from N, O and S. This represents the basic definition. If other preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aryloxy group in accordance with the definition of the present invention is taken to mean an aryl group, as defined above, which is bonded via an oxygen atom. An analogous definition applies to heteroaryloxy groups.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formulation that two or more radicals may form a ring with one another is, for the purposes of the present application, intended to be taken to mean, inter alia, that the two radicals are linked to one another by a chemical bond. This is illustrated by the following scheme:

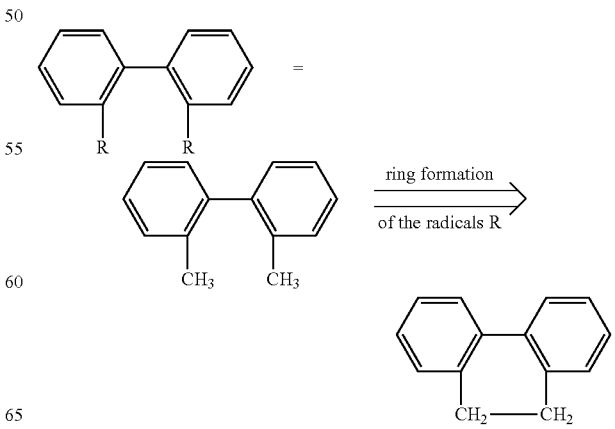

Furthermore, however, the above-mentioned formulation is also intended to be taken to mean that, in the case where one of the two radicals represents hydrogen, the second radical is bonded at the position to which the hydrogen atom was bonded, with formation of a ring. This is illustrated by the following scheme:

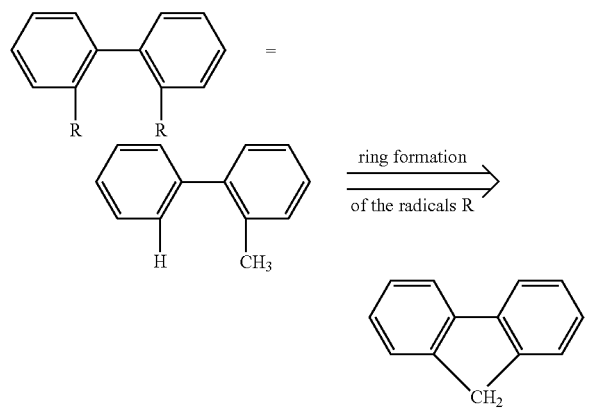

The mixture according to the invention preferably comprises precisely two, three or four different compounds of the formula (I), particularly preferably precisely two or three.

The mixture may comprise further compounds in addition to the at least two compounds of the formula (I). It is preferred here for them to be present in a small proportion, particularly preferably in a proportion of less than 20%.

For the purposes of the present application, "%" is taken to mean percent by weight if the materials are applied from solution, for example by a printing process, and "%" is taken to mean percent by volume in the case of application from the gas phase, for example by evaporation. For the purposes of the present application, "%" is preferably taken to mean percent by weight.

It is particularly preferred that the mixture according to the invention comprises less than 10% of compounds which do not conform to formula (I). It very particularly preferably comprises less than 5%, more preferably less than 2% and even more preferably less than 1% of compounds which do not conform to formula (I).

It is most preferred that the mixture essentially comprises no further compounds besides the at least two compounds of the formula (I).

Compounds which are present in the mixtures according to the invention besides the compounds of the formula (I) are preferably selected from compounds which are typically used as components of hole-transport layers, hole-injection layers or electron-blocking layers in OLEDs. Preference is given to indenofluorenamine derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic rings (for example in accordance with U.S. Pat. No. 5,061,569), the amine derivatives disclosed in WO 95/09147, monobenzoindenofluorenamines (for example in accordance with WO 08/006449) or dibenzoindenofluorenamines (for example in accordance with WO 07/140847). Furthermore, derivatives of these compounds, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569, may be present.

According to a preferred embodiment, the mixture comprises one or more p-dopants. The p-dopants employed in accordance with the present invention are preferably organic electron-acceptor compounds which are able to oxidise one or more of the other compounds of the mixture. Particularly preferred embodiments of p-dopants are the compounds disclosed in WO 2011/073149, EP 1968131, EP 2276085, EP 2213662, EP 1722602, EP 2045848, DE 102007031220, U.S. Pat. No. 8,044,390, 8,057,712, WO 2009/003455, WO 2010/094378, WO 2011/120709, US 2010/0096600 and WO 2012/095143.

Very particular preference is given to the free-radical compounds disclosed in U.S. Pat. No. 8,057,712, the quinoid organic compounds disclosed in WO 2009/003455, the quadratic-planar transition-metal complexes, in particular Cu complexes, disclosed in WO 2011/120709, the polynuclear Cu complexes disclosed in WO 2011/033023, in particular those with carboxylate ligands, and the quadratic-planar transition-metal complexes containing a central atom from the 8th-12th group, in particular nickel, disclosed in US 2010/0096600.

Particularly preferred p-dopants are quinodimethane compounds, azaindenofluorenediones, azaphenalenes, azatriphenylenes, 12, metal halides, preferably transition-metal halides, metal oxides, preferably metal oxides containing at least one transition metal or a metal from the 3rd main group, and transition-metal complexes, preferably complexes of Cu, Co, Ni, Pd and Pt with ligands containing at least one oxygen atom as bonding site. Preferred dopants are furthermore transition-metal oxides, preferably oxides of rhenium, molybdenum and tungsten, particularly preferably $Re_2O_7$, $MoO_3$, $WO_3$ and $ReO_3$.

Very particularly preferred p-dopants are the following compounds:

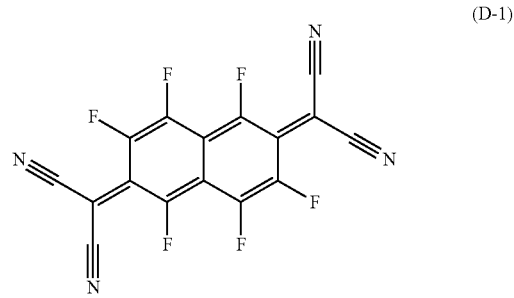

(D-1)

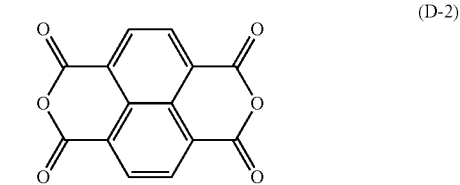

(D-2)

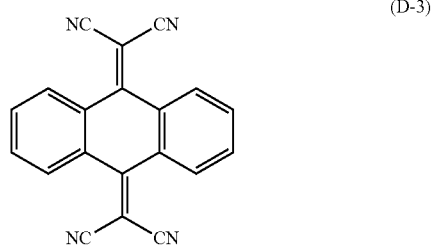

(D-3)

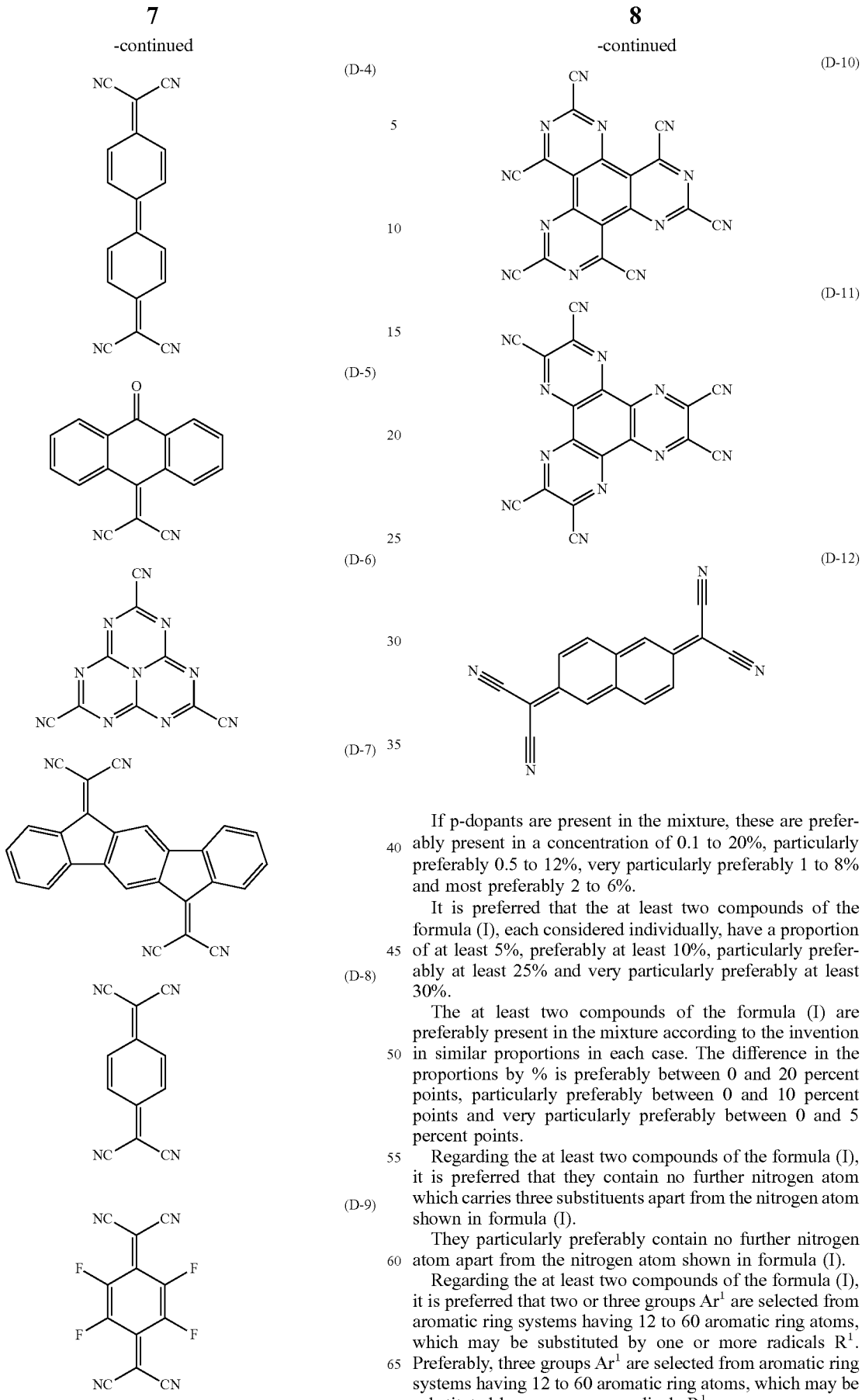

If p-dopants are present in the mixture, these are preferably present in a concentration of 0.1 to 20%, particularly preferably 0.5 to 12%, very particularly preferably 1 to 8% and most preferably 2 to 6%.

It is preferred that the at least two compounds of the formula (I), each considered individually, have a proportion of at least 5%, preferably at least 10%, particularly preferably at least 25% and very particularly preferably at least 30%.

The at least two compounds of the formula (I) are preferably present in the mixture according to the invention in similar proportions in each case. The difference in the proportions by % is preferably between 0 and 20 percent points, particularly preferably between 0 and 10 percent points and very particularly preferably between 0 and 5 percent points.

Regarding the at least two compounds of the formula (I), it is preferred that they contain no further nitrogen atom which carries three substituents apart from the nitrogen atom shown in formula (I).

They particularly preferably contain no further nitrogen atom apart from the nitrogen atom shown in formula (I).

Regarding the at least two compounds of the formula (I), it is preferred that two or three groups Ar$^1$ are selected from aromatic ring systems having 12 to 60 aromatic ring atoms, which may be substituted by one or more radicals R$^1$.

Preferably, three groups Ar$^1$ are selected from aromatic ring systems having 12 to 60 aromatic ring atoms, which may be substituted by one or more radicals R$^1$.

Ar¹ is preferably selected on each occurrence, identically or differently, from an aromatic or heteroaromatic ring system having 5 to 30 aromatic ring atoms, which may be substituted by one or more radicals R¹.

Regarding the at least two compounds of the formula (I), it is preferred that at least one group Ar¹ in the compounds of the formula (I) conforms to the formula (II), (III) or (IV)

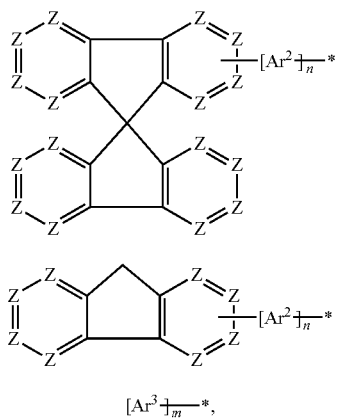

formula (II)

formula (III)

formula (IV)

where the marked bond corresponds to the bond to the nitrogen atom,
Z is on each occurrence, identically or differently, CR¹ or N, where not more than 2 adjacent groups Z stand for N,
Ar² and Ar³ is on each occurrence, identically or differently, an aryl or heteroaryl group having 5 to 10 aromatic ring atoms, which may be substituted by one or more radicals R¹,
n has a value of 0 to 3,
m has a value of 2 to 4,
and the groups of the formula (II), (III) and (IV) may be substituted by radicals R¹ at all free positions.

Preferably, at least two, particularly preferably all three groups Ar¹ in the at least two compounds of the formula (I) conform to one of the formulae (II), (III) or (IV).

It is furthermore preferred for the mixtures according to the invention that at least one of the at least two compounds of the formula (I) conforms to one of the formulae (V) to (IX)

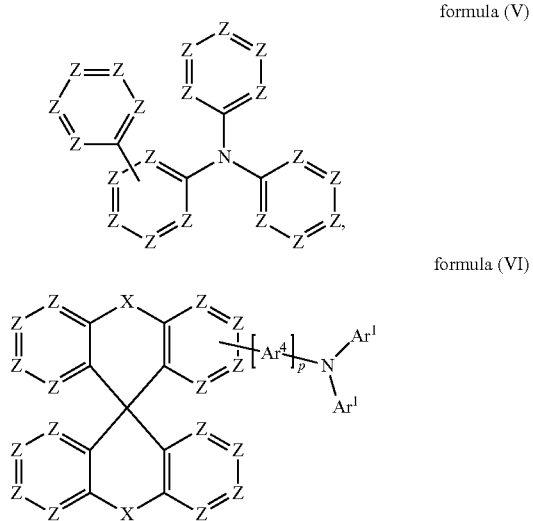

formula (V)

formula (VI)

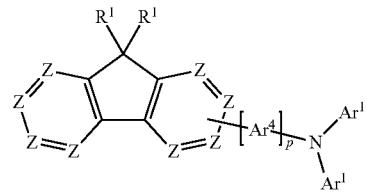

formula (VII)

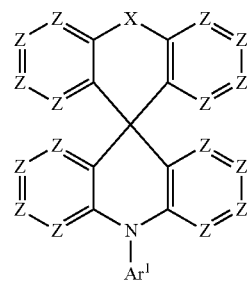

formula (VIII)

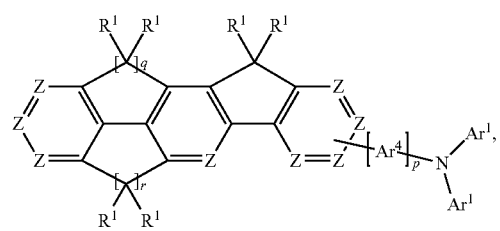

formula (IX)

where the following applies:
Z is on each occurrence, identically or differently, CR¹ or N, where not more than two adjacent groups Z stand for N.
X is on each occurrence, identically or differently, a single bond, O, S, Se, BR¹, C(R¹)₂, Si(R¹)₂, NR¹, PR¹, C(R¹)₂—C(R¹)₂, or CR¹=CR¹;
Ar¹ is defined as above;
Ar⁴ is on each occurrence, identically or differently, an aromatic or heteroaromatic ring system having 5 to 30 aromatic ring atoms, which may be substituted by one or more radicals R¹;
R¹ is defined as above;
R² is defined as above;
p is equal to 0 or 1;
q, r are, identically or differently, 0 or 1, where the sum of q and r is equal to 1 or 2.

Preferably, two of the at least two compounds of the formula (I) conform to one of the above-mentioned formulae (V), (VI), (VII), (VIII) or (IX).

It is particularly preferred for the mixtures according to the invention that at least one of the at least two compounds of the formula (I) conforms to the formula (V-1)

formula (V-1)

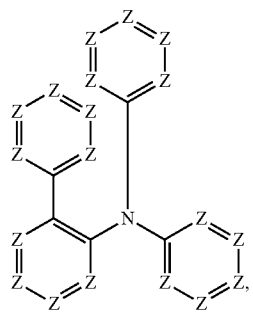

where Z stands on each occurrence, identically or differently, for $CR^1$ or N, and where not more than two adjacent groups Z stand for N.

It is furthermore preferred that the group Z relating to the above-mentioned formulae is on each occurrence, identically or differently, $CR^1$.

$R^1$ is furthermore preferably on each occurrence, identically or differently, H, D, F, CN, $Si(R^2)_3$, a straight-chain alkyl or alkoxy group having 1 to 10 C atoms or a branched or cyclic alkyl or alkoxy group having 3 to 10 C atoms, where the above-mentioned groups may each be substituted by one or more radicals $R^2$ and where one or more $CH_2$ groups in the above-mentioned groups may be replaced by —C≡C—, —$R^2$C=$CR^2$—, $Si(R^2)_2$, C=O, C=$NR^2$, —$NR^2$—, —O—, —S—, —C(=O)O— or —C(=O)$NR^2$—, or an aromatic or heteroaromatic ring system having 5 to 20 aromatic ring atoms, which may in each case be substituted by one or more radicals $R^2$, where two or more radicals $R^1$ may be linked to one another and may form a ring.

Examples of the compounds of the formula (I) are shown below.

(1)

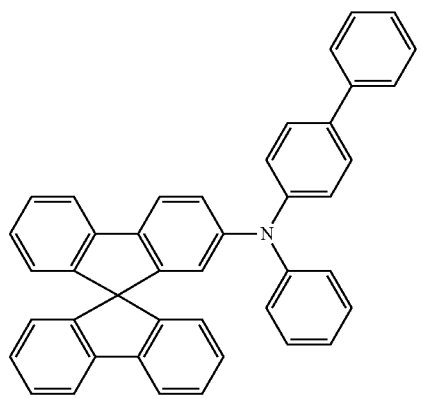

(2)

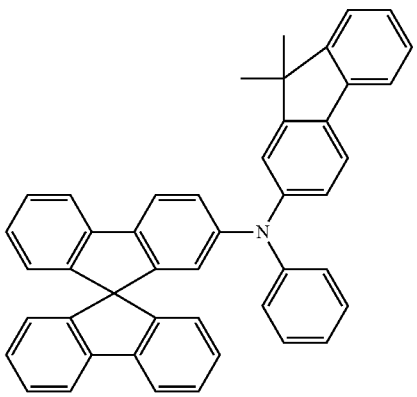

(3)

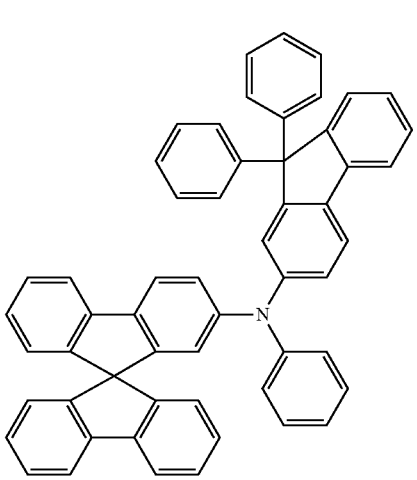

(4)

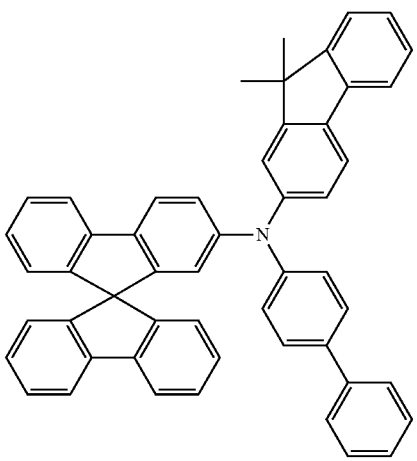

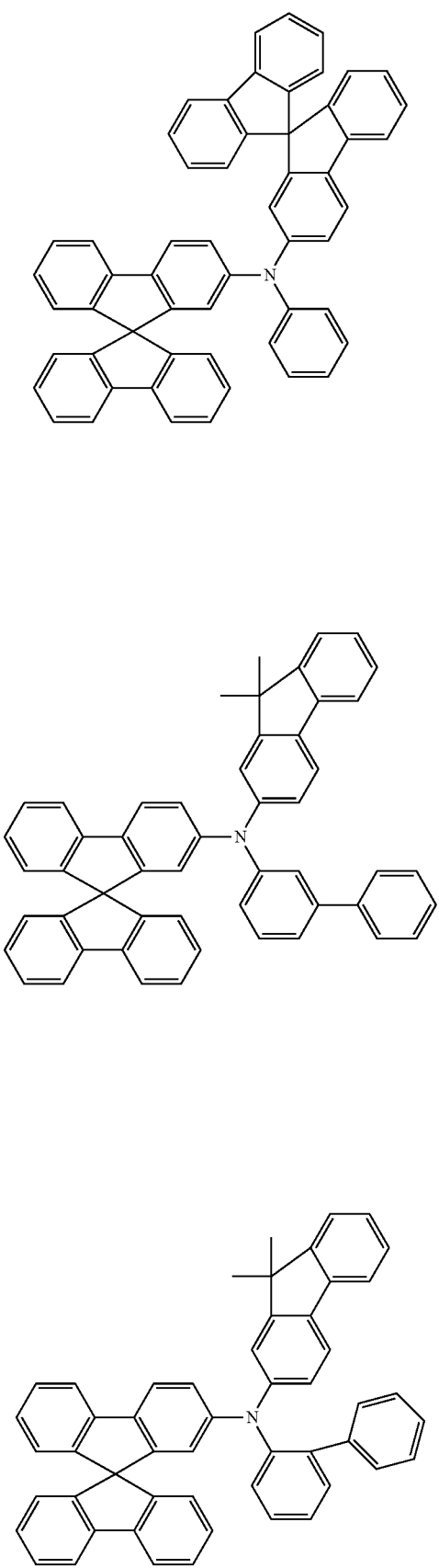
(5)
(6)
(7)
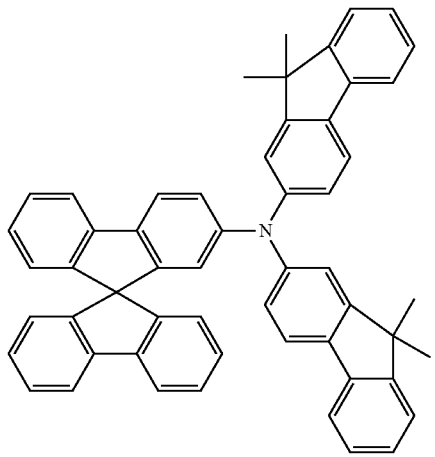
(8)
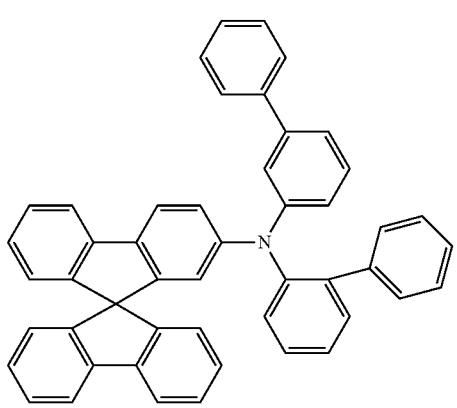
(9)
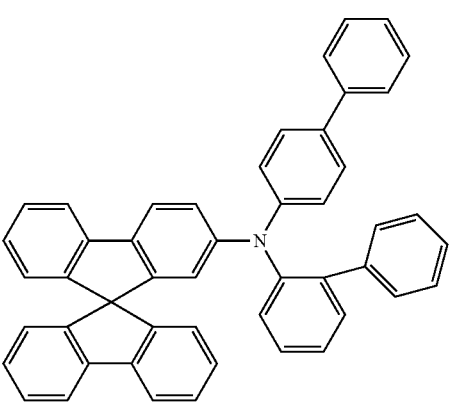
(10)
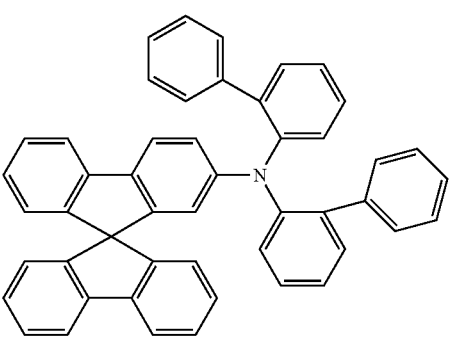
(11)

(12)
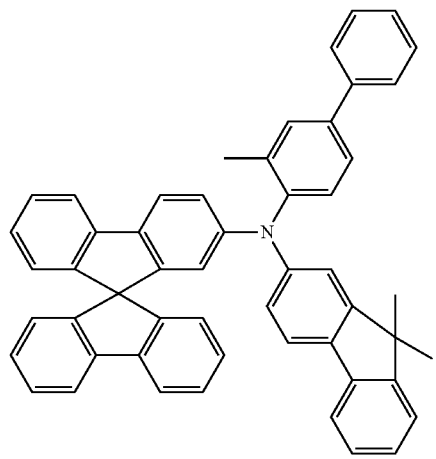
(13)
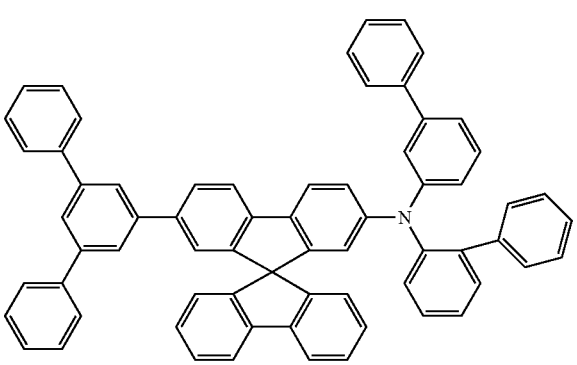
(14)
(15)
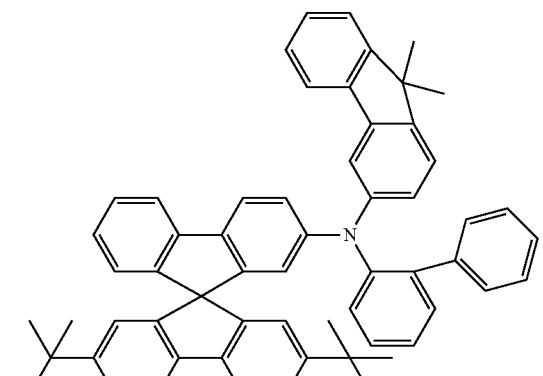
(16)
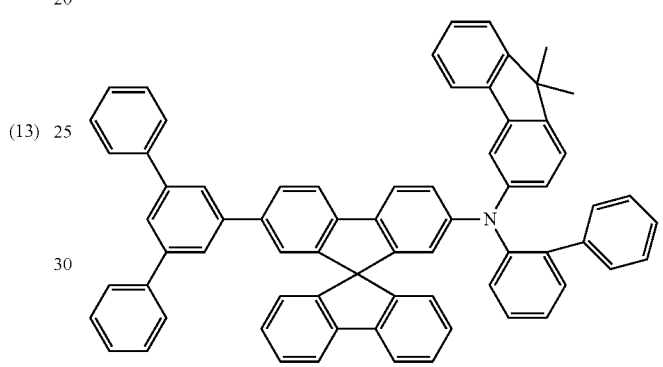
(17)
(18)
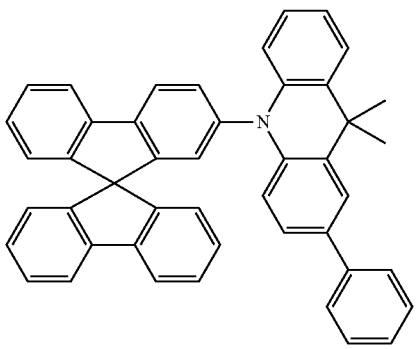

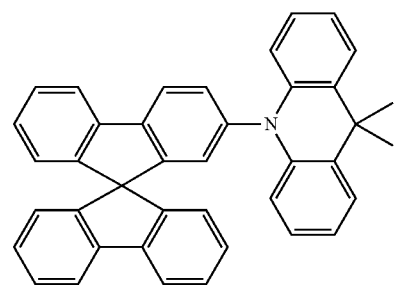
(19)
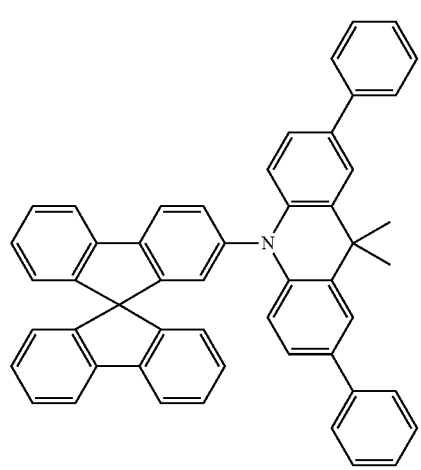
(20)
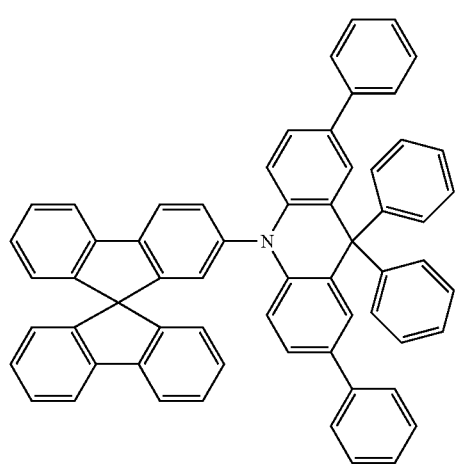
(21)
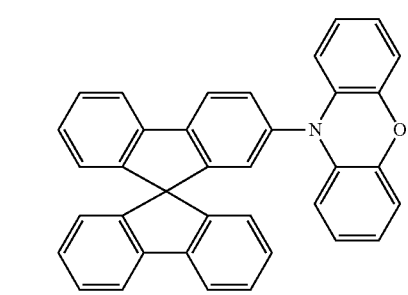
(22)
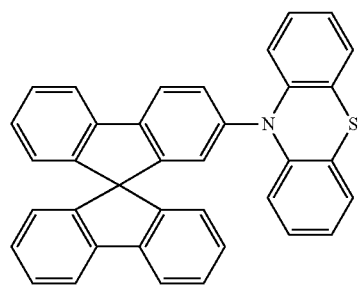
(23)
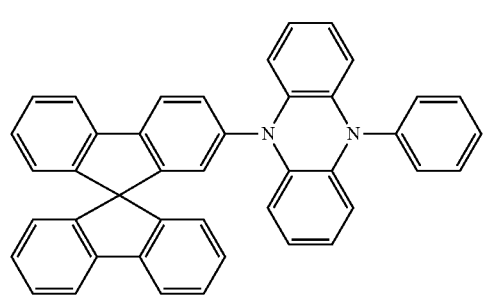
(24)
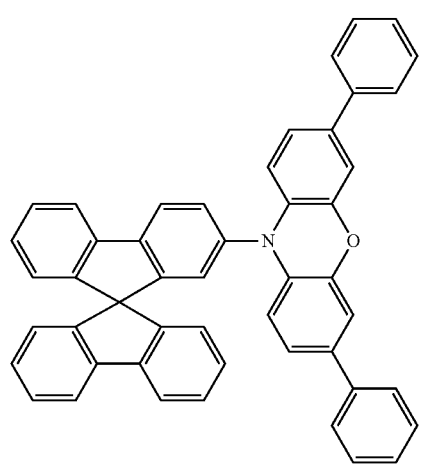
(25)
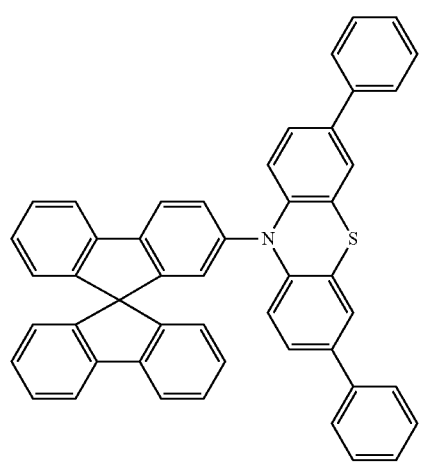
(26)

(27)
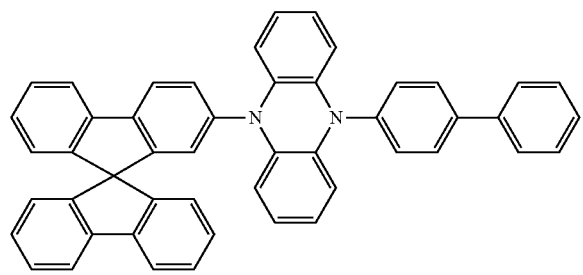
(28)
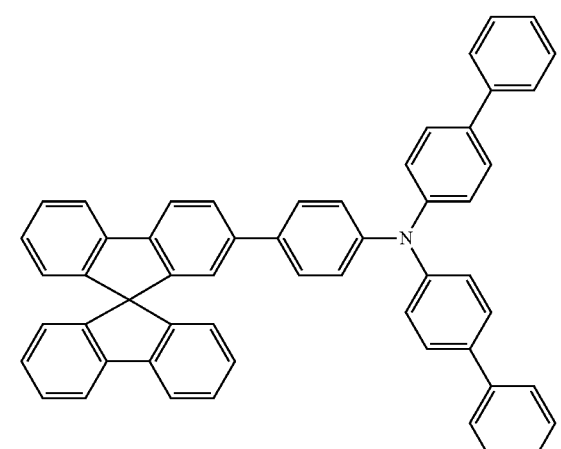
(29)
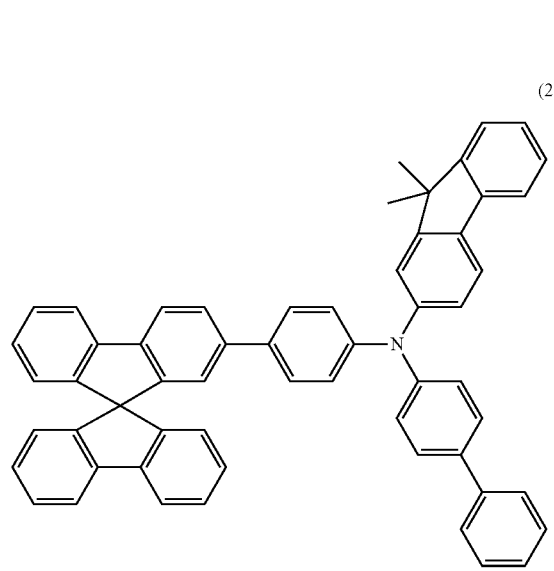
(30)
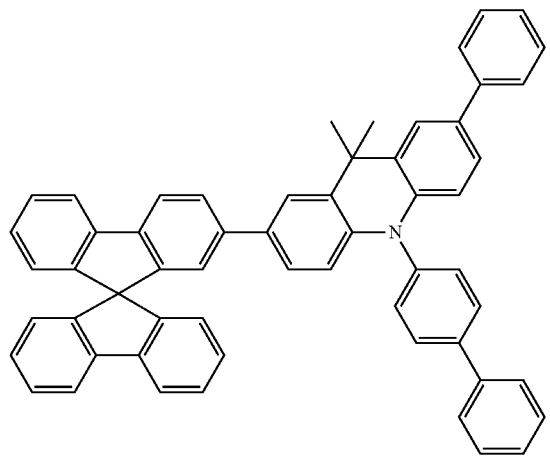
(31)
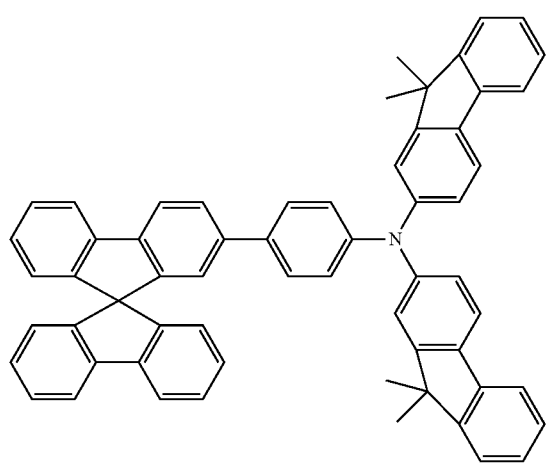
(32)
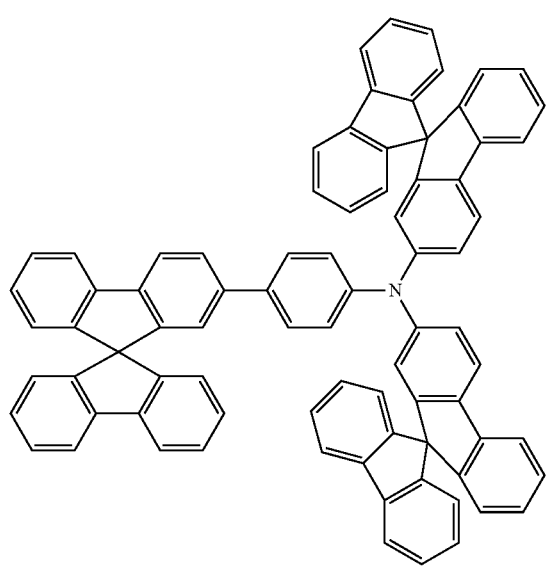

-continued
(33)
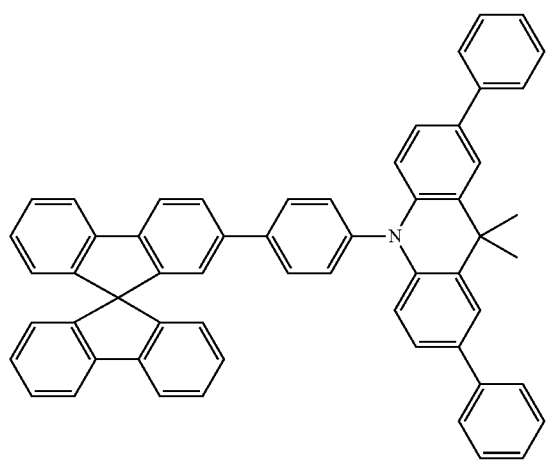
(34)
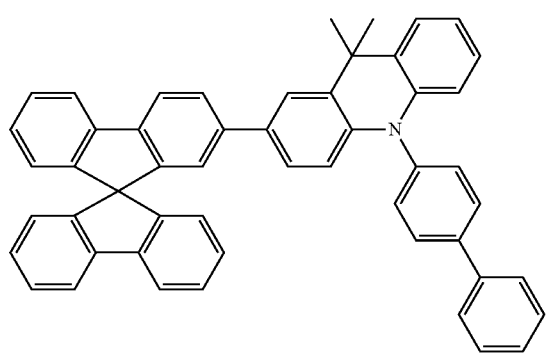
(35)
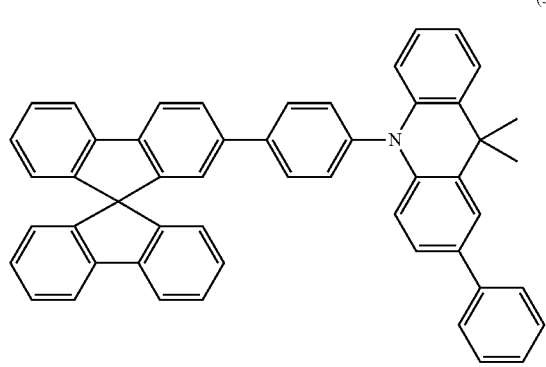
-continued
(36)
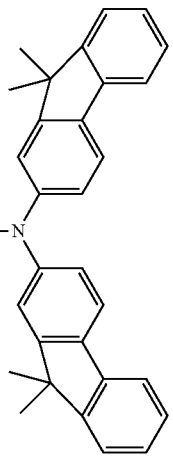
(37)
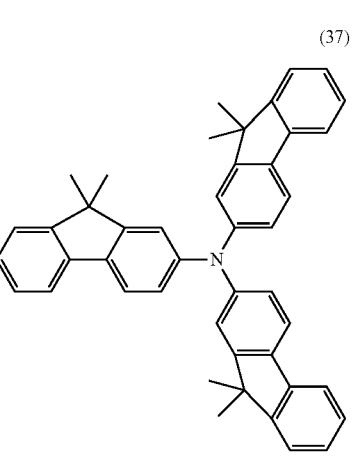
(38)
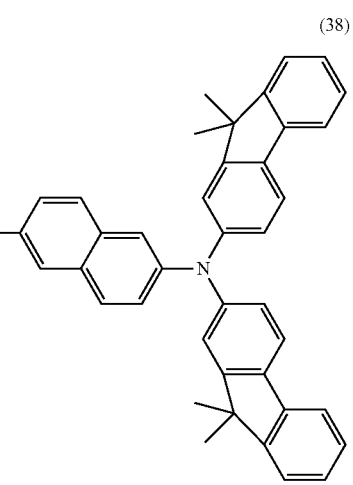

(39)
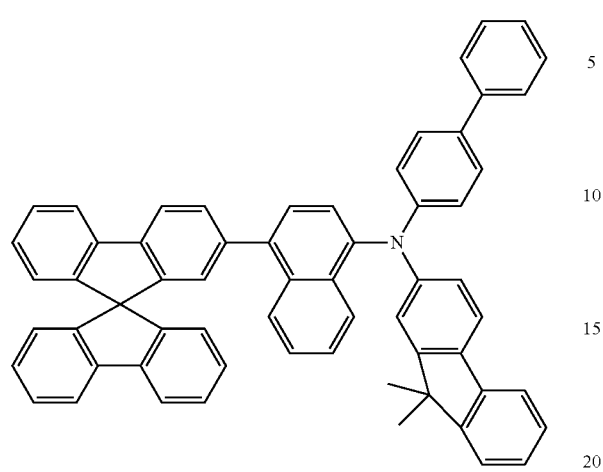
(42)
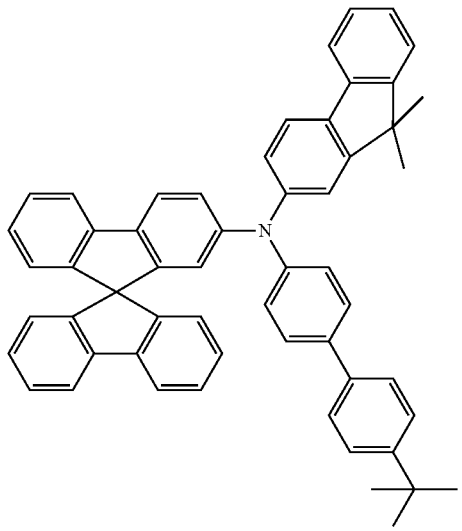
(40)
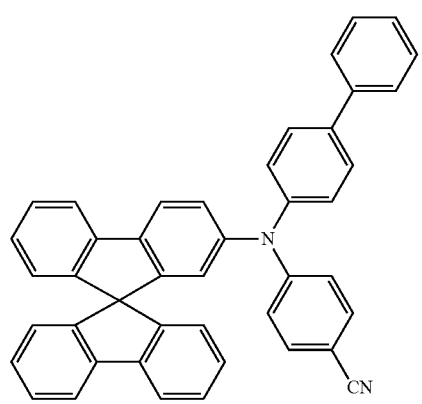
(43)
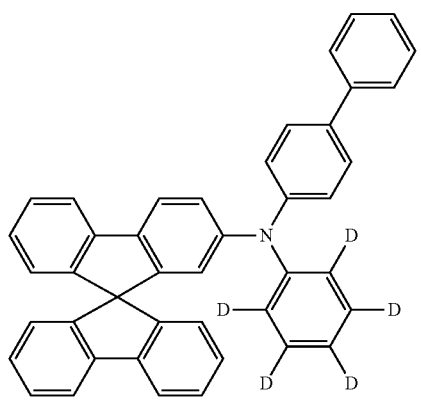
(41)
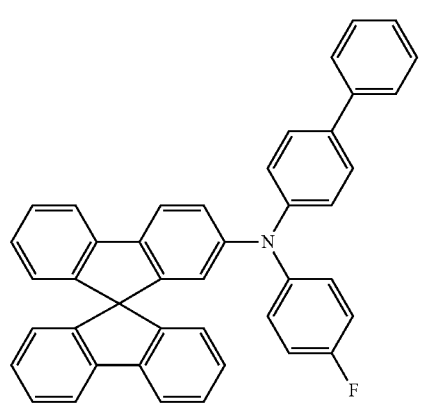
(44)
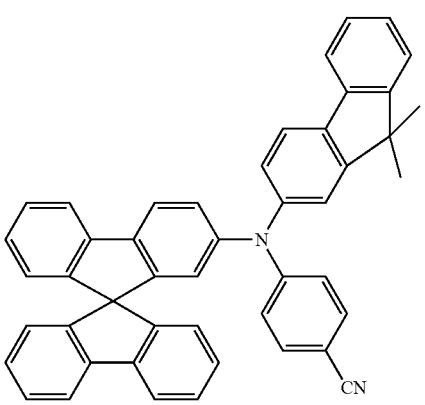

-continued
(45)
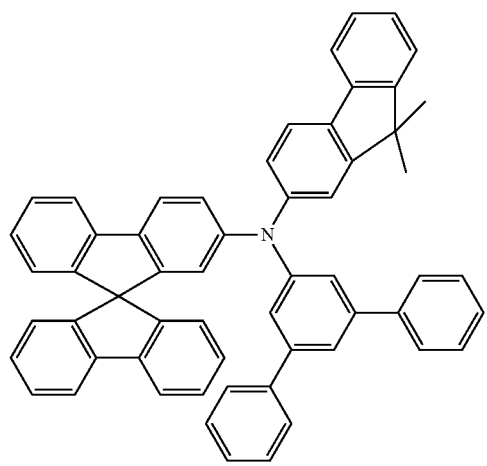
(46)
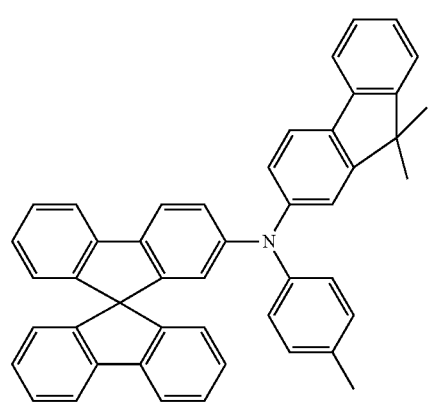
(47)
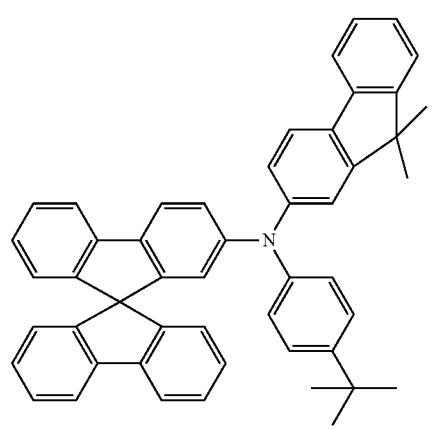
(48)
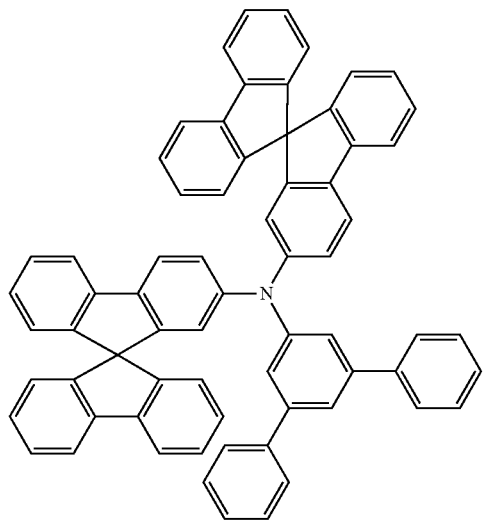
(49)
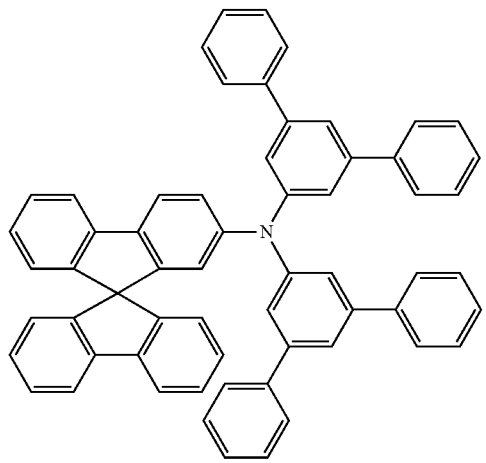
(50)
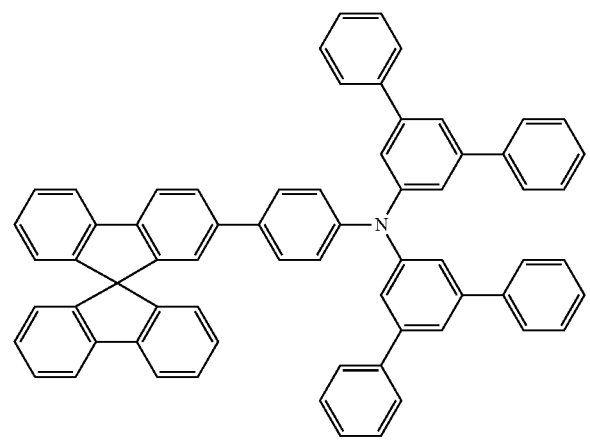

(51)
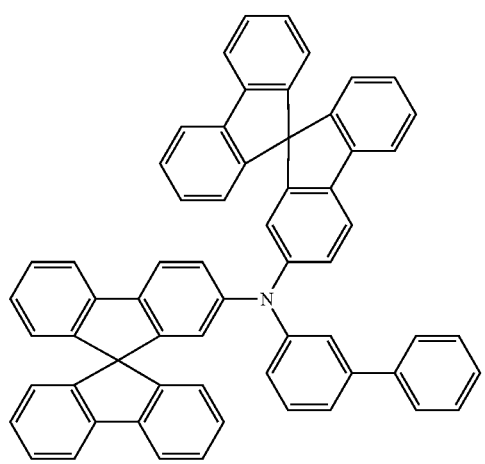
(52)
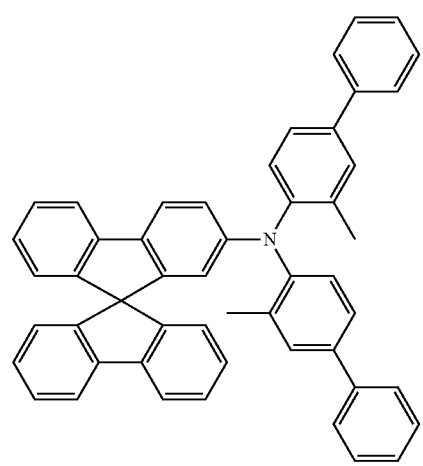
(53)
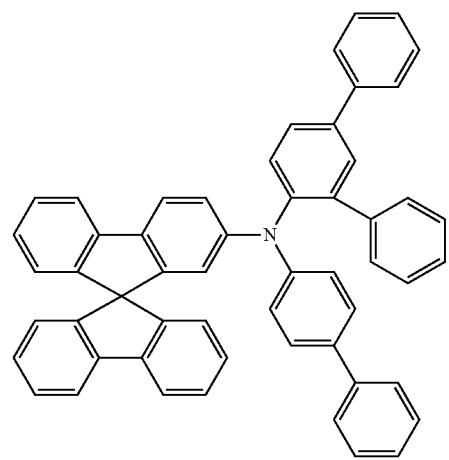
(54)
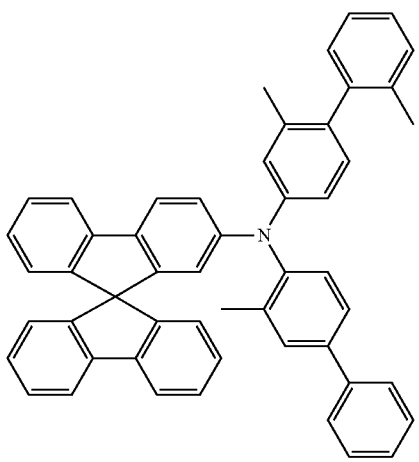
(55)
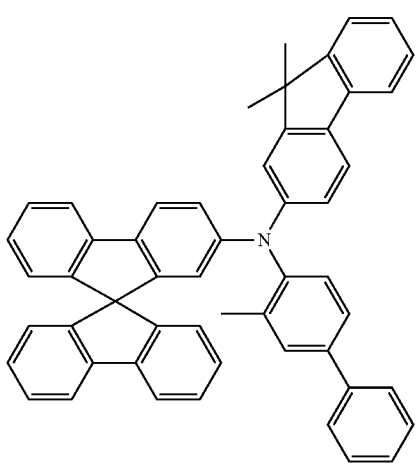
(56)
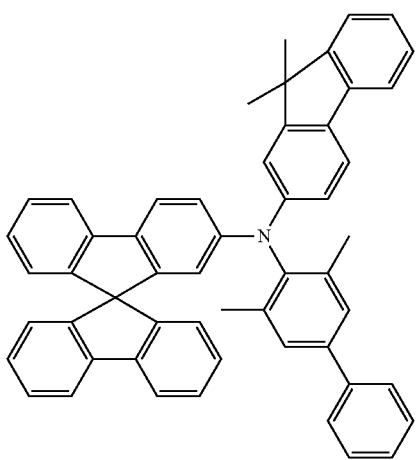

(57)
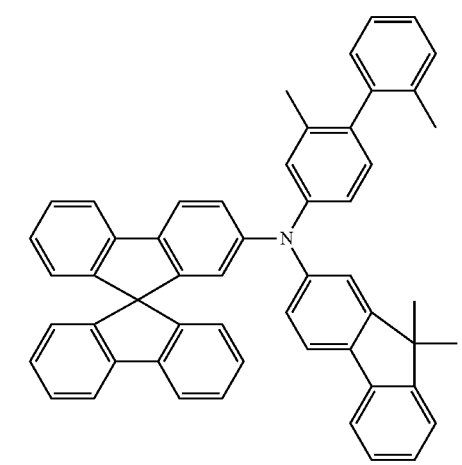
(58)
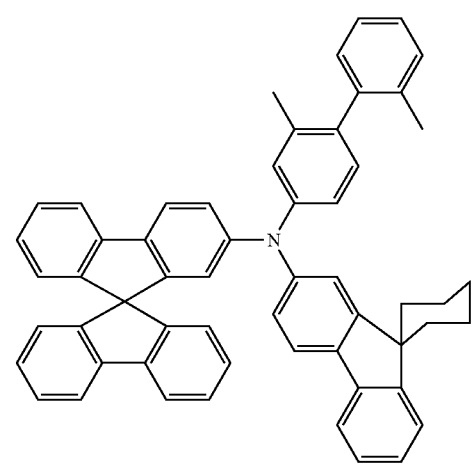
(59)
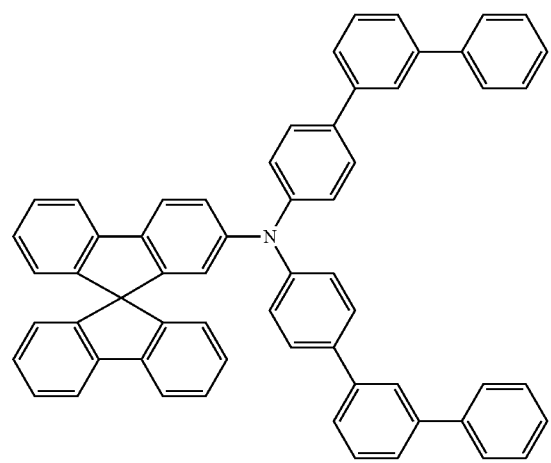
(60)
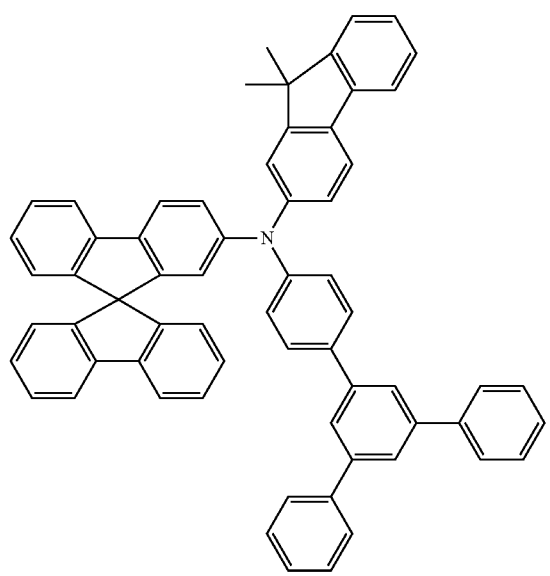
(61)
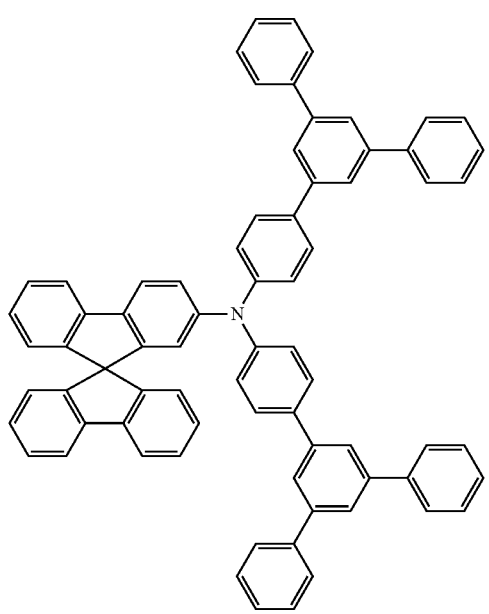
(62)
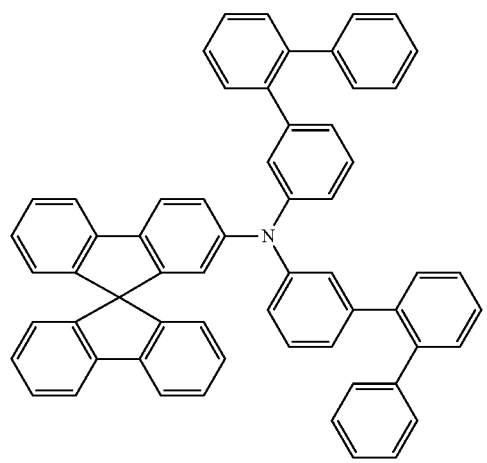

-continued
(63)
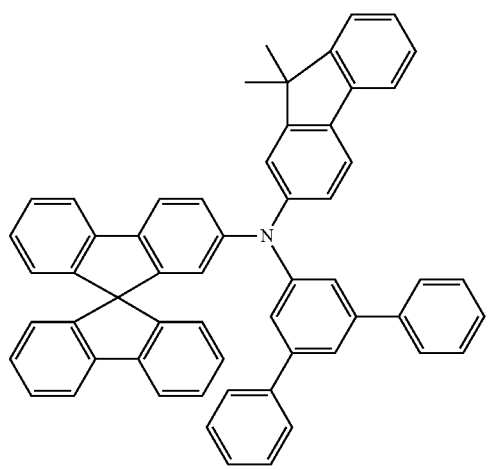
(64)
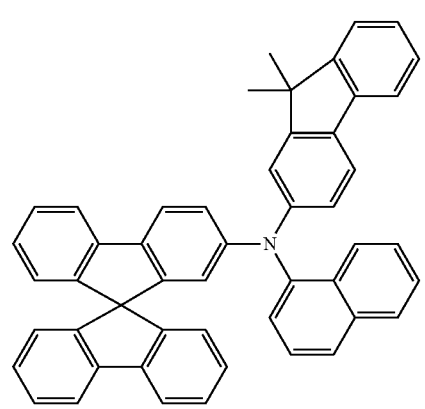
(65)
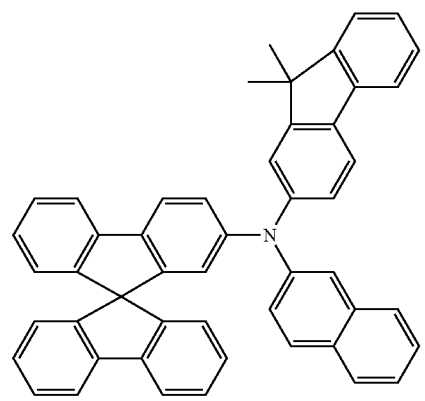
(66)
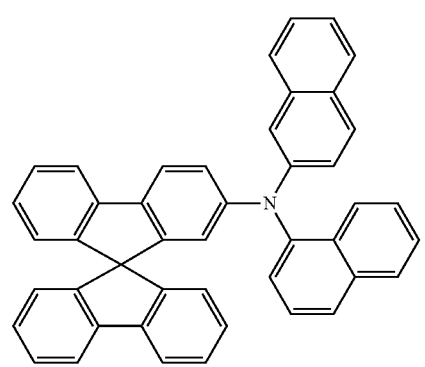
-continued
(67)
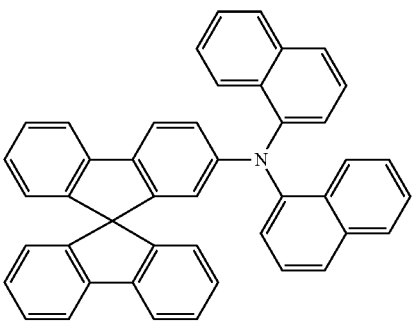
(68)
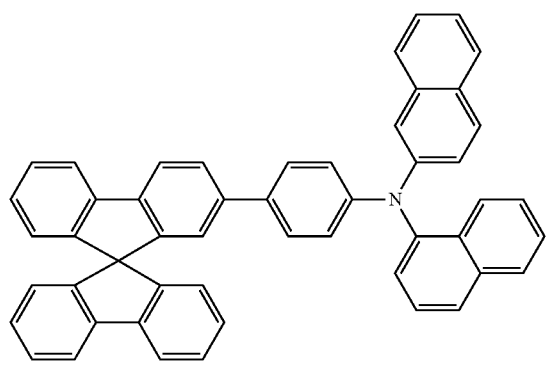
(69)
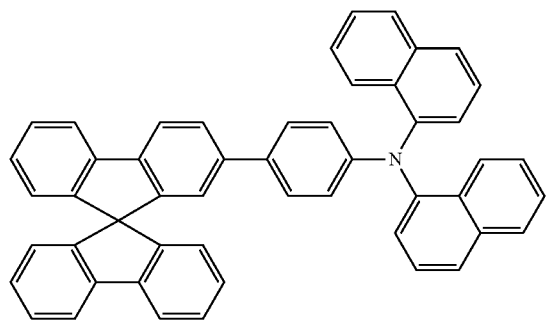
(70)
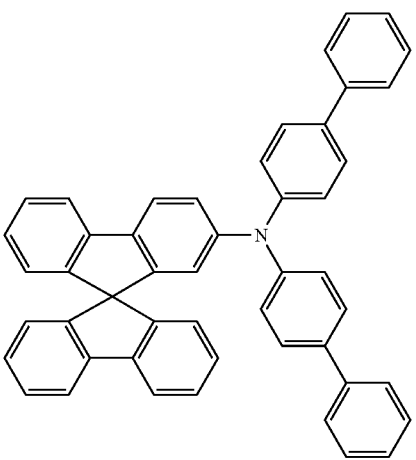

(71)
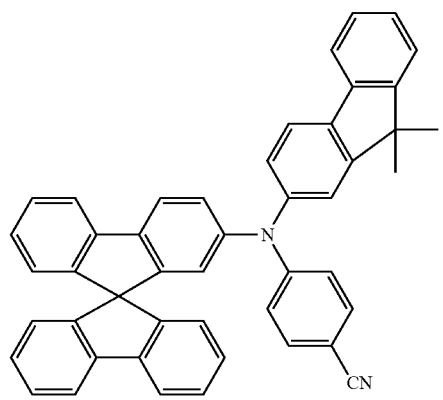
(72)
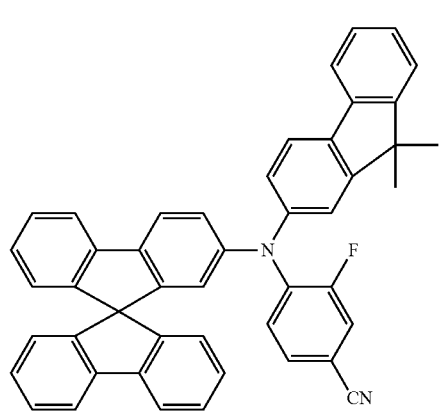
(73)
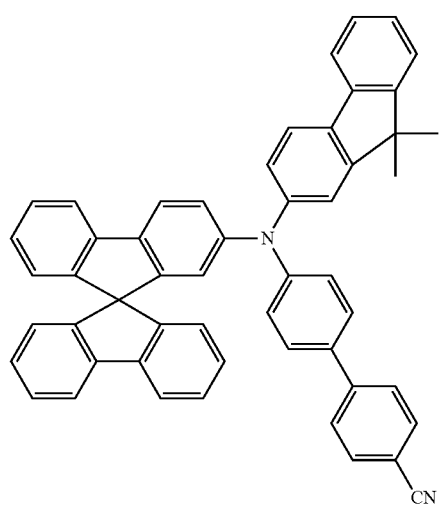
(74)
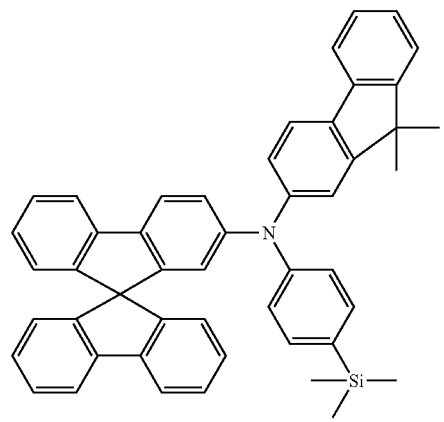
(75)
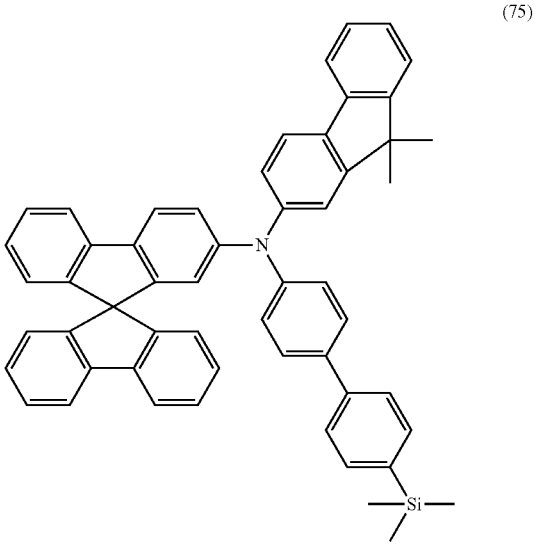
(76)
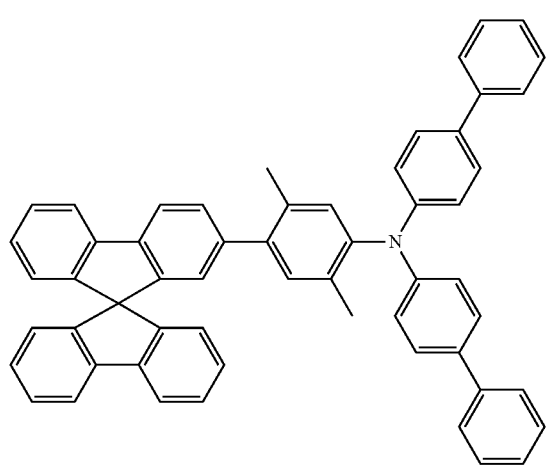

(77)
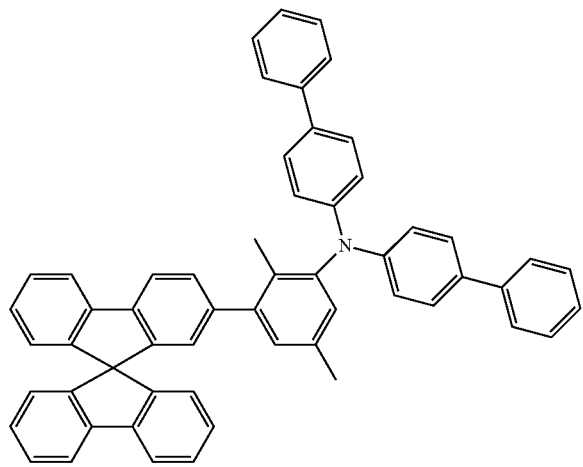
(80)
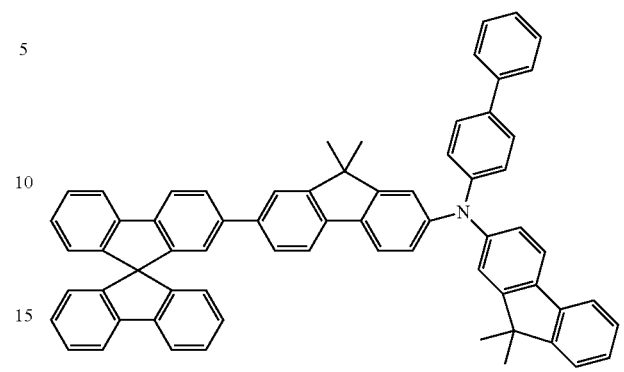
(78)
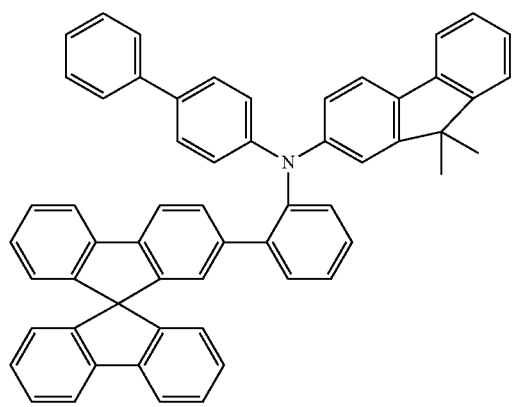
(81)
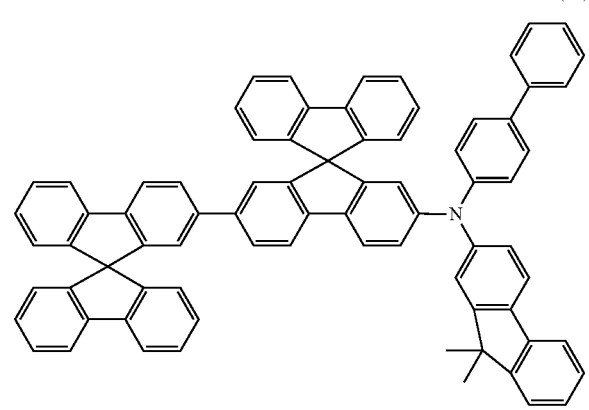
(79)
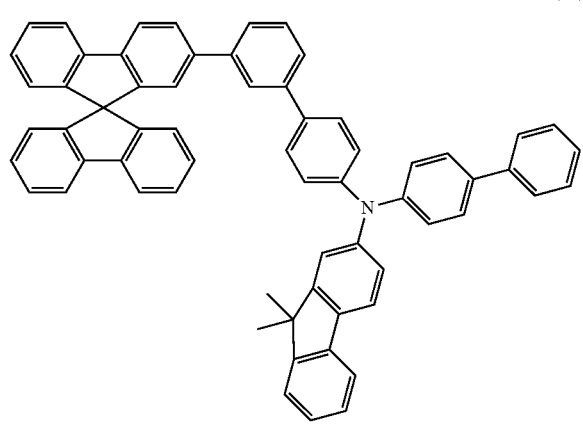
(82)
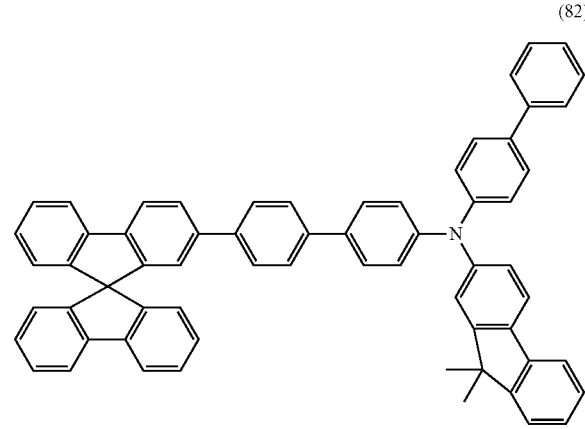

-continued
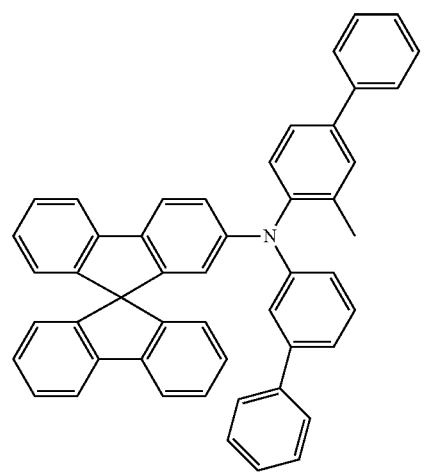
(83)
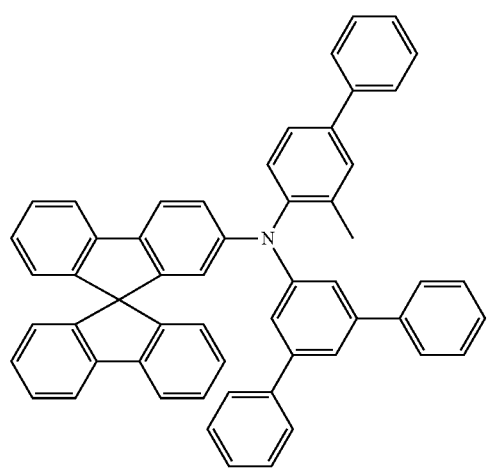
(84)
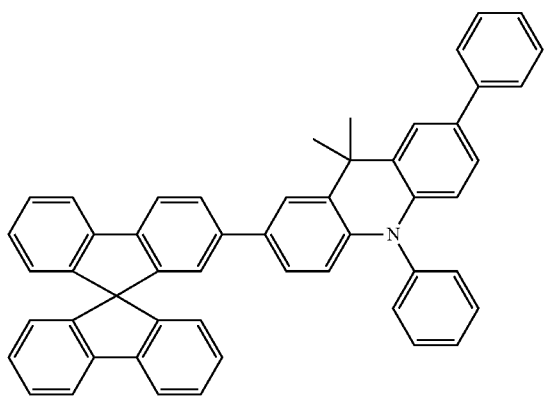
(85)
-continued
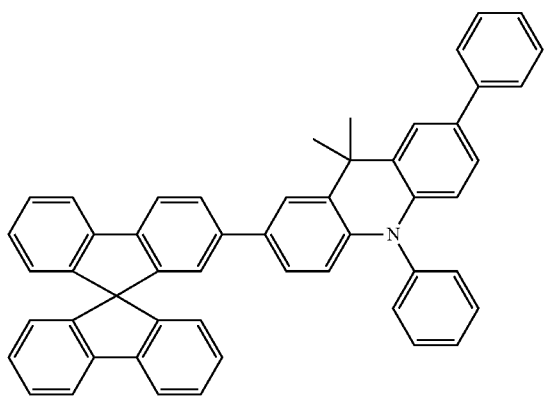
(86)
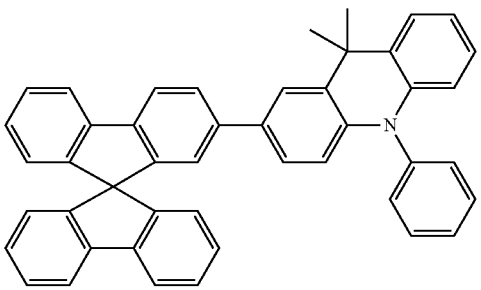
(87)
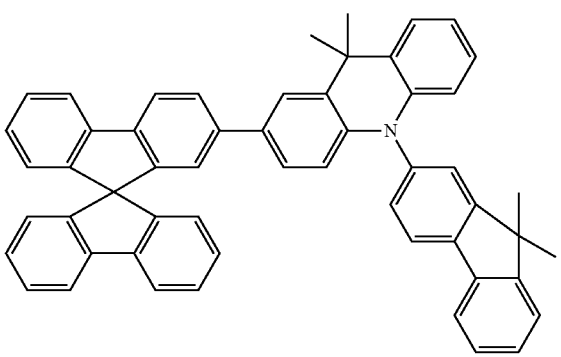
(88)
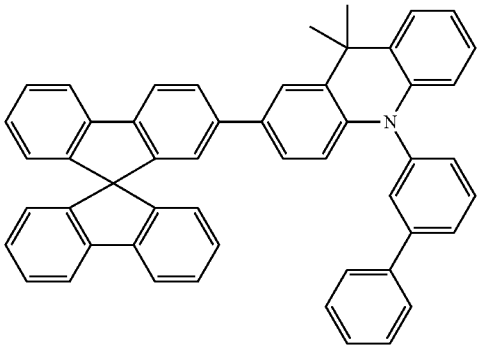
(89)

(90)
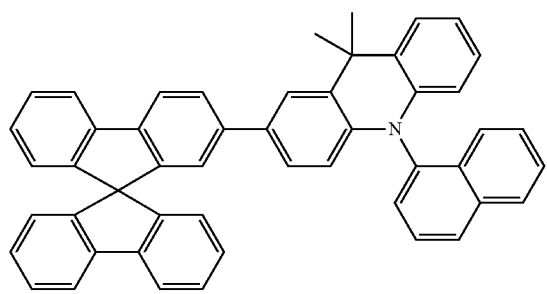
(91)
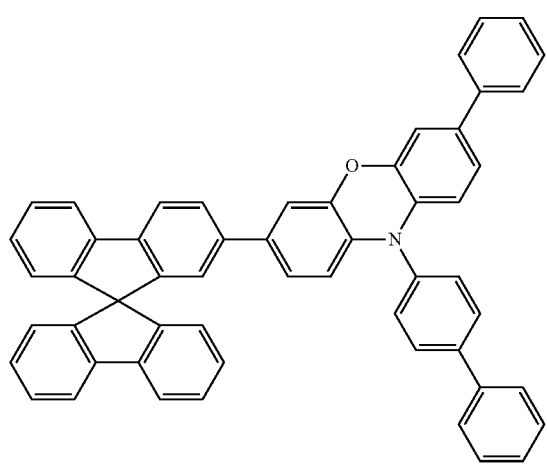
(92)
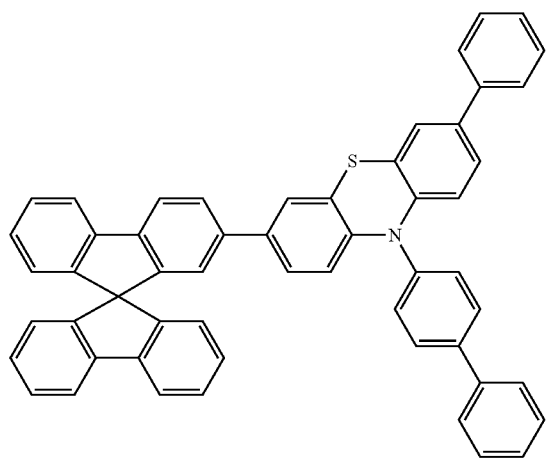
(93)
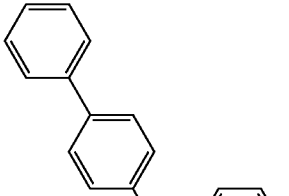
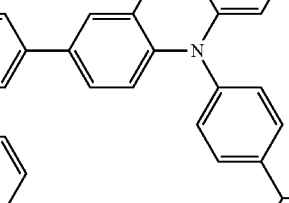
(94)
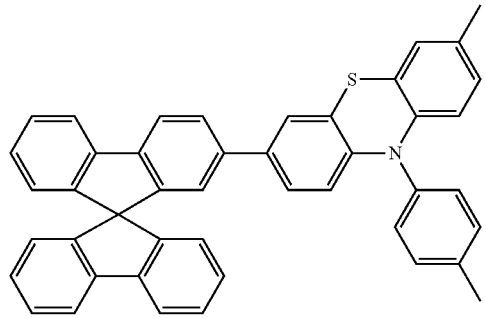
(95)
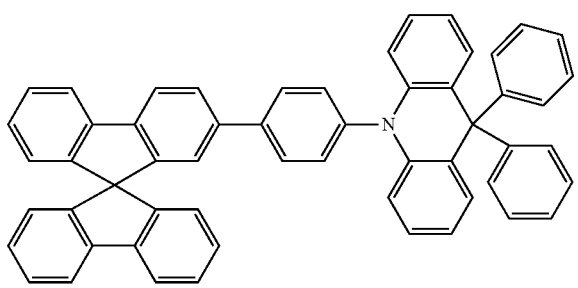
(96)
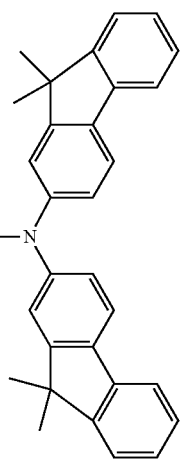

(97)
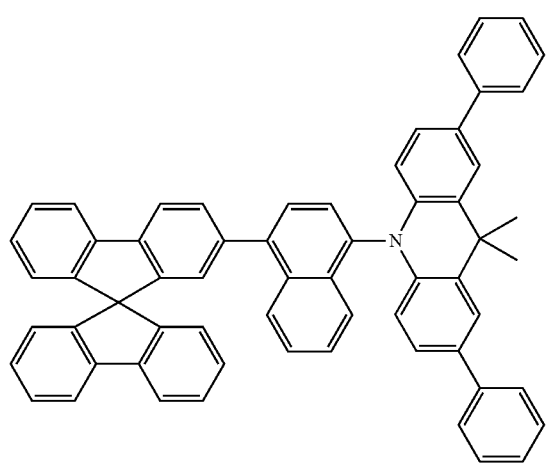
(98)
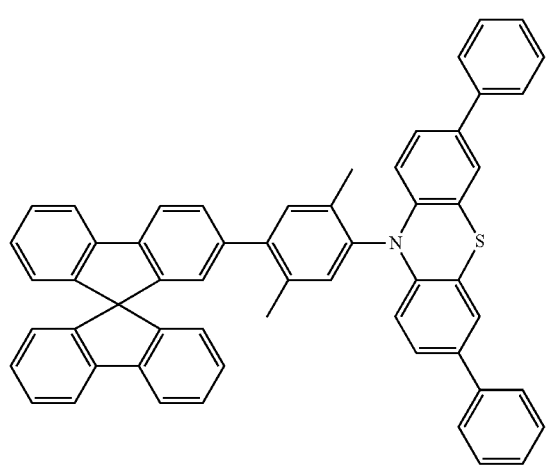
(99)
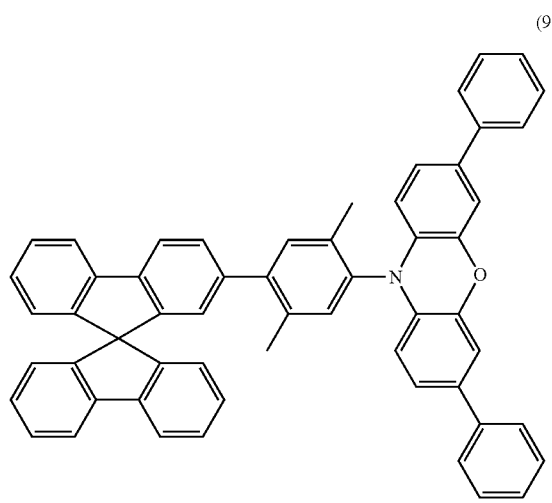
(100)
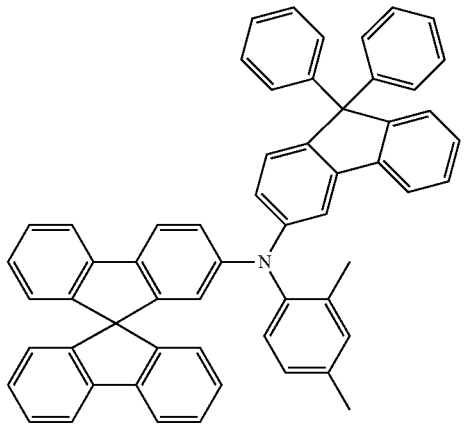
(101)
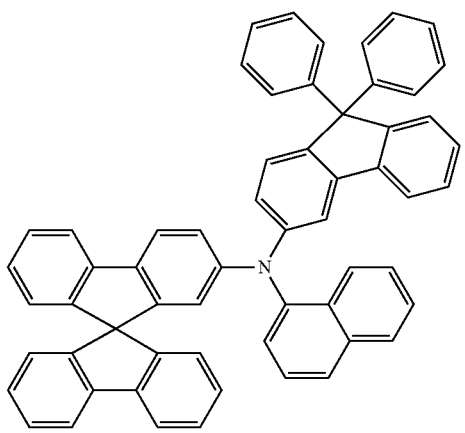
(102)
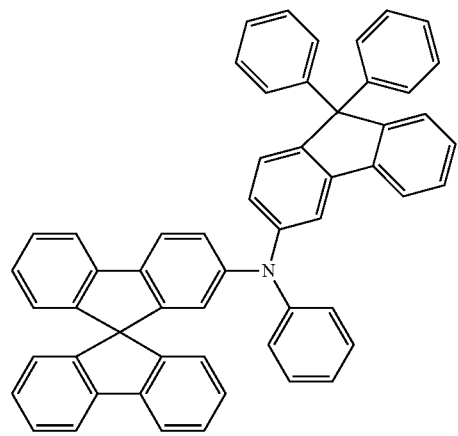
(103)
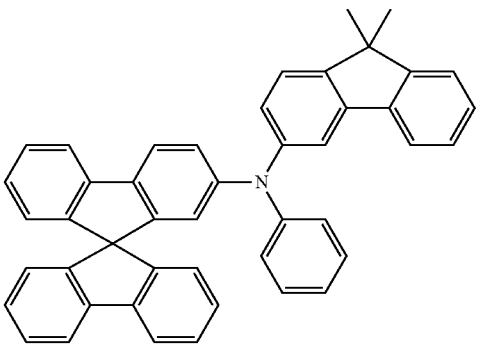

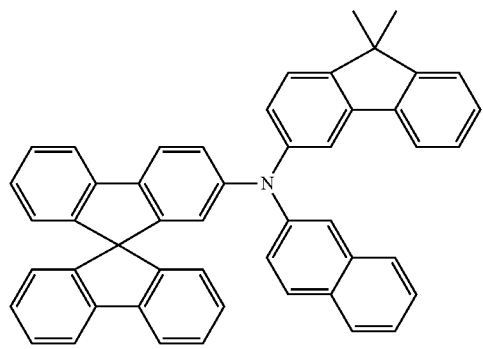 (104)
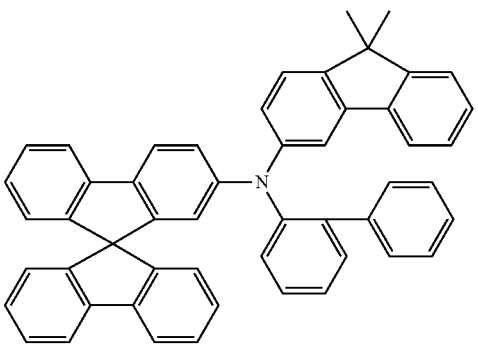 (108)
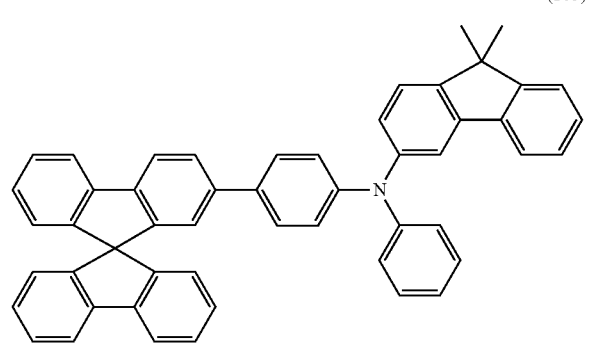 (105)
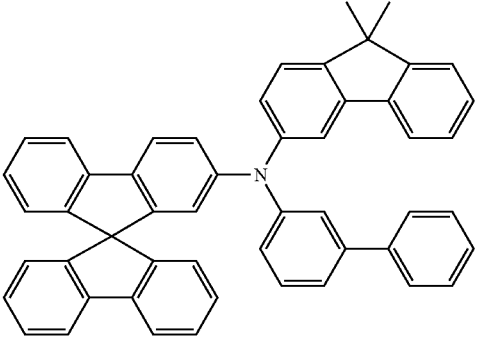 (109)
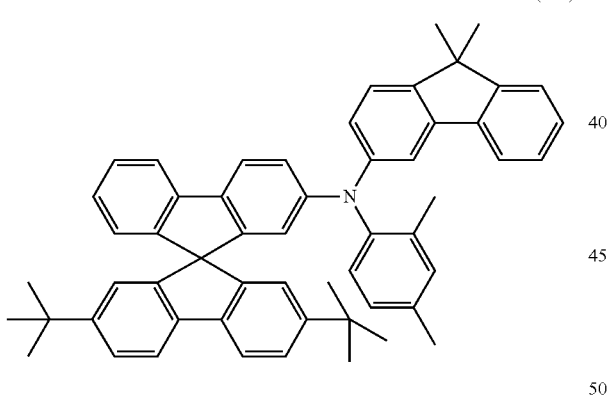 (106)
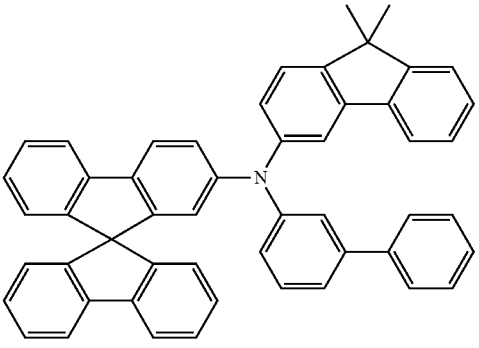 (110)
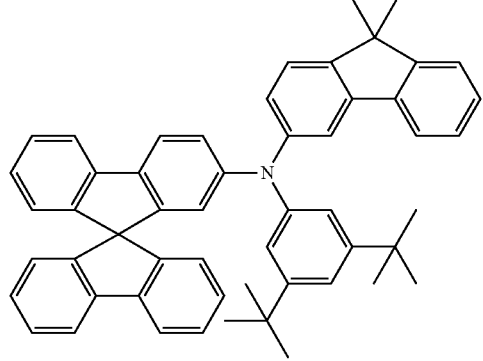 (107)
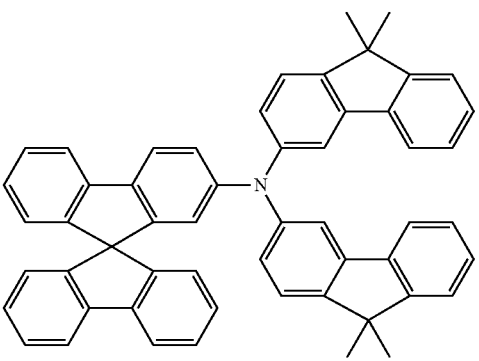 (111)

(112)
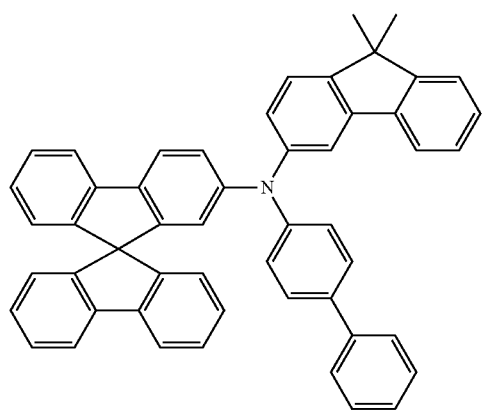
(113)
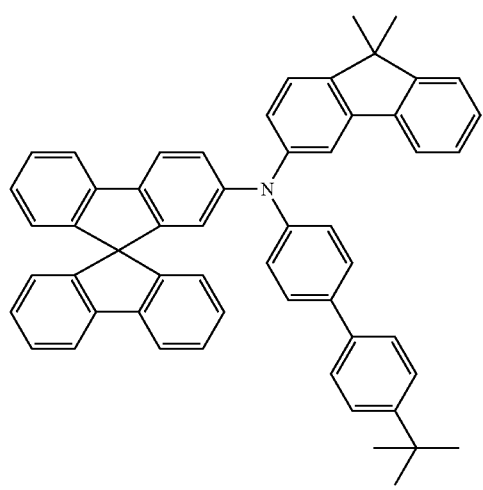
(114)
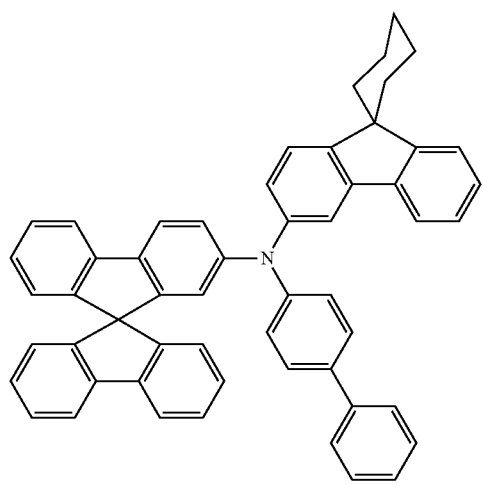
(115)
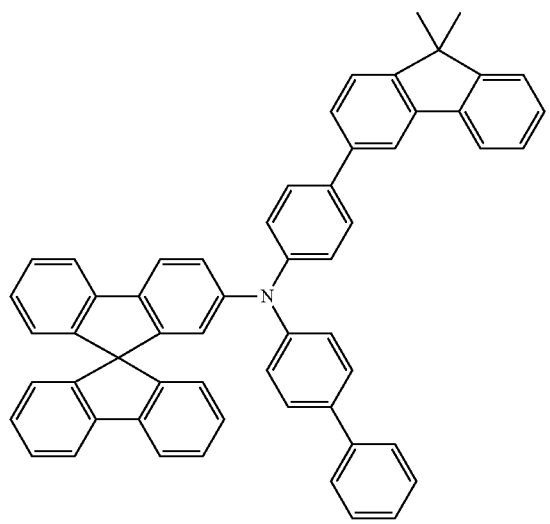
(116)
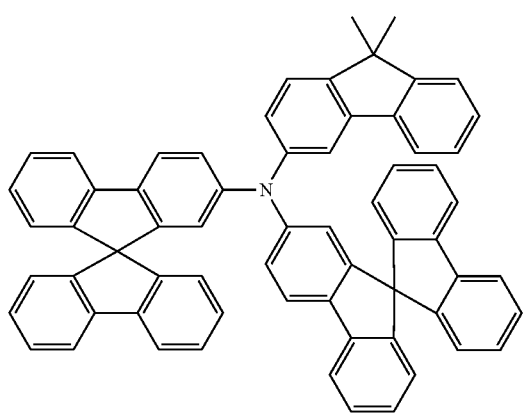
(117)
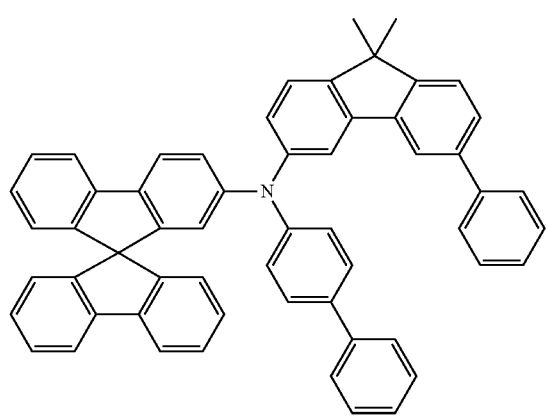

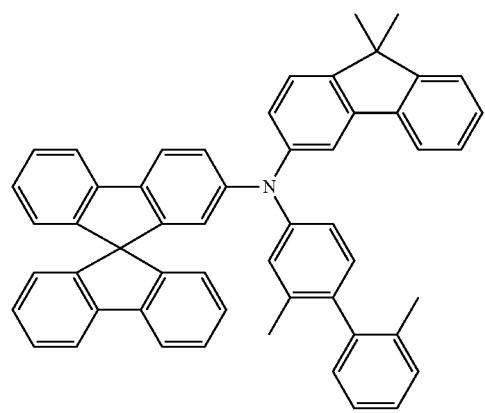
(118)
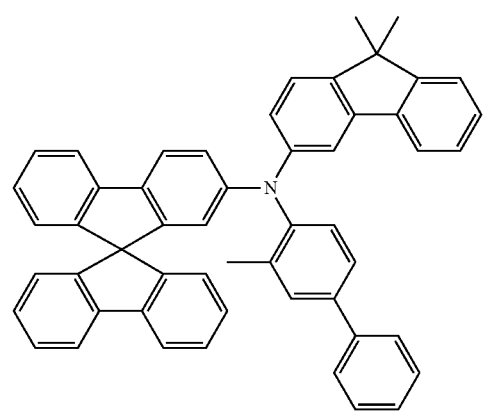
(119)
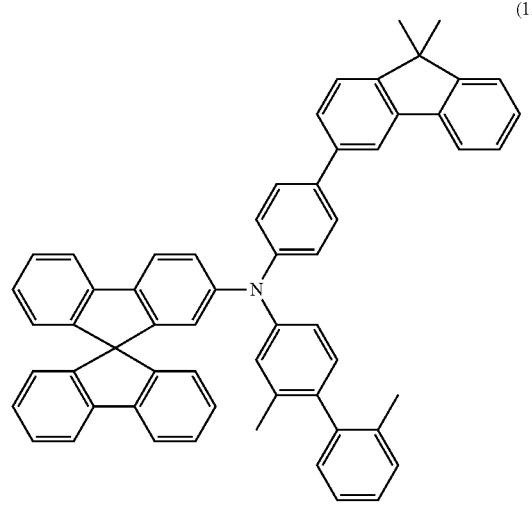
(120)
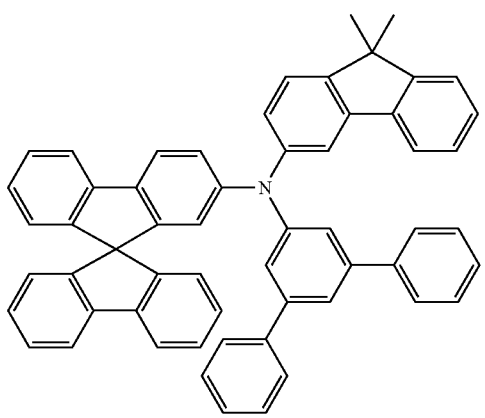
(121)
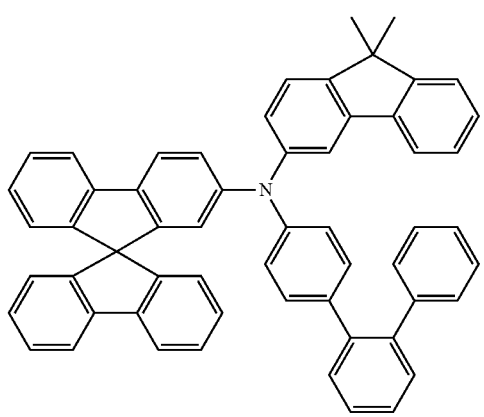
(122)
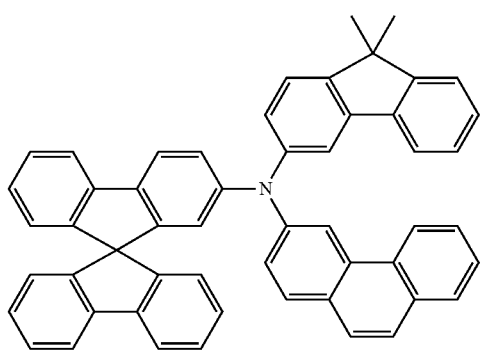
(123)
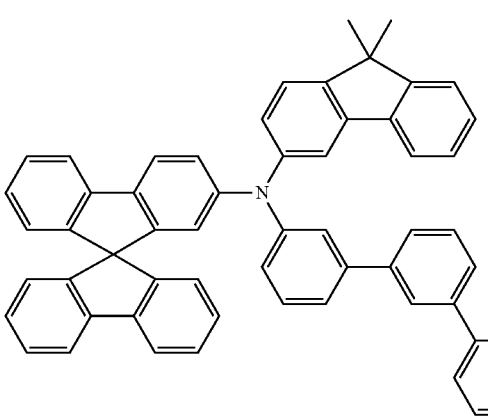
(124)

-continued
(125)
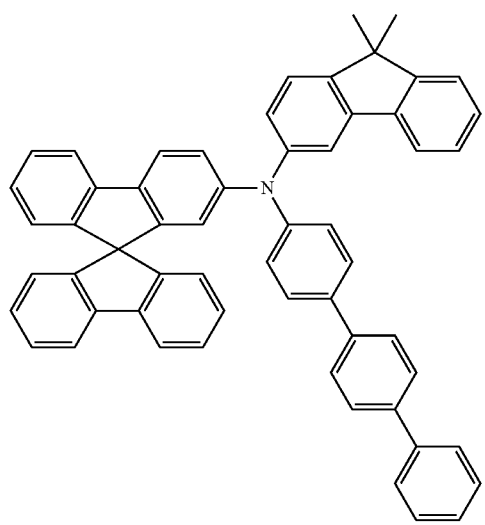
(126)
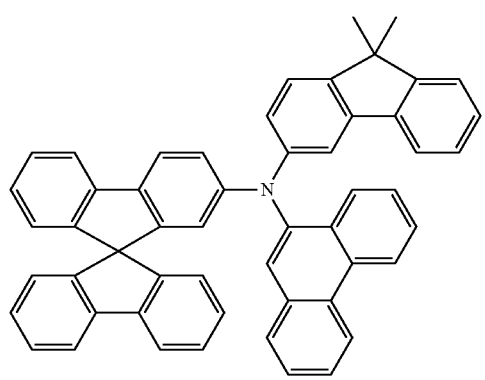
(127)
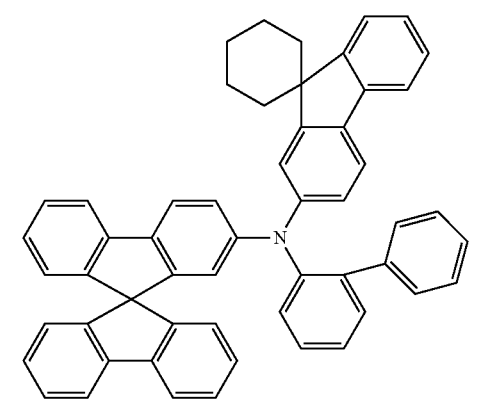
(128)
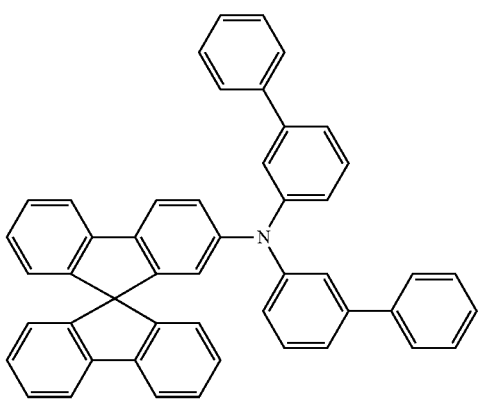
(129)
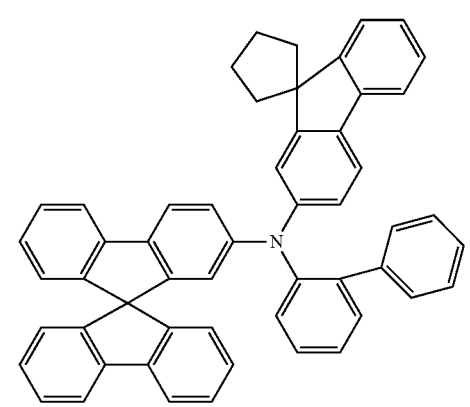
(130)
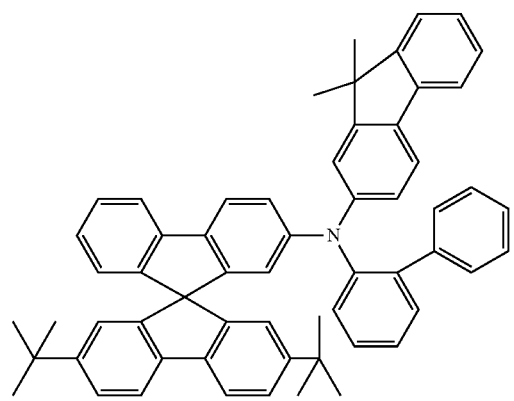
(131)
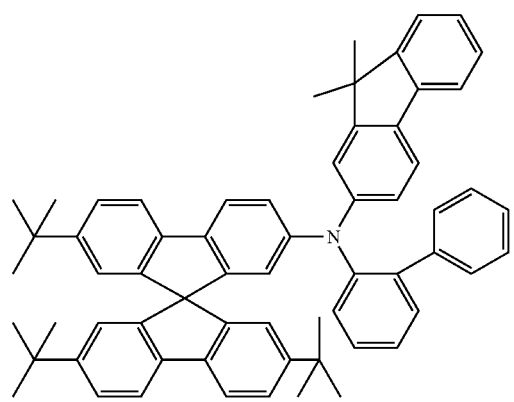

(132)
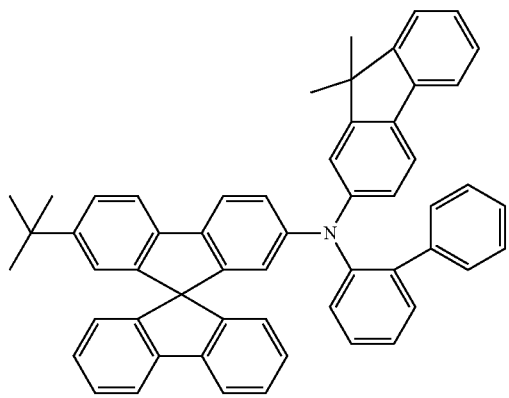
(133)
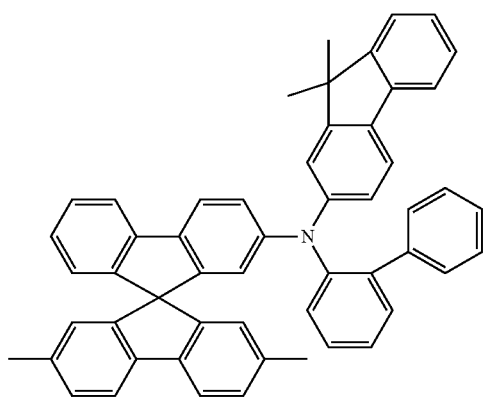
(134)
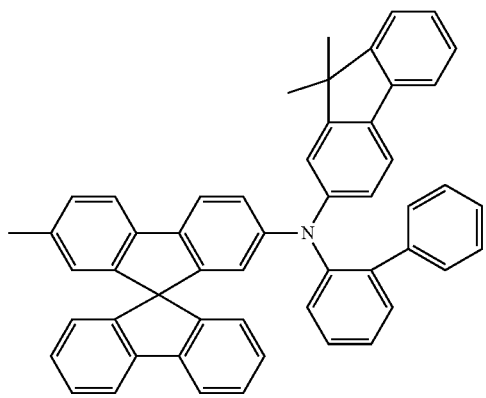
(135)
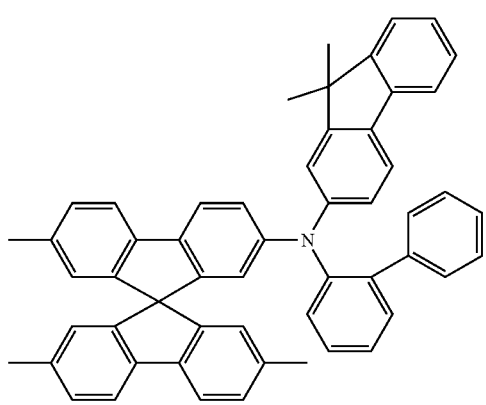
(136)
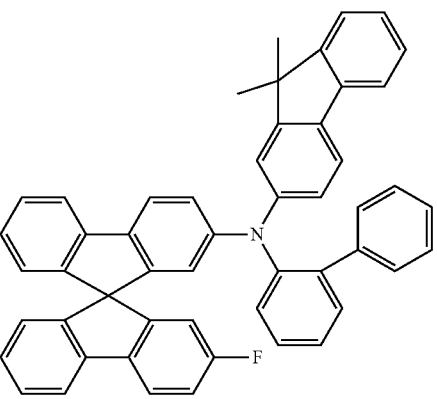
(137)
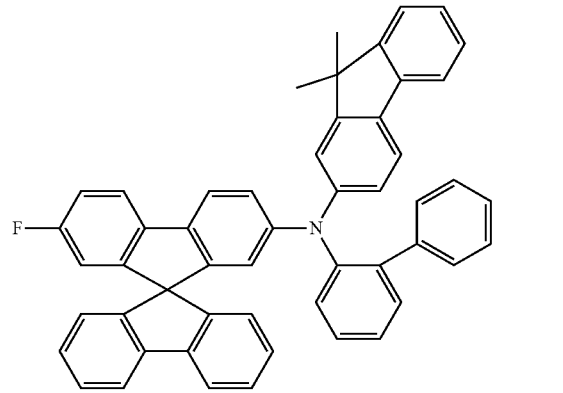
(138)
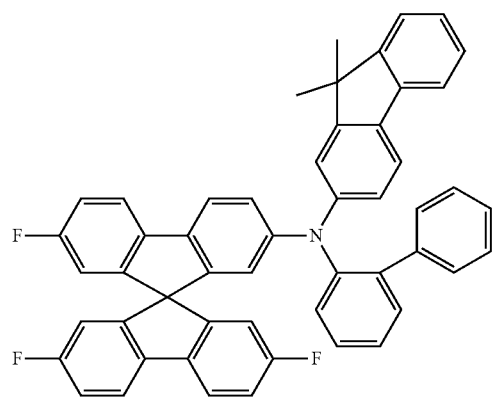
(139)
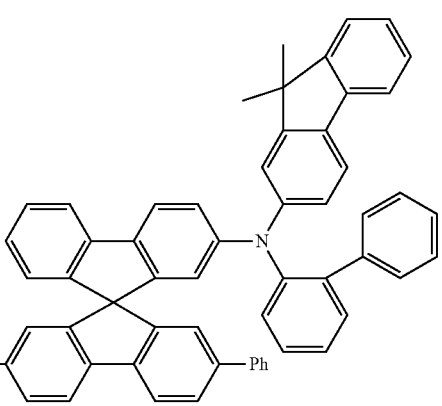

(140)
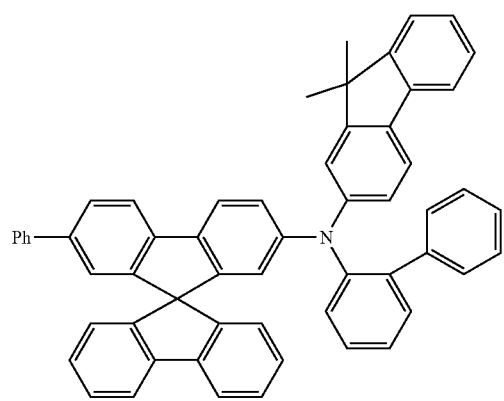
(143)
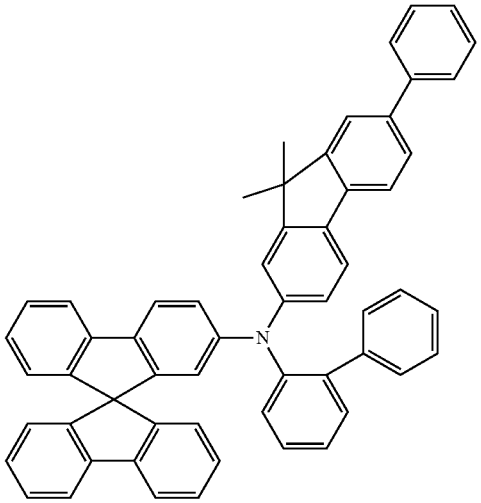
(141)
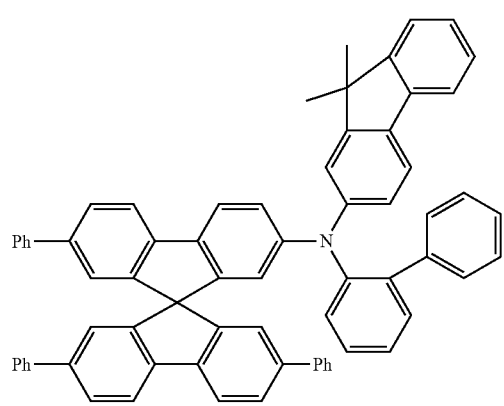
(144)
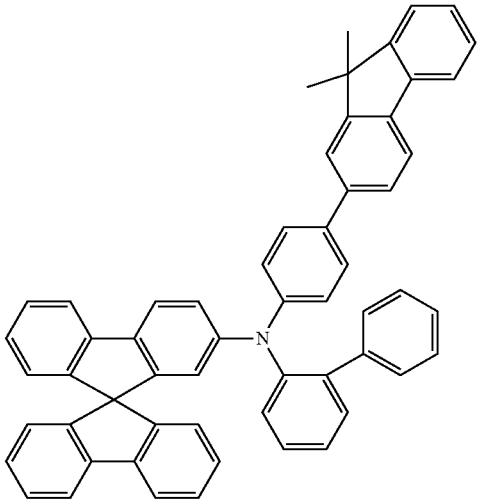
(142)
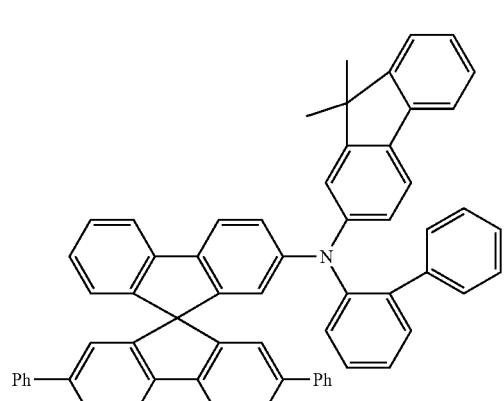
(145)
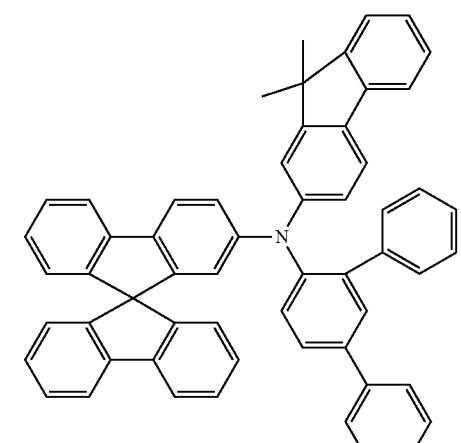

(146)
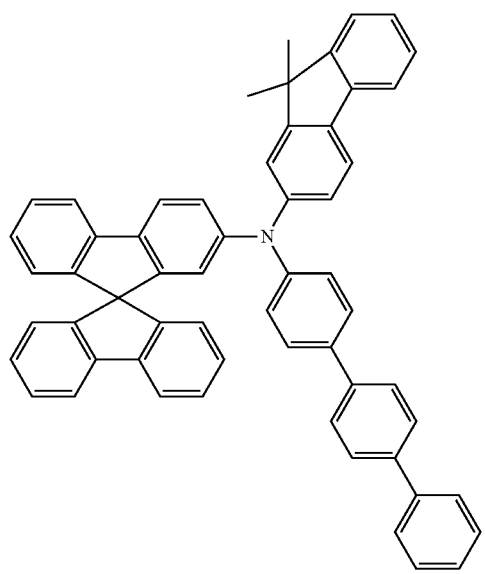
(147)
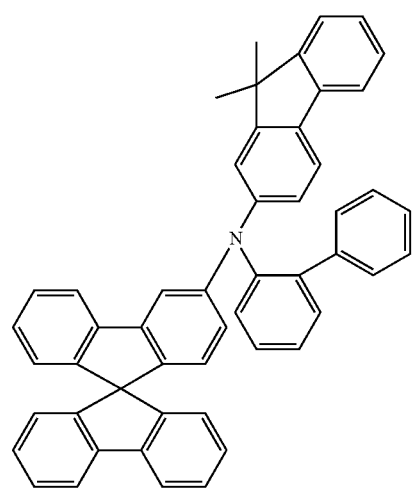
(148)
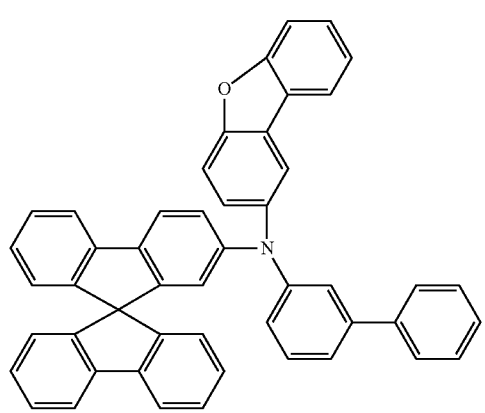
(149)
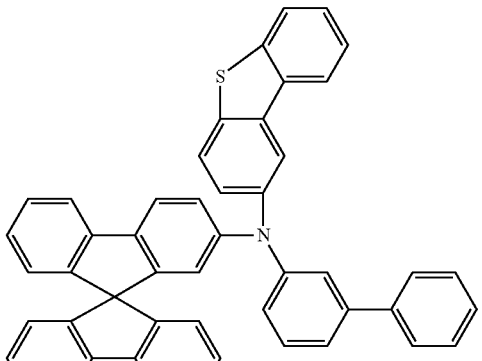
(150)
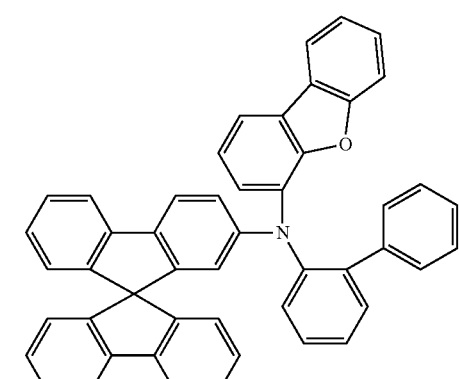
(151)
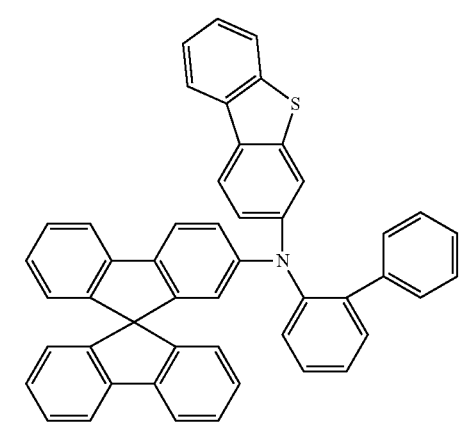
(152)
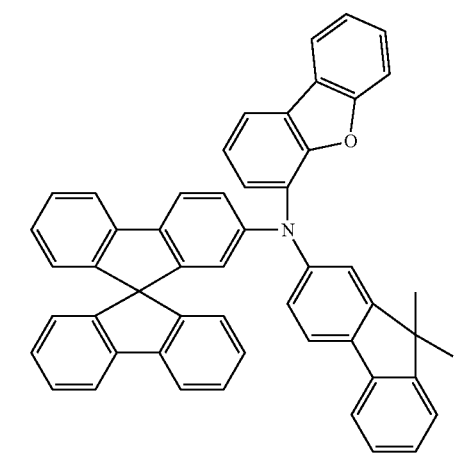

(153)
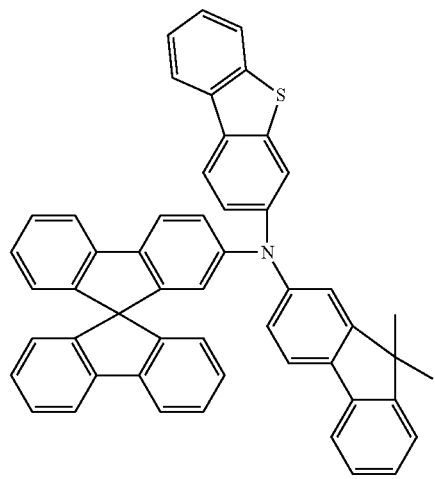
(154)
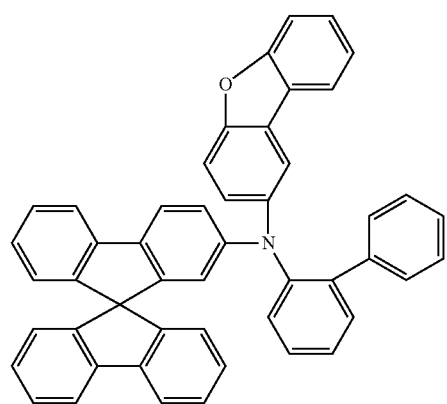
(155)
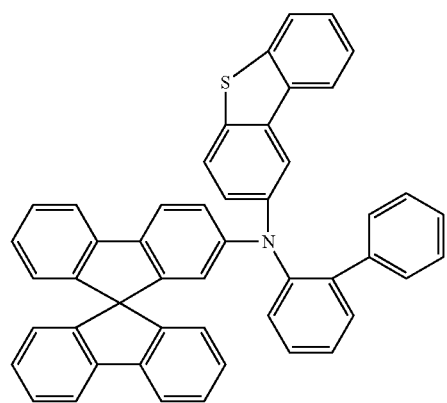
(156)
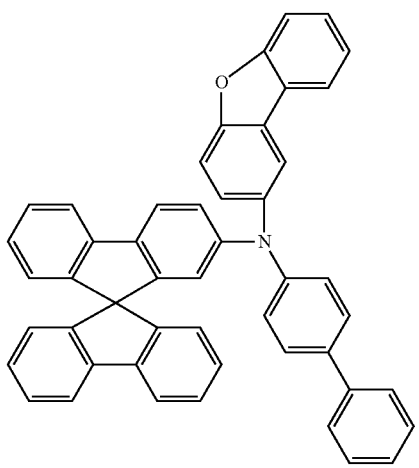
(157)
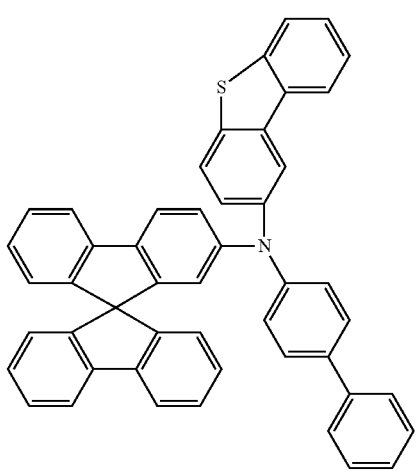
(158)
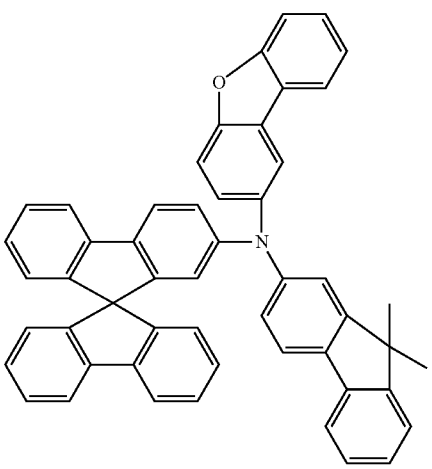

(159)
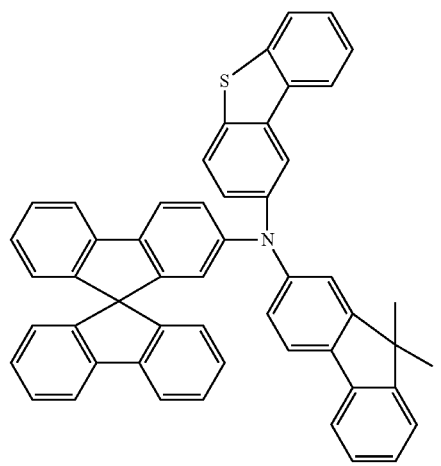
(160)
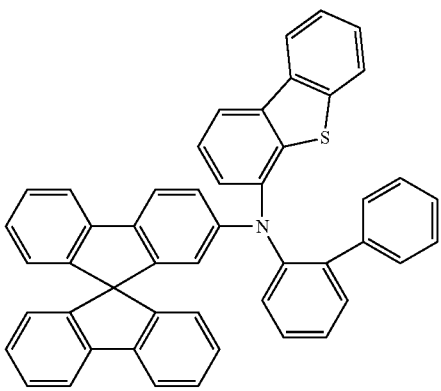
(161)
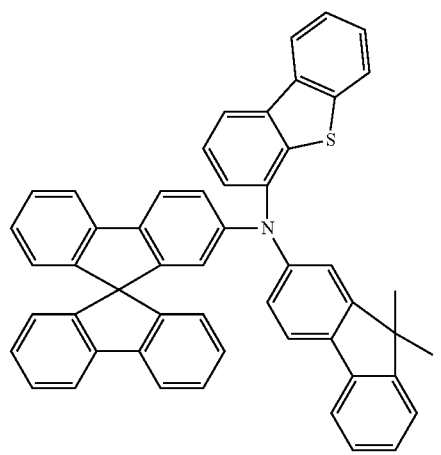
(162)
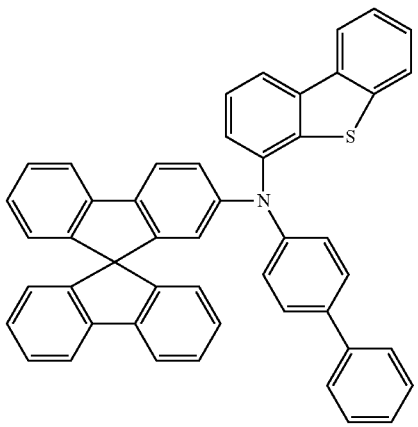
(163)
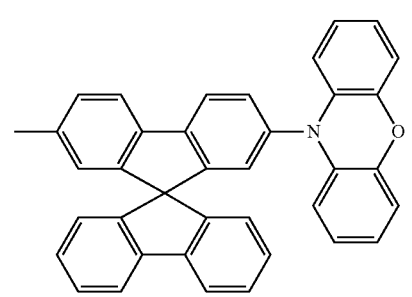
(164)
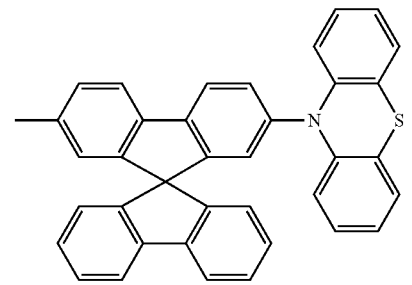
(165)
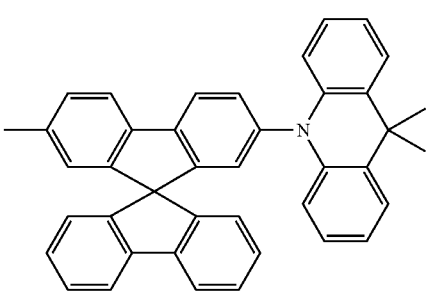
(166)
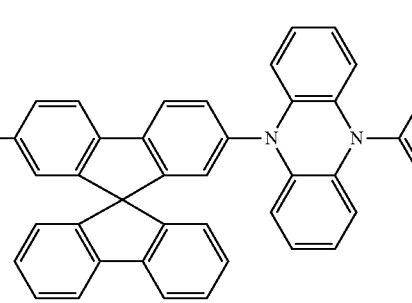

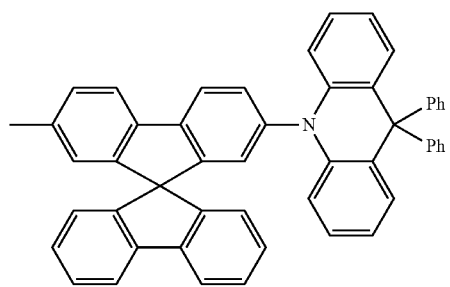
(167)
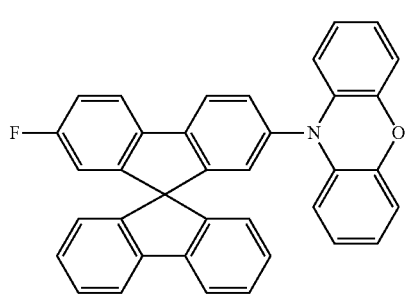
(168)
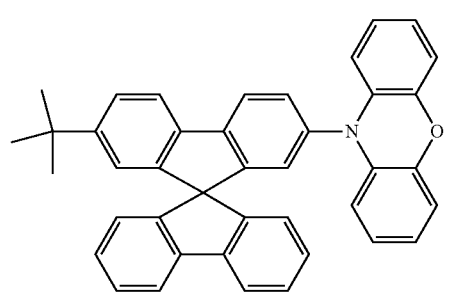
(169)
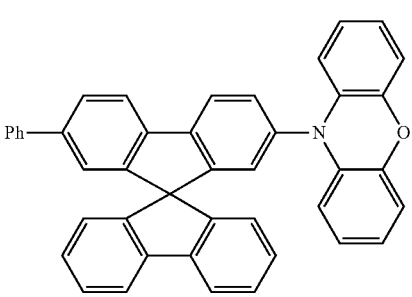
(170)
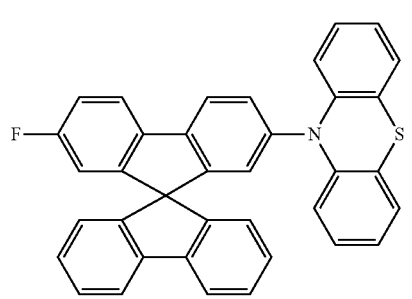
(171)
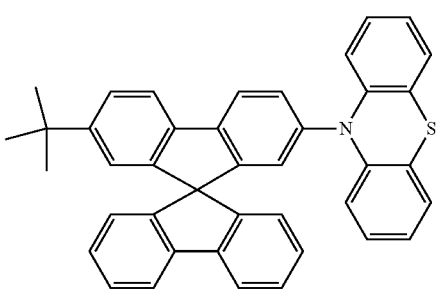
(172)
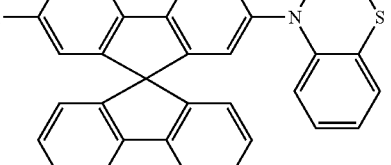
(173)
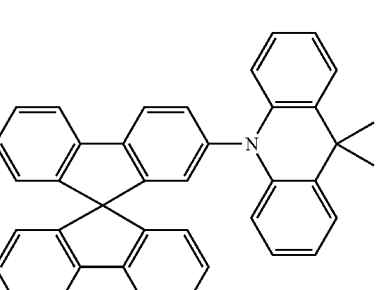
(174)
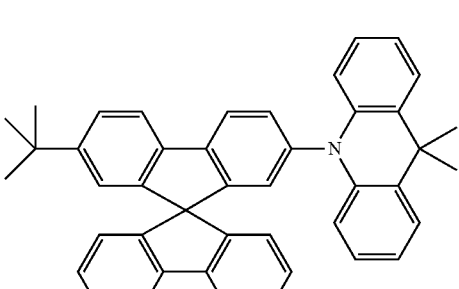
(175)
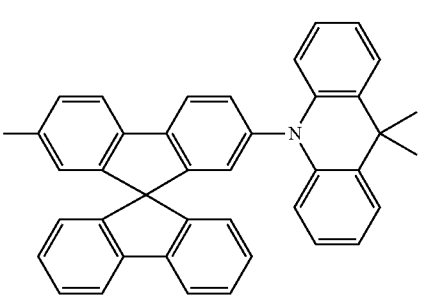
(176)

-continued
(177)
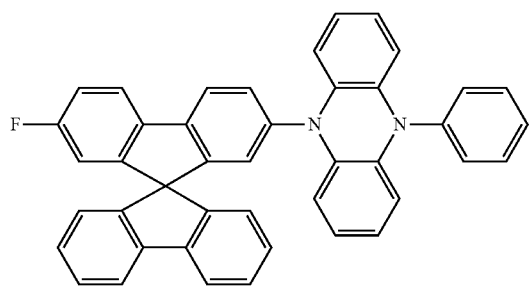
(178)
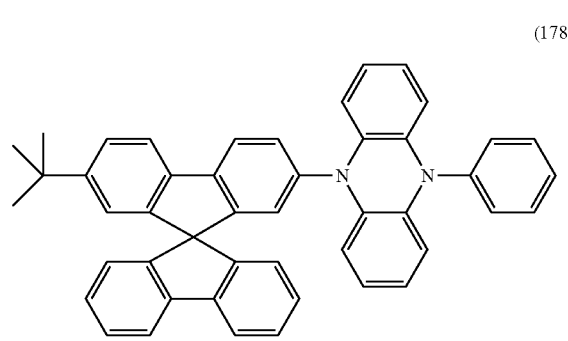
(179)
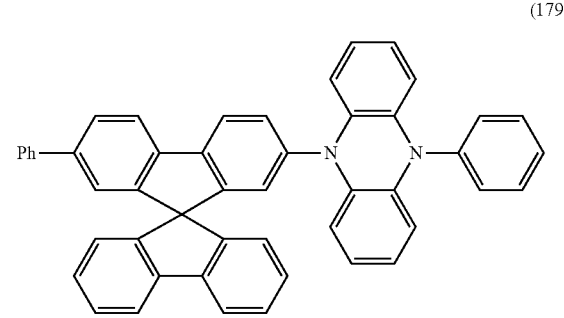
(180)
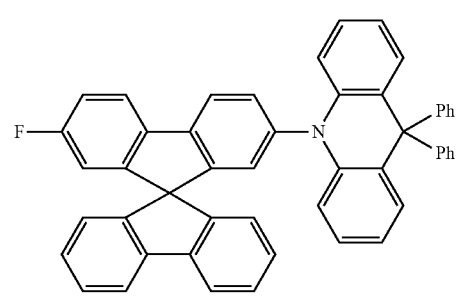
(181)
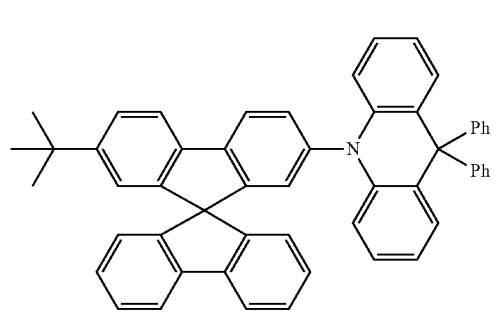
-continued
(182)
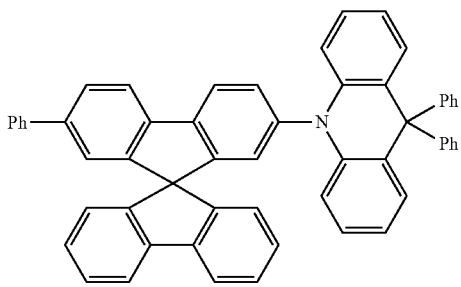
(183)
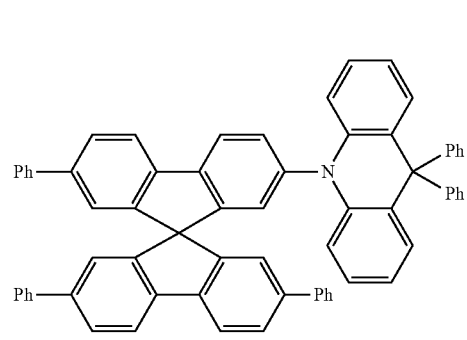
(184)
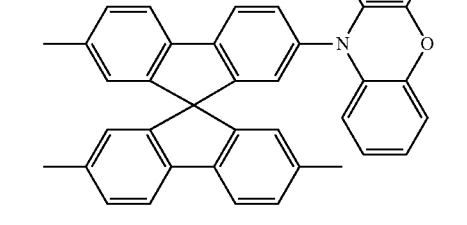
(185)
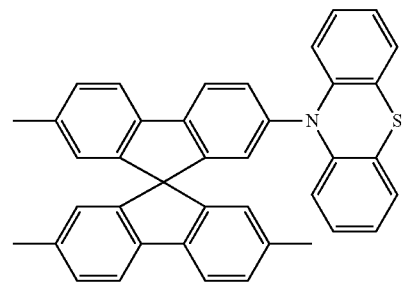
(186)
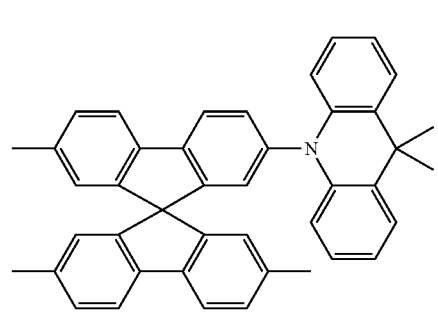

(187) 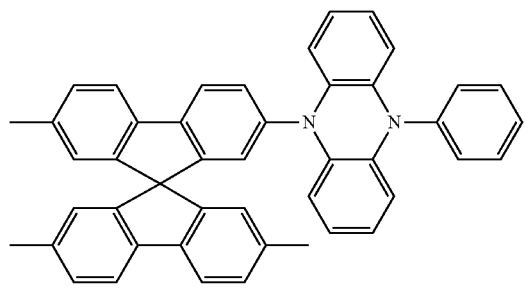
(188) 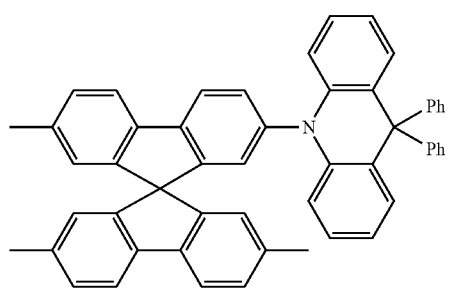
(189) 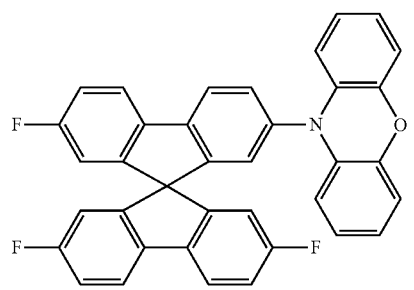
(190) 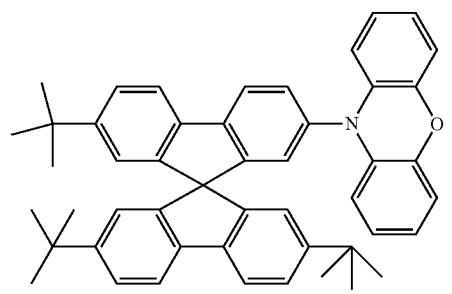
(191) 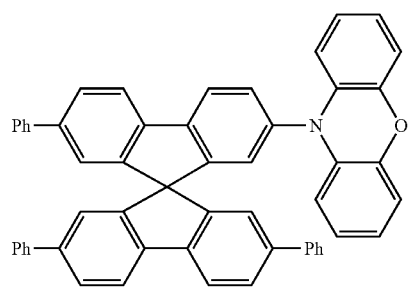
(192) 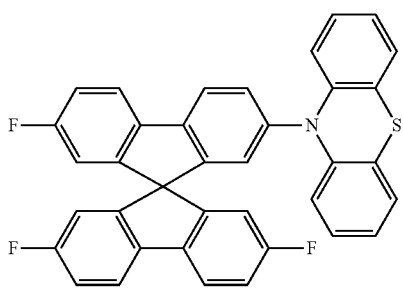
(193) 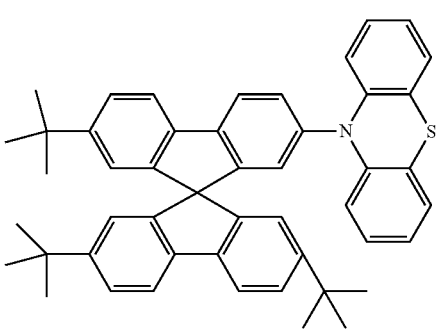
(194) 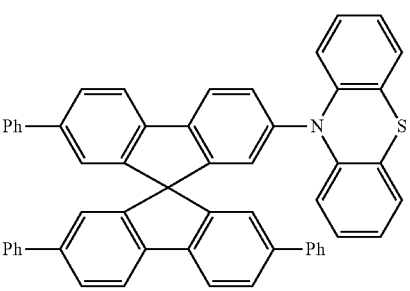
(195) 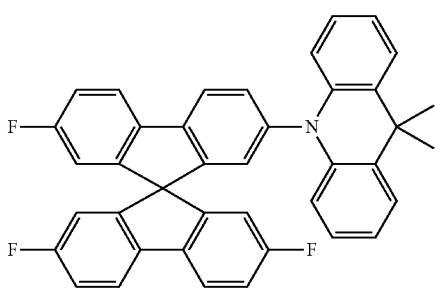
(196) 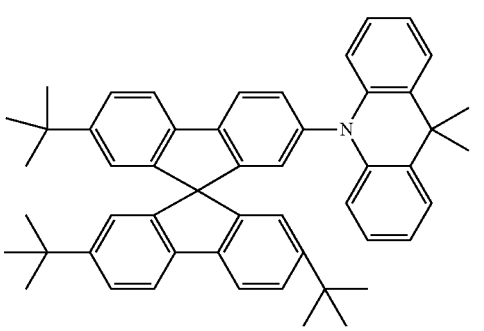

(197) 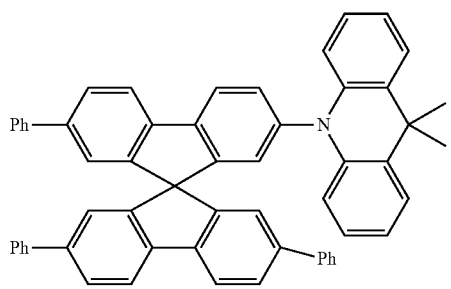
(198) 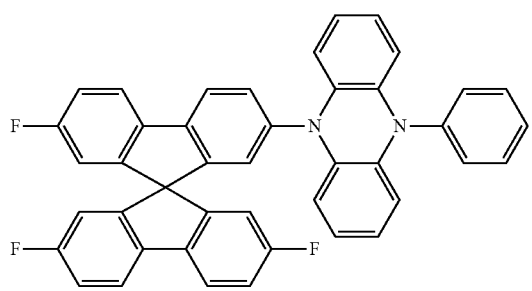
(199) 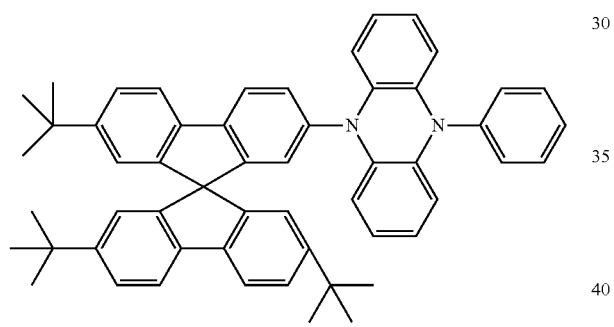
(200) 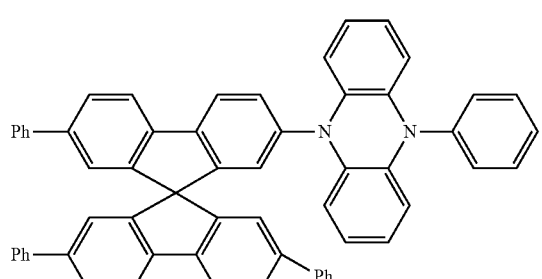
(201) 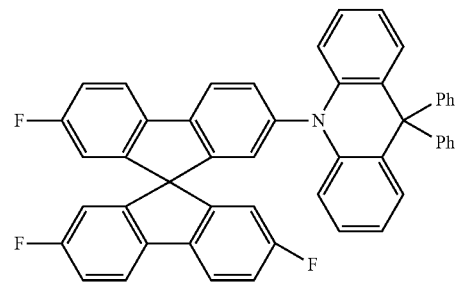
(202) 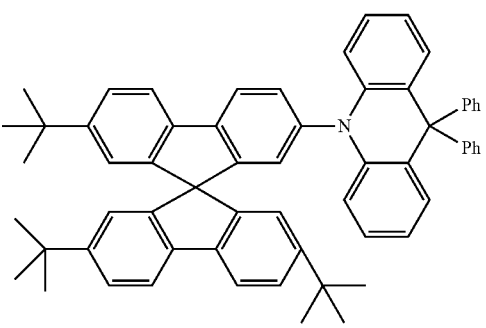
(203) 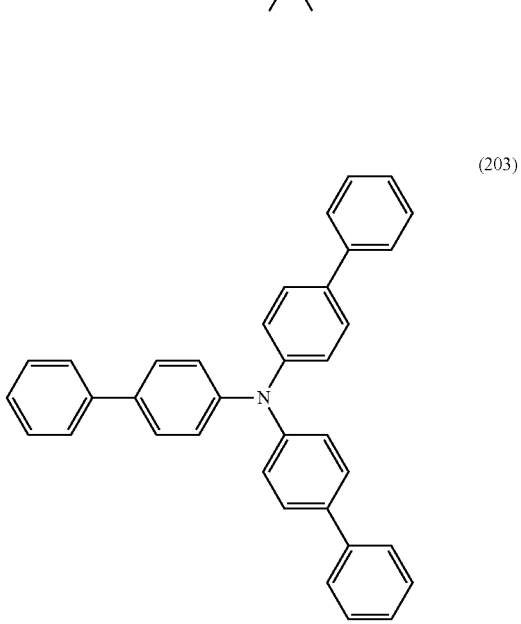
(204) 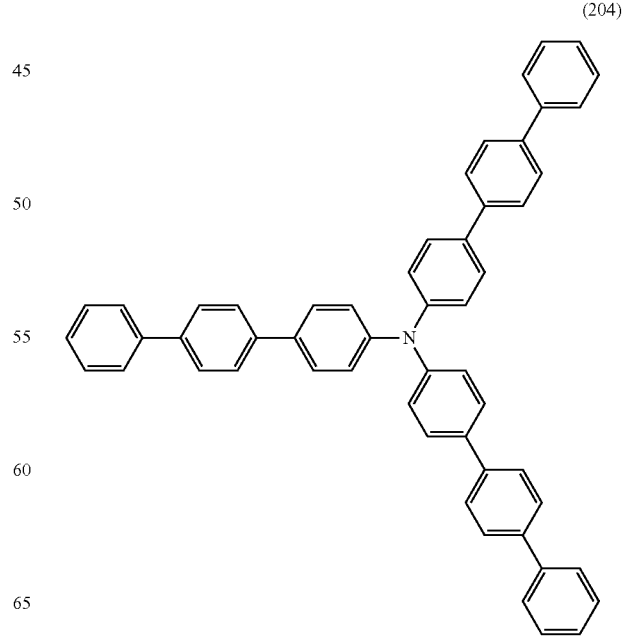

(205)
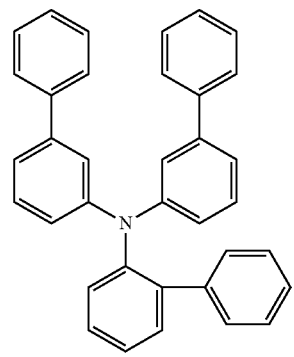
(206)
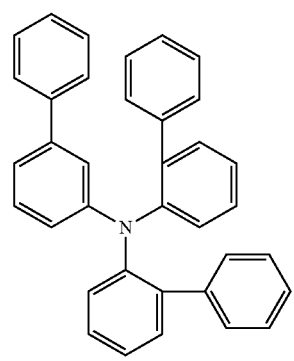
(207)
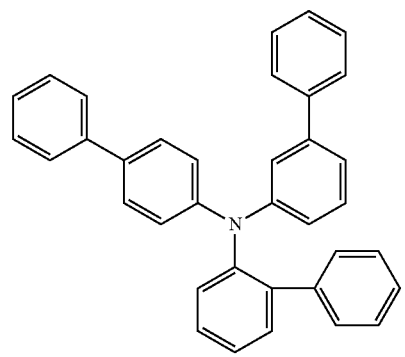
(208)
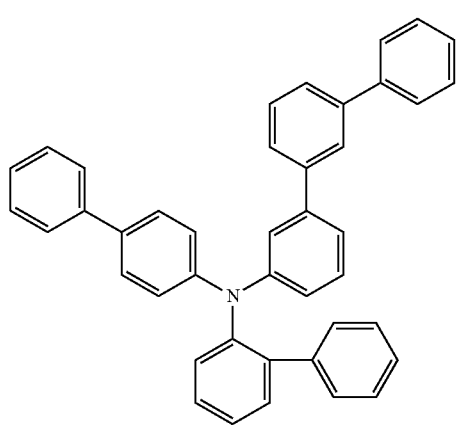
(209)
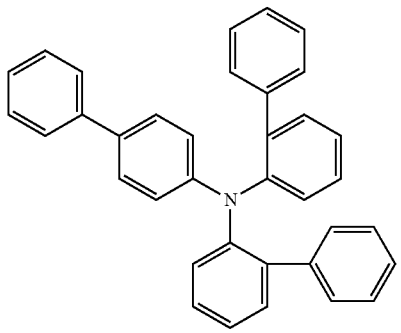
(210)
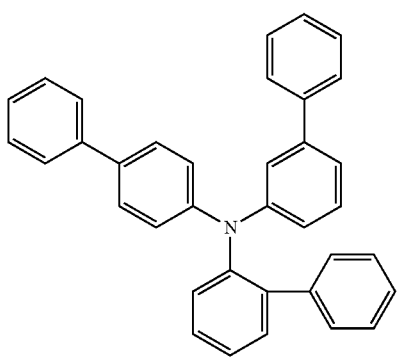
(211)
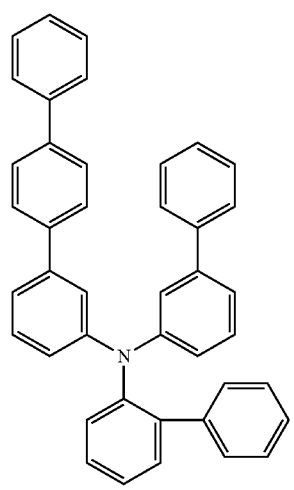
(212)
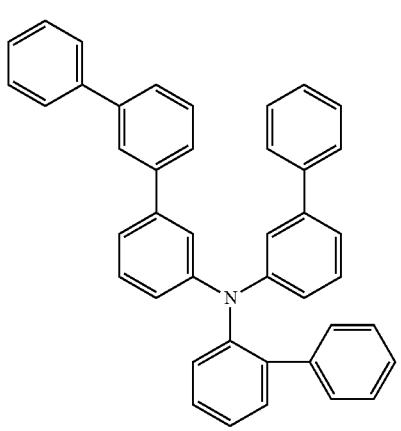

-continued
(213)
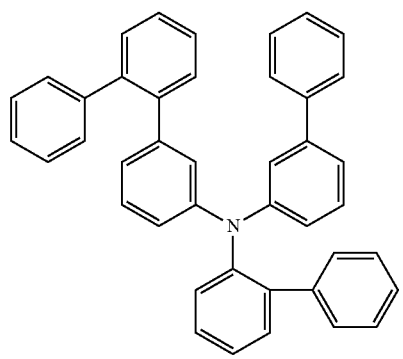
(214)
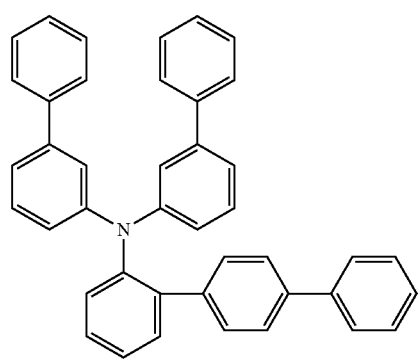
(215)
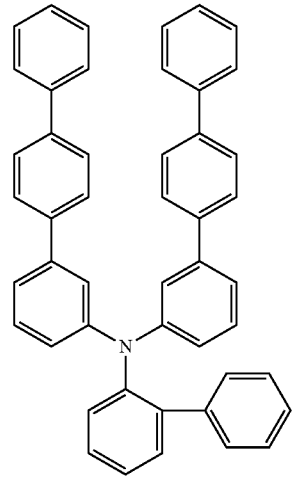
(216)
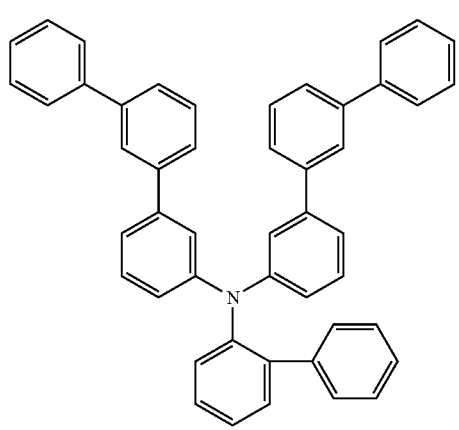
-continued
(217)
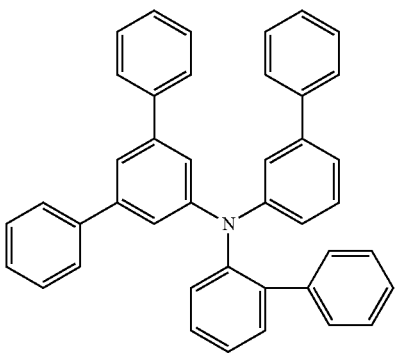
(218)
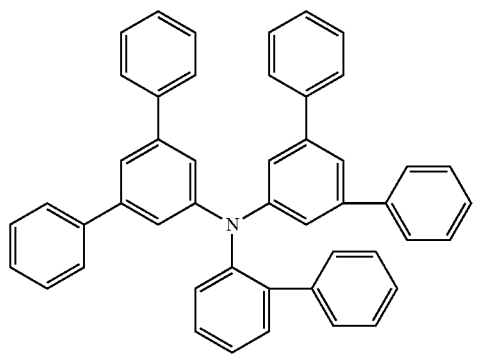
(219)
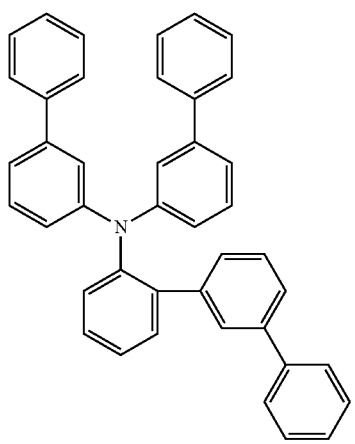
(220)
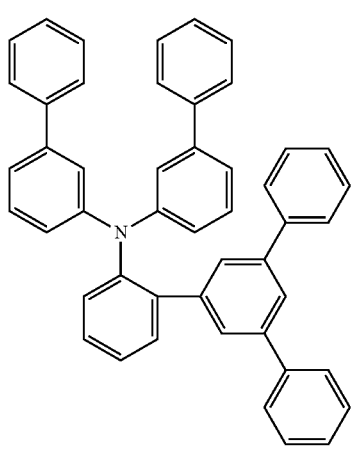

(221)
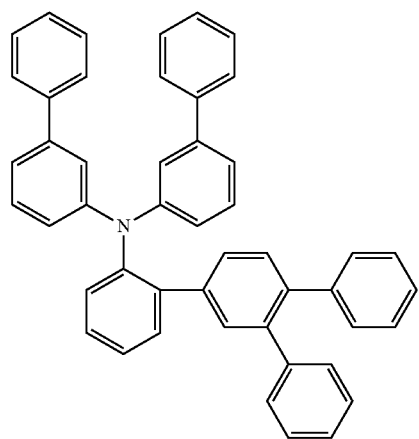
(222)
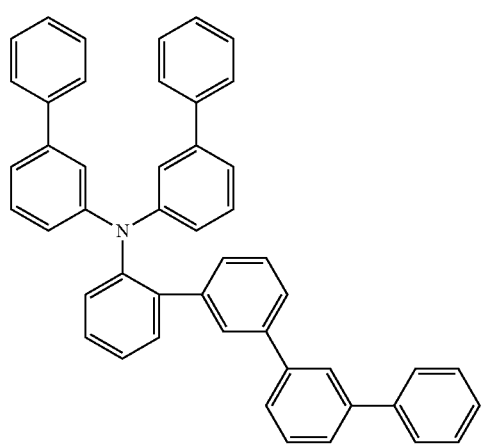
(223)
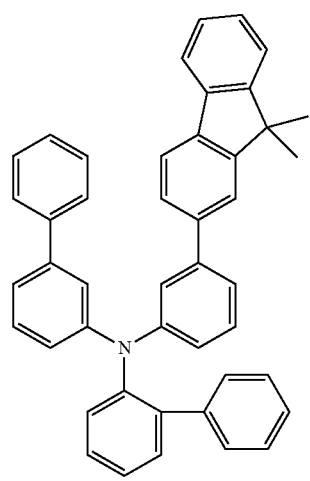
(224)
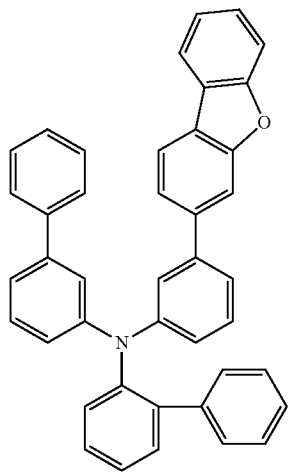
(225)
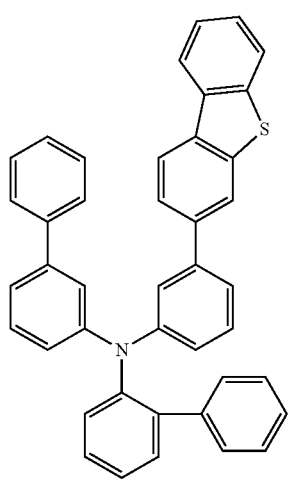
(226)
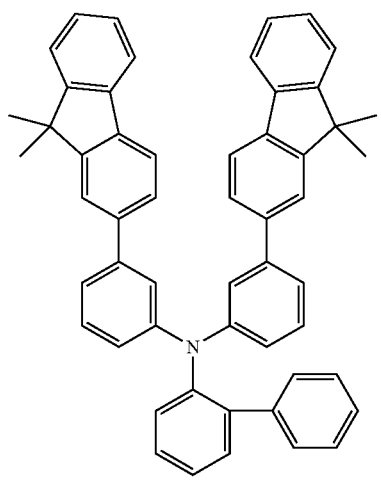

-continued
(227) 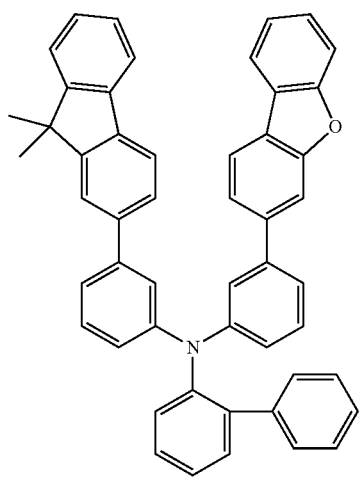
(230) 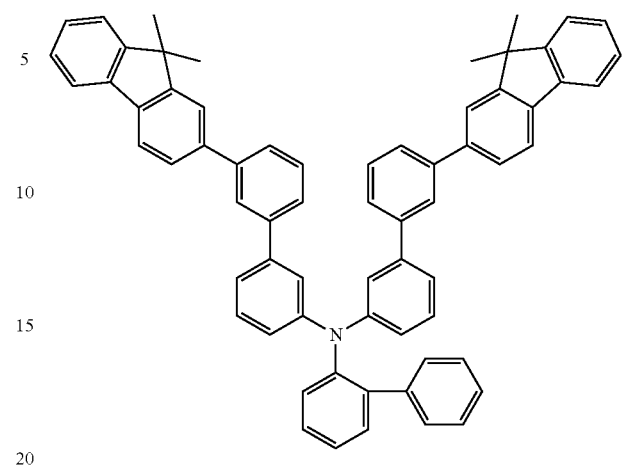
(228) 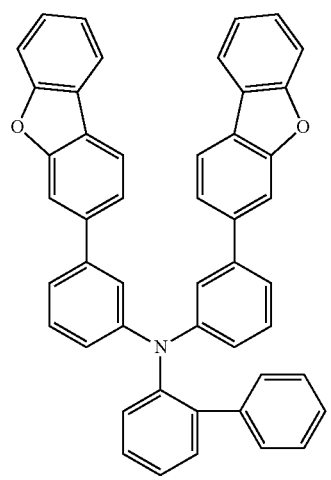
(231) 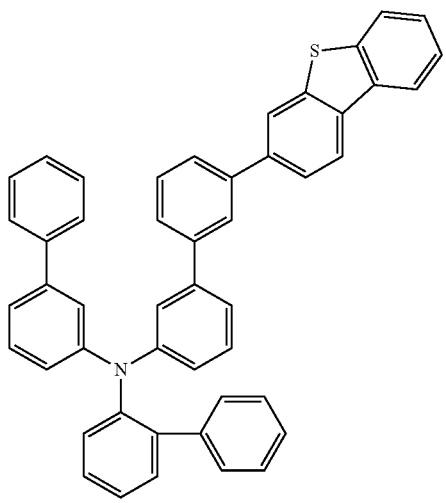
(229) 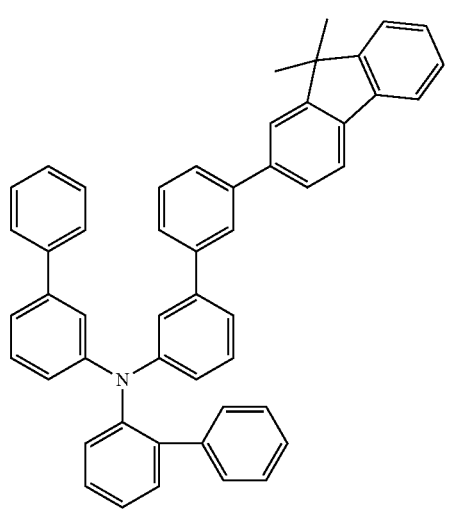
(232) 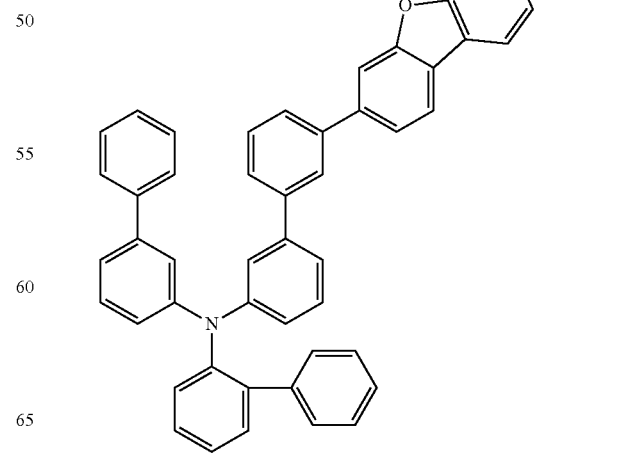

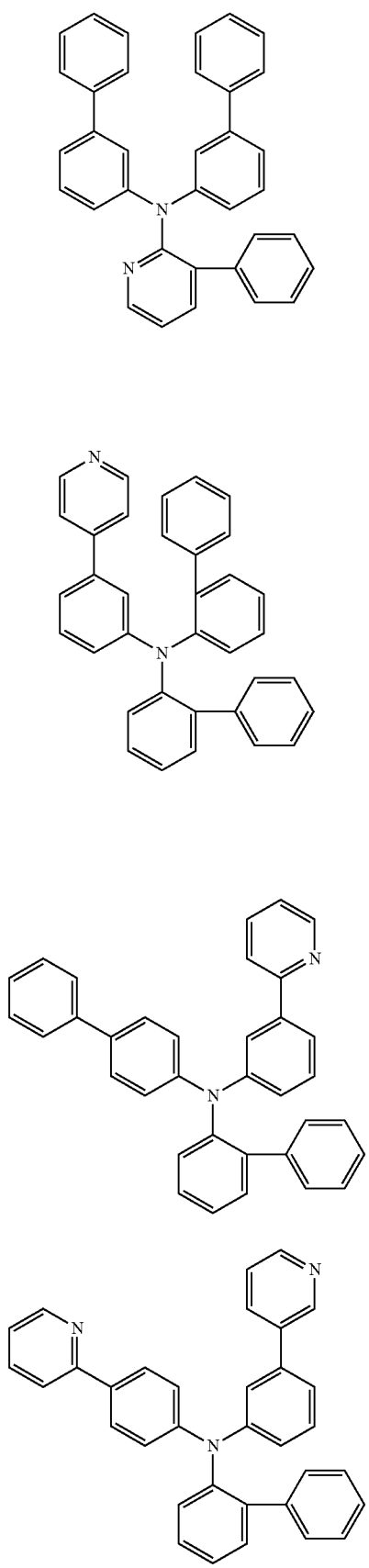
(233)
(234)
(235)
(236)
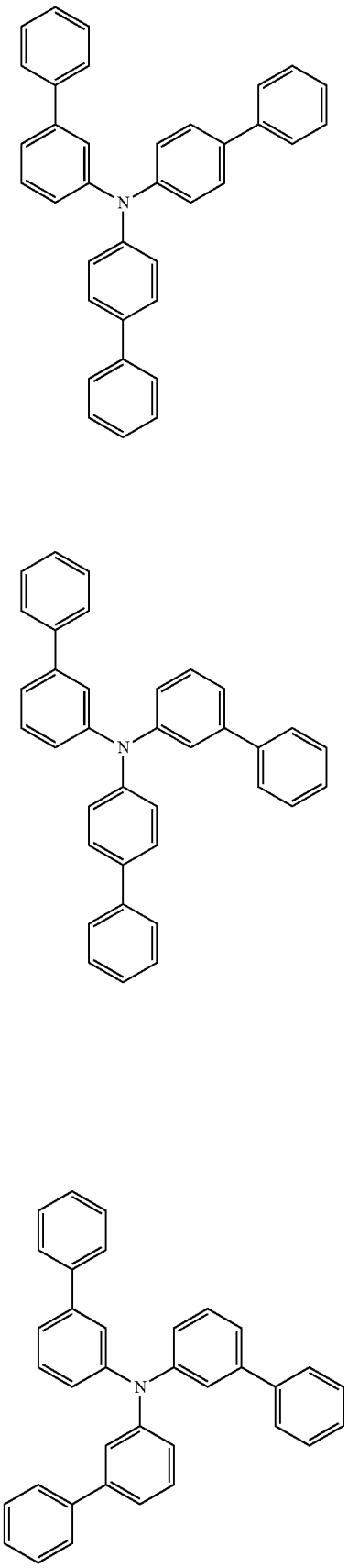
(237)
(238)
(239)

-continued
(240)
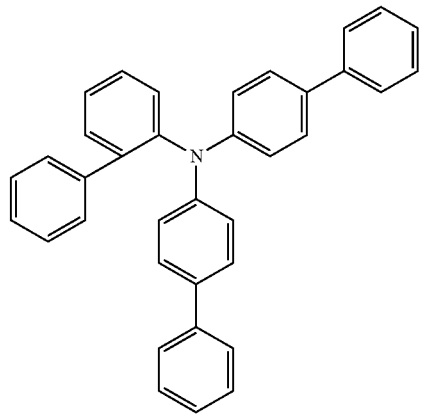
(241)
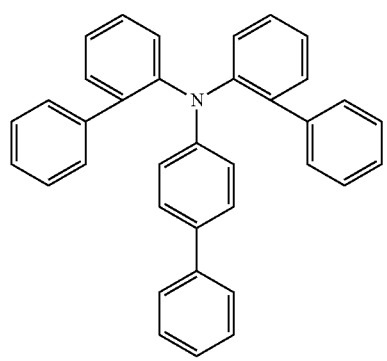
(242)
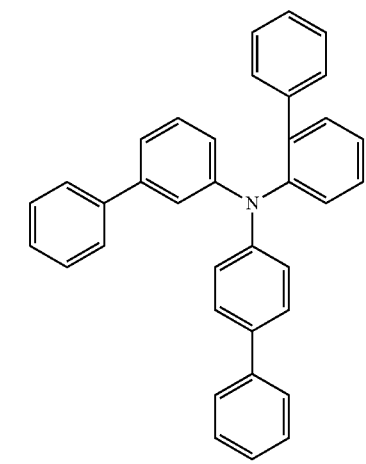
(243)
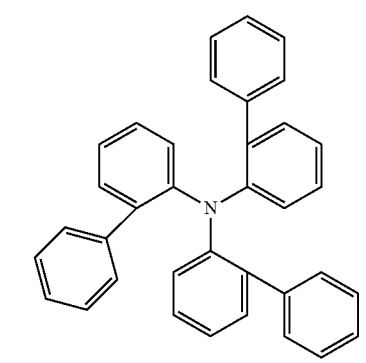
-continued
(244)
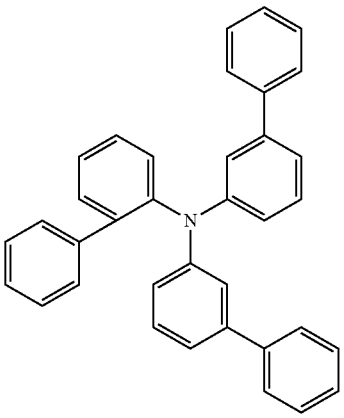
(245)
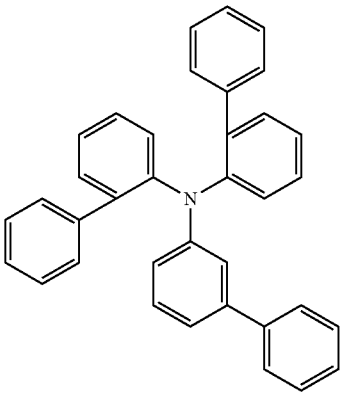
(246)
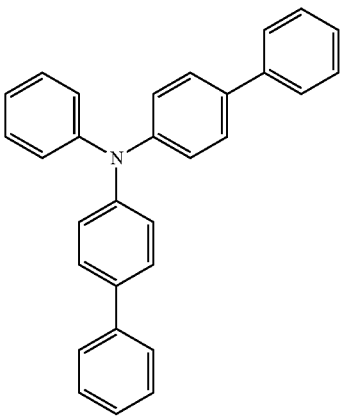
(247)
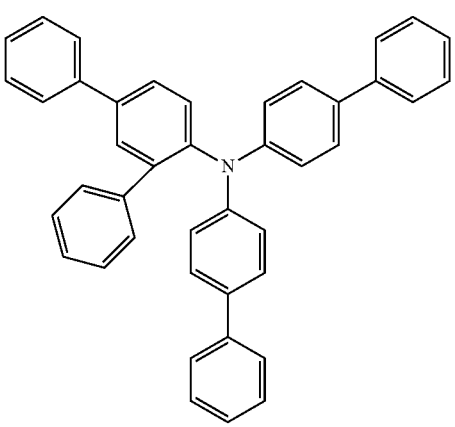

(248)
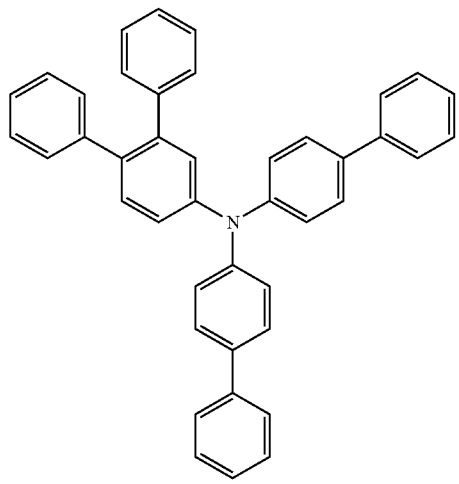
(249)
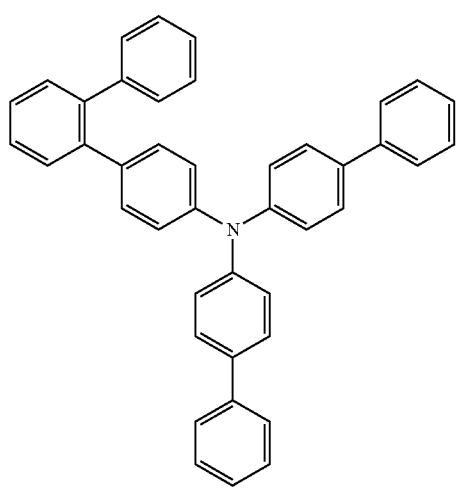
(250)
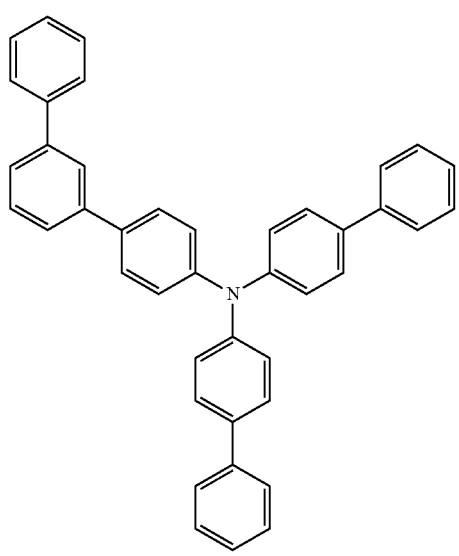
(251)
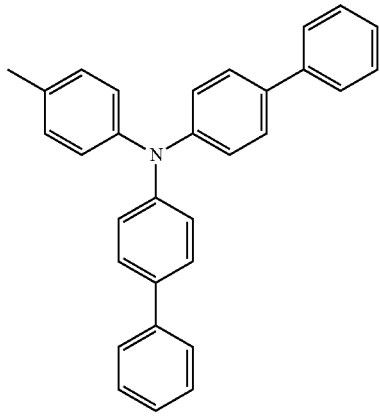
(252)
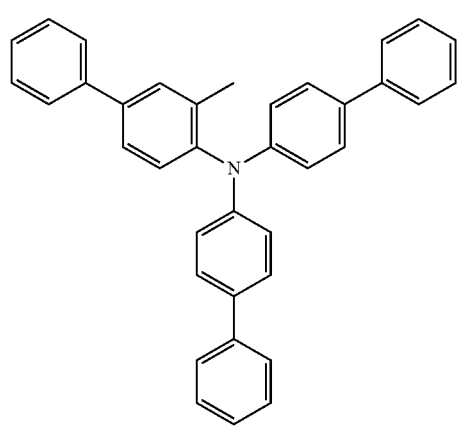
(253)
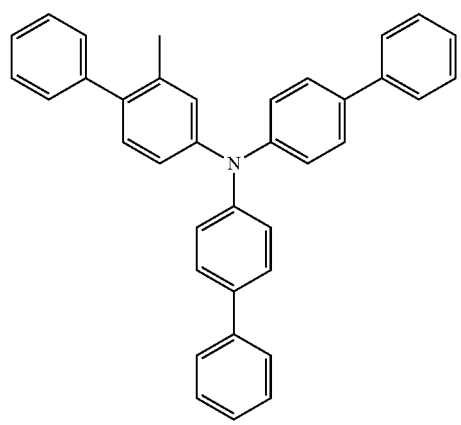

-continued

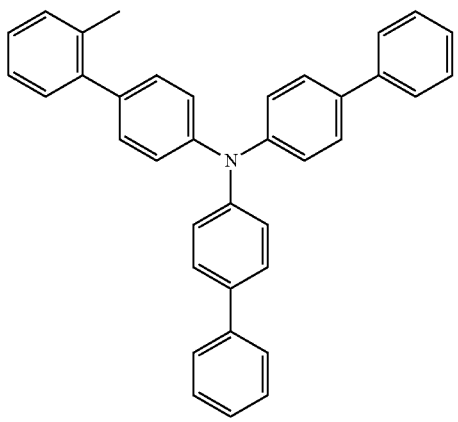
(254)

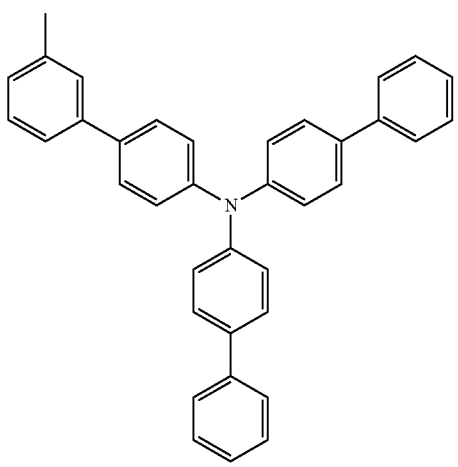
(255)

Further examples of embodiments of the at least two compounds of the formula (I) are disclosed in the applications EP 12005369.9 (not yet published, fluorenemonoamines), EP 12005370.7 (not yet published, fluorenemonoamines), EP 12005371.5 (not yet published, fluorenemonoamines), EP 12000929.5 (not yet published, spirobifluorenemonoamines), EP 11009779.7 (not yet published, trisbiphenylamines), EP 11009127.9 (not yet published, spirobenzopyranamines), WO 2012/150001 (aryl-substituted dihydroacridines), WO 2012/034627 (spirobifluorenemonoamines), JP 1995/053955 (trisbiphenylamines), WO 2006/123667 (trisbiphenylamines) and JP 2010/222268 (trisbiphenylamines) in the corresponding working examples and in the table examples.

Processes for the preparation of the compounds of the formula (I) are known to the person skilled in the art. Processes for the preparation of the preferred compounds of the formula (V-1) are described in the as yet unpublished application EP 11009779.7.

The mixture according to the invention is prepared by mixing the compounds present, in particular the at least two compounds of the formula (I). The mixture can be processed further in various ways.

For the processing of the mixture according to the invention from the liquid phase, for example by spin coating or by printing processes, formulations of the mixture according to the invention are necessary. These formulations can be, for example, solutions, dispersions or emulsions. It may be preferred to use for this purpose mixtures comprising two or more solvents. Suitable and preferred solvents are, for example, toluene, anisole, o-, m- or p-xylene, methyl benzoate, dimethylanisole, mesitylene, tetralin, veratrol, THF, methyl-THF, THP, chlorobenzene, dioxane or mixtures of these solvents. It is preferred for the formulation comprising the mixture according to the invention to comprise one or more polymers, oligomers or dendrimers. The polymers, oligomers or dendrimers are preferably present in the formulation in a concentration of 1-80%, particularly preferably 5-65% and very particularly preferably 10-50%. They serve, in particular, for adjustment of the properties of the formulation, for example the viscosity. Preference is given to the use of polyarylamines, polystyrenes, polyacrylates and polyesters, in particular the use of the polymers disclosed in WO 2011/076325.

The invention thus furthermore relates to a formulation, in particular a solution, dispersion or emulsion, comprising the mixture according to the invention and at least one solvent, preferably an organic solvent. The way in which solutions of this type can be prepared is known to the person skilled in the art and is described, for example, in WO 2002/072714, WO 2003/019694 and the literature cited therein.

The mixture according to the invention is suitable for use in electronic devices, in particular in organic electroluminescent devices (OLEDs).

The invention therefore furthermore relates to the use of the mixture according to the invention in electronic devices and to an electronic device comprising the mixture according to the invention in an organic layer.

The electronic device here is preferably selected from the group consisting of organic integrated circuits (OICs), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and particularly preferably organic electroluminescent devices (OLEDs).

Particular preference is given to an organic electroluminescent device comprising anode, cathode and at least one emitting layer, characterised in that at least one organic layer of the device comprises at least one mixture according to the invention.

Apart from cathode, anode and the emitting layer, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, interlayers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. However, it should be pointed out that each of these layers does not necessarily have to be present and the choice of layers is dependent both on the compounds used and also on whether the electroluminescent device is fluorescent or phosphorescent.

The sequence of the layers of the organic electroluminescent device according to the invention is preferably the following:
anode/hole-injection layer/hole-transport layer/electron-blocking layer/emitting layer/electron-transport layer/electron-injection layer/cathode.

It is not necessary here for all of the said layers to be present, further layers may additionally be present, and individual functional layers may occur multiple times.

Particular preference is given to the following sequence of the layers of the organic electroluminescent device: anode/hole-injection layer 1/hole-injection layer 2/hole-injection layer 3/hole-transport layer/electron-blocking layer/emitting layer/electron-transport layer/cathode.

It is not necessary here for all of the said layers to be present, further layers may additionally be present, and individual functional layers may occur multiple times.

The organic electroluminescent device according to the invention may comprise a plurality of emitting layers. In this case, these emission layers particularly preferably have in total a plurality of emission maxima between 380 nm and 750 nm, resulting overall in white emission, i.e. various emitting compounds which are able to fluoresce or phosphoresce and which emit blue or yellow or orange or red light are used in the emitting layers. Particular preference is given to three-layer systems, i.e. systems having three emitting layers, where the three layers exhibit blue, green and orange or red emission (for the basic structure see, for example, WO 2005/011013). For the generation of white light, a single emitter compound which emits in a broad wavelength range may also be suitable instead of a plurality of emitter compounds emitting in colour.

It is preferred that the mixture according to the invention is used in a layer having a hole-transporting function. This is particularly preferably a hole-injection layer, a hole-transport layer, or an electron-blocking layer. Very particular preference is given to the use in a hole-transport layer or an electron-blocking layer, most preferably in an electron-blocking layer.

For the purposes of the present application, the term hole-transport layer encompasses all organic layers which are located between anode and emitting layer, i.e., in particular, hole-injection layers, hole-transport layers, electron-blocking layers and interlayers. A hole-injection layer in the sense of the present application is taken to mean an organic layer which is directly adjacent to the anode or is separated from the anode by a single coating thereof. An electron-blocking layer is taken to mean an organic layer which is directly adjacent to the emitting layer on the anode side.

The layer comprising the mixture according to the invention may be a p-doped layer. The preferred embodiments of the p-doping and the p-dopants indicated in connection with the mixture according to the invention apply.

The layer comprising the mixture according to the invention is preferably directly adjacent to the emitting layer on the anode side.

According to a further preferred embodiment, the organic electroluminescent device additionally comprises at least one further hole-transporting layer which is arranged on the anode side of the layer comprising the mixture according to the invention.

This further hole-transporting layer is preferably directly adjacent to the layer comprising the mixture according to the invention.

The further hole-transporting layer preferably comprises at least one monotriarylamine. The further hole-transporting layer particularly preferably comprises at least one compound of the formula (I). The preferred embodiments of formula (I) indicated above also apply to the compound of the formula (I) of the further hole-transporting layer. It is furthermore preferred that the compound of the formula (I) is present as pure substance in the further hole-transporting layer, with preferably less than 10% of other compounds in the layer, particularly preferably less than 5% of other compounds in the layer, very particularly preferably less than 1% of other compounds in the layer.

A monotriarylamine is taken to mean a compound which contains a single triarylamine group. A triarylamine group is a group in which three aryl or heteroaryl groups are bonded to a common nitrogen atom. The monotriarylamine preferably contains no further arylamino group. The monotriarylamine particularly preferably contains no further amino group.

According to a further preferred embodiment, the mixture according to the invention is used as host material in an emitting layer of the organic electroluminescent device. The emitting layer here may be a fluorescent layer or a phosphorescent layer. In this case, one or more further host compounds are preferably present besides the mixture according to the invention and the emitter compound.

According to a further preferred embodiment, the mixture according to the invention is used in a coupling-out layer of the electronic device. A coupling-out layer is a layer which is located on the cathode, on the side facing away from the anode. It is used, in particular, in top-emission devices, i.e. devices in which light is emitted through the cathode.

Preferred embodiments of the materials which are used in the corresponding functional layers of the device according to the invention are disclosed below.

The term phosphorescent emitters (=dopants) typically encompasses compounds in which the light emission takes place through a spin-forbidden transition, for example a transition from an excited triplet state or a state having a relatively high spin quantum number, for example a quintet state.

Suitable phosphorescent dopants are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescent dopants used are preferably compounds which contain copper, molybdenum, tungsten, rhenium, ruthenium, osmium, rhodium, iridium, palladium, platinum, silver, gold or europium, in particular compounds which contain iridium, platinum or copper.

For the purposes of the present invention, all luminescent iridium, platinum or copper complexes are regarded as phosphorescent compounds.

Examples of the phosphorescent dopants described above are revealed by the applications WO 2000/70655, WO 2001/41512, WO 2002/02714, WO 2002/15645, EP 1191613, EP 1191612, EP 1191614, WO 2005/033244, WO 2005/019373 and US 2005/0258742. In general, all phosphorescent complexes as used in accordance with the prior art for phosphorescent OLEDs and as are known to the person skilled in the art in the area of organic electroluminescent devices are suitable for use in the devices according to the invention. The person skilled in the art will also be able to employ further phosphorescent complexes without inventive step in combination with the compounds according to the invention in OLEDs.

Preferred fluorescent dopants are selected from the class of the arylamines. An arylamine or an aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms.

Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Besides the mixtures according to the invention, suitable matrix materials, preferably for fluorescent dopants, are materials of various classes of substance. Preferred matrix materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239). Particularly preferred matrix materials are selected from the classes of the oligoarylenes, comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes, comprising anthracene, benzanthracene, benzophenanthrene and/or pyrene or atropisomers of these compounds. An oligoarylene in the sense of this invention is intended to be taken to mean a compound in which at least three aryl or arylene groups are bonded to one another.

Preferred matrix materials for phosphorescent dopants, besides the mixtures according to the invention, are aromatic amines, in particular triarylamines, for example in accordance with US 2005/0069729, carbazole derivatives (for example CBP, N,N-biscarbazolylbiphenyl) or compounds in accordance with WO 2005/039246, US 2005/0069729, JP 2004/288381, EP 1205527 or WO 2008/086851, bridged carbazole derivatives, for example in accordance with WO 2011/088877 and WO 2011/128017, indenocarbazole derivatives, for example in accordance with WO 2010/136109 and WO 2011/000455, azacarbazole derivatives, for example in accordance with EP 1617710, EP 1617711, EP 1731584, JP 2005/347160, indolocarbazole derivatives, for example in accordance with WO 2007/063754 or WO 2008/056746, ketones, for example in accordance with WO 2004/093207 or WO 2010/006680, phosphine oxides, sulfoxides and sulfones, for example in accordance with WO 2005/003253, oligophenylenes, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, aluminium complexes, for example BAlq, diazasilole and tetraazasilole derivatives, for example in accordance with WO 2010/054729, diazaphosphole derivatives, for example in accordance with WO 2010/054730 and aluminium complexes, for example BAlQ.

Besides the mixtures according to the invention, examples of suitable charge-transport materials, as can be used in the hole-injection or hole-transport layer or electron-blocking layer or in the electron-transport layer of the organic electroluminescent device according to the invention, are the compounds disclosed in Y. Shirota et al., Chem. Rev. 2007, 107(4), 953-1010 or other materials as are employed in these layers in accordance with the prior art.

Examples of preferred hole-transport materials which can be used in a hole-transport, hole-injection or electron-blocking layer in the electroluminescent device according to the invention have already been disclosed above.

The cathode of the organic electroluminescent device according to the invention preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Mg/Ag or Ba/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent or partially transparent in order to facilitate either the irradiation of the organic material (organic solar cells) or the coupling-out of light (OLEDs, O-lasers). Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally sealed, since the lifetime of the devices according to the invention is drastically shortened in the presence of water and/or air.

In a preferred embodiment, the organic electroluminescent device according to the invention is characterised in that one or more layers, in particular the layer comprising the mixture according to the invention, are coated by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

The application of the mixture according to the invention can be carried out on the one hand by evaporation of the mixture. On the other hand, the mixture can be prepared in situ by co-evaporation of the various mixture components.

Preference is likewise given to an organic electroluminescent device, characterised in that one or more layers, in particular the layer comprising the mixture according to the invention, are coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing.

It is furthermore preferred, for the production of the organic electroluminescent device according to the invention, to apply one or more layers from solution and one or more layers by a sublimation process.

The electronic device according to the invention can be employed in displays, as light source in lighting applications and as light source in medical and/or cosmetic applications (for example phototherapy).

WORKING EXAMPLES

Example 1: DSC Investigations

Materials used: see Table 6

The material mixtures are obtained in the form of transparent organic glasses by weighing 1 g of each of the individual materials HTM1 to 6 (purity in each case >99.95% according to HPLC, sublimed twice) into an ampoule, evacuating the ampoule (base pressure about $10^{-6}$ mbar) and sealing the ampoule by melting in vacuo, melting the ampoule contents and cooling to room temperature.

| Material or material mixture | Mixture composition (% by weight) | Tg/ °C. | Tm/ °C. |
|---|---|---|---|
| HTM1 | 100% | 136 | 257 |
| HTM2 | 100% | 59 | n.o. |
| HTM3 | 100% | 67 | 194 |
| HTM4 | 100% | 63 | 224 |
| HTM5 | 100% | 148 | n.o. |
| HTM6 | 100% | 143 | 301 |
| M1 | HTM2 (50%)/HTM3 (50%) | 62 | n.o. |
| M2 | HTM1 (50%)/HTM5 (50%) | 139 | n.o. |
| M3 | HTM1 (50%)/HTM2 (50%) | 79 | n.o. |
| M4 | HTM2 (33.3%)/HTM3 (33.3%)/HTM4 (33.3%) | 64 | n.o. |
| M5 | HTM1 (33.3%)/HTM2 (33.3%)/HTM5 (33.3%) | 75 | n.o. |
| M6 | HTM1 (33.3%)/HTM5 (33.3%)/HTM6 (33.3%) | 139 | n.o. |
| M7 | HTM3 (50%)/ HTM4 (50%) | 65 | n.o. |
| M8 | HTM5 (50%)/HTM6 (50%) | 145 | n.o. |
| M9 | HTM2 (50%)/HTM4 (50%) | 62 | n.o. | n.o.: not observed

The DSC measurements are carried out on a TA Instruments Q 2000 series. The temperature range for the first and second heating/cooling cycles is 0 to 290° C. at a heating or cooling rate of 20 K/min.

In the case of mixtures M1 to M9, no crystallisation is observed during several heating and cooling cycles on heating above Tg, and no recrystallisation is observed on correspondingly subsequent cooling. They thus constantly remain in glass form.

In the case of the individual compounds HTM1, HTM3, HTM4 and HTM6, by contrast, crystallisation is observed on heating above Tg, followed by melting and recrystallisation on subsequent cooling.

Example 2: Production of the OLEDs and General Device Data

OLEDs according to the invention and OLEDs in accordance with the prior art are produced by a general process in accordance with WO 2004/058911, which is adapted to the circumstances described here (layer-thickness variation, materials).

The data of various OLEDs are presented in the following examples (see Tables 1 to 4). Glass plates coated with structured ITO (indium tin oxide) in a thickness of 50 nm are used. These coated glass plates form the substrates to which the OLEDs are applied. The OLEDs have in principle the following layer structure: substrate/hole-injection layer (HIL)/hole-transport layers (HTL)/interlayer (IL)/optional hole-transport layer (HTL2), electron-blocking layer (EBL)/emission layer (EML)/electron-transport layer (ETL) and finally a cathode. The cathode is formed by an aluminium layer with a thickness of 100 nm. The precise structure of the OLEDs is shown in Table 1 and 3. The materials required for the production of the OLEDs are shown in Table 6.

All materials are applied by thermal vapour deposition in a vacuum chamber. The emission layer here always consists of at least one matrix material (host material) and at least one emitting dopant (emitter) which is admixed with the matrix material or the matrix materials in a certain proportion by volume by co-evaporation. An expression such as H1:SEB1 (95%:5%) here means that material H1 is present in the layer in a proportion by volume of 95% and SEB1 is present in the layer in a proportion of 5%. The electron-transport layer or the hole-transport layer according to the invention may analogously also consist of a mixture of two materials.

The OLEDs are characterised by standard methods. For this purpose, the electroluminescence spectra and the external quantum efficiency (EQE, measured in percent) as a function of the luminous density, calculated from current/voltage/luminous density characteristic lines (IUL characteristic lines), assuming Lambert emission characteristics, are determined. The electroluminescence spectra are determined at a luminous density of 1000 cd/m$^2$ and the CIE 1931 x and y colour coordinates are calculated therefrom. The expression U @ 1000 cd/m$^2$ in Table 2 and 4 denotes the voltage required for a luminous density of 1000 cd/m$^2$. Finally, EQE @ 1000 cd/m$^2$ denotes the external quantum efficiency at an operating luminous density of 1000 cd/m$^2$. The data of the various OLEDs are summarised in Table 2 and 4.

It is observed that the mixtures according to the invention have improved values for the voltage and/or the power efficiency on use as hole-transport material, compared with the compounds employed as individual compounds in accordance with the prior art. This is consistently apparent for all mixtures measured, reference is made by way of example to E8 (mixture 8 comprising HTM5 and HTM6) compared with V5 (HTM5) and V6 (HTM6).

The advantages also occur on use in an OLED comprising a phosphorescent emitter, cf. Table 4.

TABLE 1

Structure of the OLEDs

| Ex. | IL Thickness/ nm | HIL Thickness/ nm | IL Thickness/ nm | HTL Thickness/ nm | EBL Thickness/ nm | EML Thickness/ nm | ETL Thickness/ nm |
|---|---|---|---|---|---|---|---|
| V1 | HIL1 5 nm | HIL2 190 nm | HIL1 5 nm | HTM1 10 nm | HTM1 10 nm | H1(95%):SEB1(5%) 20 nm | ETM1(50%):LiQ(50%) 30 nm |
| V2 | HIL1 5 nm | HIL2 190 nm | HIL1 5 nm | HTM1 10 nm | HTM2 10 nm | H1(95%):SEB1(5%) 20 nm | ETM1(50%):LiQ(50%) 30 nm |
| V3 | HIL1 5 nm | HIL2 190 nm | HIL1 5 nm | HTM1 10 nm | HTM3 10 nm | H1(95%):SEB1(5%) 20 nm | ETM1(50%):LiQ(50%) 30 nm |
| V4 | HIL1 5 nm | HIL2 190 nm | HIL1 5 nm | HTM1 10 nm | HTM4 10 nm | H1(95%):SEB1(5%) 20 nm | ETM1(50%):LiQ(50%) 30 nm |
| V5 | HIL1 5 nm | HIL2 190 nm | HIL1 5 nm | HTM1 10 nm | HTM5 10 nm | H1(95%):SEB1(5%) 20 nm | ETM1(50%):LiQ(50%) 30 nm |
| V6 | HIL1 5 nm | HIL2 190 nm | HIL1 5 nm | HTM1 10 nm | HTM6 10 nm | H1(95%):SEB1(5%) 20 nm | ETM1(50%):LiQ(50%) 30 nm |
| E1 | HIL1 5 nm | HIL2 190 nm | HIL1 5 nm | HTM1 10 nm | HTM2(50%):HTM3(50%) 10 nm | H1(95%):SEB1(5%) 20 nm | ETM1(50%):LiQ(50%) 30 nm |
| E2 | HIL1 5 nm | HIL2 190 nm | HIL1 5 nm | HTM1 10 nm | HTM1(50%):HTM5(50%) 10 nm | H1(95%):SEB1(5%) 20 nm | ETM1(50%):LiQ(50%) 30 nm |
| E3 | HIL1 5 nm | HIL2 190 nm | HIL1 5 nm | HTM1 10 nm | HTM1(50%):HTM2(50%) 10 nm | H1(95%):SEB1(5%) 20 nm | ETM1(50%):LiQ(50%) 30 nm |
| E4 | HIL1 5 nm | HIL2 190 nm | HIL1 5 nm | HTM1 10 nm | HTM2(33.3%):HTM3(33.3%):HTM4(33.3%) 10 nm | H1(95%):SEB1(5%) 20 nm | ETM1(50%):LiQ(50%) 30 nm |
| E5 | HIL1 5 nm | HIL2 190 nm | HIL1 5 nm | HTM1 10 nm | HTM1(33.3%):HTM2(33.3%):HTM5(33.3%) 10 nm | H1(95%):SEB1(5%) 20 nm | ETM1(50%):LiQ(50%) 30 nm |
| E6 | HIL1 5 nm | HIL2 190 nm | HIL1 5 nm | HTM1 10 nm | HTM1(33.3%):HTM5(33.3%):HTM6(33.3%) 10 nm | H1(95%):SEB1(5%) 20 nm | ETM1(50%):LiQ(50%) 30 nm |
| E7 | HIL1 5 nm | HIL2 190 nm | HIL1 5 nm | HTM1 10 nm | HTM3(50%):HTM4(50%) 10 nm | H1(95%):SEB1(5%) 20 nm | ETM1(50%):LiQ(50%) 30 nm |
| E8 | HIL1 5 nm | HIL2 190 nm | HIL1 5 nm | HTM1 10 nm | HTM5(50%):HTM6(50%) 10 nm | H1(95%):SEB1(5%) 20 nm | ETM1(50%):LiQ(50%) 30 nm |
| E9 | HIL1 5 nm | HIL2 190 nm | HIL1 5 nm | HTM1 10 nm | HTM2(50%):HTM4(50%) 10 nm | H1(95%):SEB1(5%) 20 nm | ETM1(50%):LiQ(50%) 30 nm |

TABLE 2

Data of the OLEDs from Table 1

| Ex. | U @ 1000 cd/m2 V | EQE @ 1000 cd/m2 % | CIE x | CIE y |
|---|---|---|---|---|
| V1 | 4.0 | 8.1 | 0.14 | 0.16 |
| V2 | 4.1 | 8.3 | 0.14 | 0.16 |
| V3 | 4.1 | 8.4 | 0.14 | 0.16 |
| V4 | 4.1 | 8.3 | 0.14 | 0.16 |
| V5 | 4.3 | 8.5 | 0.14 | 0.16 |
| V6 | 4.3 | 8.5 | 0.14 | 0.16 |
| E1 | 4.0 | 8.3 | 0.14 | 0.16 |
| E2 | 4.1 | 8.4 | 0.14 | 0.16 |
| E3 | 3.9 | 8.2 | 0.14 | 0.16 |
| E4 | 3.9 | 8.3 | 0.14 | 0.16 |
| E5 | 4.1 | 8.3 | 0.14 | 0.16 |
| E6 | 4.2 | 8.4 | 0.14 | 0.16 |
| E7 | 4.0 | 8.3 | 0.14 | 0.16 |
| E8 | 4.2 | 8.5 | 0.14 | 0.16 |
| E9 | 4.0 | 8.3 | 0.14 | 0.16 |

TABLE 3

Structure of the OLEDs

| Ex. | IL Thickness/ nm | HIL Thickness/ nm | IL Thickness/ nm | HTL Thickness/ nm | EBL Thickness/ nm | EML Thickness/ nm | ETL Thickness/ nm |
|---|---|---|---|---|---|---|---|
| V7 | HIL1 5 nm | HIL2 220 nm | HIL1 5 nm | HTM1 10 nm | HTM1 10 nm | H2(88%):Irpy(12%) 30 nm | ETM1(50%):LiQ(50%) 40 nm |
| V8 | HIL1 5 nm | HIL2 220 nm | HIL1 5 nm | HTM1 10 nm | HTM2 10 nm | H2(88%):Irpy(12%) 30 nm | ETM1(50%):LiQ(50%) 40 nm |
| V9 | HIL1 5 nm | HIL2 220 nm | HIL1 5 nm | HTM1 10 nm | HTM3 10 nm | H2(88%):Irpy(12%) 30 nm | ETM1(50%):LiQ(50%) 40 nm |
| V10 | HIL1 5 nm | HIL2 220 nm | HIL1 5 nm | HTM1 10 nm | HTM4 10 nm | H2(88%):Irpy(12%) 30 nm | ETM1(50%):LiQ(50%) 40 nm |
| V11 | HIL1 5 nm | HIL2 220 nm | HIL1 5 nm | HTM1 10 nm | HTM5 10 nm | H2(88%):Irpy(12%) 30 nm | ETM1(50%):LiQ(50%) 40 nm |
| V12 | HIL1 5 nm | HIL2 220 nm | HIL1 5 nm | HTM1 10 nm | HTM6 10 nm | H2(88%):Irpy(12%) 30 nm | ETM1(50%):LiQ(50%) 40 nm |

TABLE 3-continued

Structure of the OLEDs

| Ex. | IL Thickness/ nm | HIL Thickness/ nm | IL Thickness/ nm | HTL Thickness/ nm | EBL Thickness/ nm | EML Thickness/ nm | ETL Thickness/ nm |
|---|---|---|---|---|---|---|---|
| E10 | HIL1 5 nm | HIL2 220 nm | HIL1 5 nm | HTM1 10 nm | HTM2(50%):HTM3(50%) 10 nm | H2(88%):Irpy(12%) 30 nm | ETM1(50%):LiQ(50%) 40 nm |
| E11 | HIL1 5 nm | HIL2 220 nm | HIL1 5 nm | HTM1 10 nm | HTM1(50%):HTM5(50%) 10 nm | H2(88%):Irpy(12%) 30 nm | ETM1(50%):LiQ(50%) 40 nm |
| E12 | HIL1 5 nm | HIL2 220 nm | HIL1 5 nm | HTM1 10 nm | HTM1(50%):HTM2(50%) 10 nm | H2(88%):Irpy(12%) 30 nm | ETM1(50%):LiQ(50%) 40 nm |
| E13 | HIL1 5 nm | HIL2 220 nm | HIL1 5 nm | HTM1 10 nm | HTM2(33.3%):HTM3(33.3%):HTM4(33.3%) 10 nm | H2(88%):Irpy(12%) 30 nm | ETM1(50%):LiQ(50%) 40 nm |
| E14 | HIL1 5 nm | HIL2 220 nm | HIL1 5 nm | HTM1 10 nm | HTM1(33.3%):HTM2(33.3%):HTM5(33.3%) 10 nm | H2(88%):Irpy(12%) 30 nm | ETM1(50%):LiQ(50%) 40 nm |
| E15 | HIL1 5 nm | HIL2 220 nm | HIL1 5 nm | HTM1 10 nm | HTM1(33.3%):HTM5(33.3%):HTM6(33.3%) 10 nm | H2(88%):Irpy(12%) 30 nm | ETM1(50%):LiQ(50%) 40 nm |
| E16 | HIL1 5 nm | HIL2 220 nm | HIL1 5 nm | HTM1 10 nm | HTM3(50%):HTM4(50%) 10 nm | H2(88%):Irpy(12%) 30 nm | ETM1(50%):LiQ(50%) 40 nm |
| E17 | HIL1 5 nm | HIL2 220 nm | HIL1 5 nm | HTM1 10 nm | HTM5(50%):HTM6(50%) 10 nm | H2(88%):Irpy(12%) 30 nm | ETM1(50%):LiQ(50%) 40 nm |
| E18 | HIL1 5 nm | HIL2 220 nm | HIL1 5 nm | HTM1 10 nm | HTM2(50%):HTM4(50%) 10 nm | H2(88%):Irpy(12%) 30 nm | ETM1(50%):LiQ(50%) 40 nm |

TABLE 4

Data of the OLEDs from Table 3

| Ex. | U @ 1000 cd/m2 V | EQE @ 1000 cd/m2 % | CIE x | CIE y |
|---|---|---|---|---|
| V7 | 3.6 | 17.8 | 0.32 | 0.63 |
| V8 | 3.7 | 18.1 | 0.32 | 0.63 |
| V9 | 3.7 | 18.5 | 0.32 | 0.63 |
| V10 | 3.7 | 18.3 | 0.32 | 0.63 |
| V11 | 3.9 | 18.7 | 0.32 | 0.63 |
| V12 | 3.9 | 18.9 | 0.32 | 0.63 |
| E10 | 3.6 | 18.1 | 0.32 | 0.63 |
| E11 | 3.7 | 18.5 | 0.32 | 0.63 |
| E12 | 3.5 | 18.2 | 0.32 | 0.63 |
| E13 | 3.5 | 18.3 | 0.32 | 0.63 |
| E14 | 3.7 | 18.3 | 0.32 | 0.63 |
| E15 | 3.8 | 18.4 | 0.32 | 0.63 |
| E16 | 3.6 | 18.3 | 0.32 | 0.63 |
| E17 | 3.8 | 18.7 | 0.32 | 0.63 |
| E18 | 3.6 | 18.1 | 0.32 | 0.63 |

TABLE 5

Change in the OLED efficiency after heating

| Ex. | EQE @ 1000 cd/m2 before heating % | EQE @ 1000 cd/m2 after heating for 1 h % | Temperature ° C. |
|---|---|---|---|
| V2 | 8.3 | <7.1 | 63 |
| V3 | 8.4 | <7.2 | 67 |
| V4 | 8.3 | <7.1 | 67 |
| V8 | 18.1 | <16.0 | 63 |
| V9 | 18.5 | <16.5 | 67 |
| V10 | 18.3 | <16.1 | 67 |
| E7 | 8.3 | 8.2 | 67 |
| E9 | 8.3 | 8.3 | 63 |
| E16 | 18.3 | 18.1 | 67 |
| E18 | 18.1 | 18.0 | 63 |

Example 3: Behaviour of the OLEDs on Heating

OLEDs having the structure shown in Table 1 and 3 are used.

OLEDs which comprise the mixtures according to the invention do not exhibit reduced efficiency if they are stored for 1 hour at a temperature which corresponds to the glass transition temperature Tg of the individual compound having the highest glass transition temperature (Table 5, E7, E9, E16 and E18).

By contrast, the efficiencies of the comparative OLEDs under the same storage conditions (Table 5, V2-V4 and V8-V10) exhibit a significantly reduced efficiency (>10%, the precise efficiency reduction is dependent on the kinetics of each individual OLED device, so that only the most favourable value is shown).

TABLE 6

Structures of the materials used

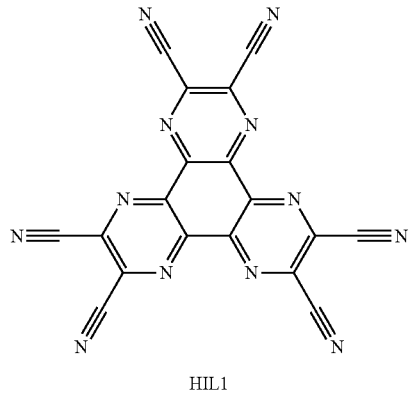 [SMILES: N#Cc1nc2c3nc(C#N)c(C#N)nc3c3nc(C#N)c(C#N)nc3c2nc1C#N]

HIL1

TABLE 6-continued
Structures of the materials used
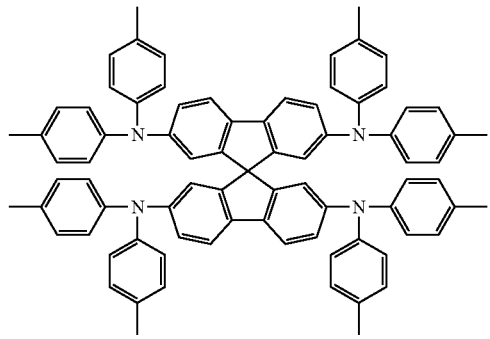
HIL2
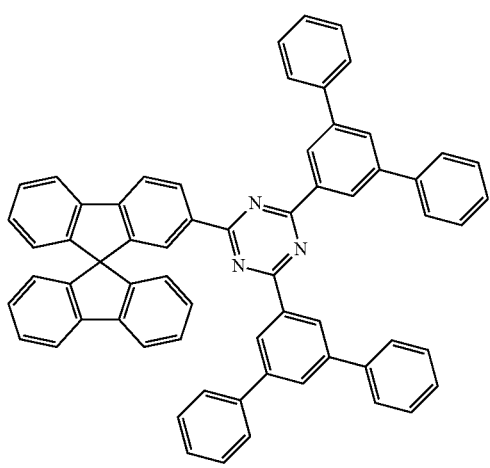
ETM1
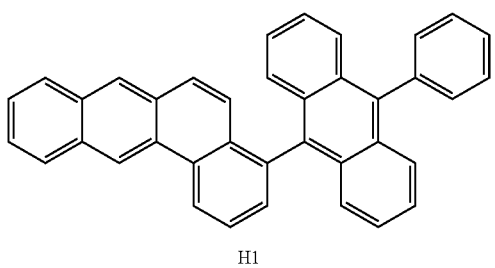
H1
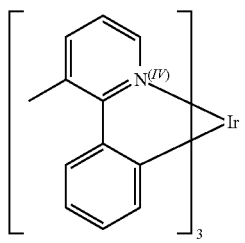
Irpy
TABLE 6-continued
Structures of the materials used
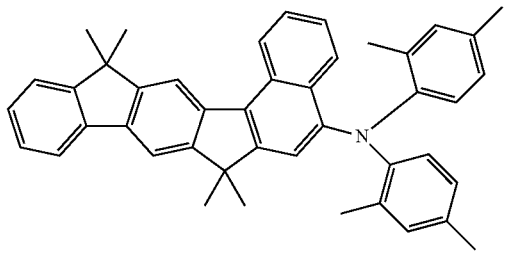
SEB1
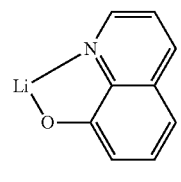
LiQ
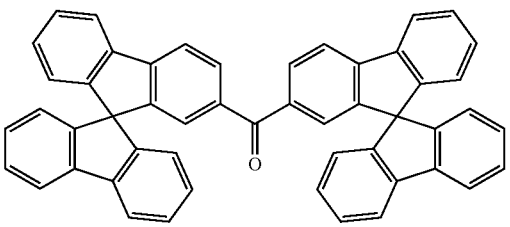
H2
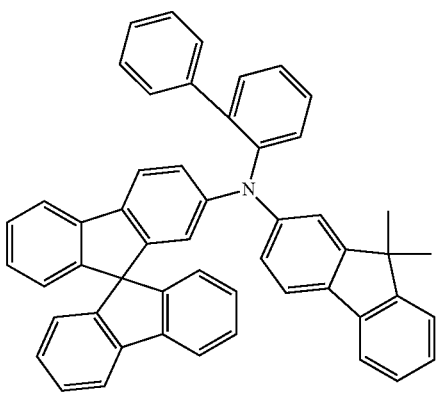
HTM1

TABLE 6-continued

Structures of the materials used

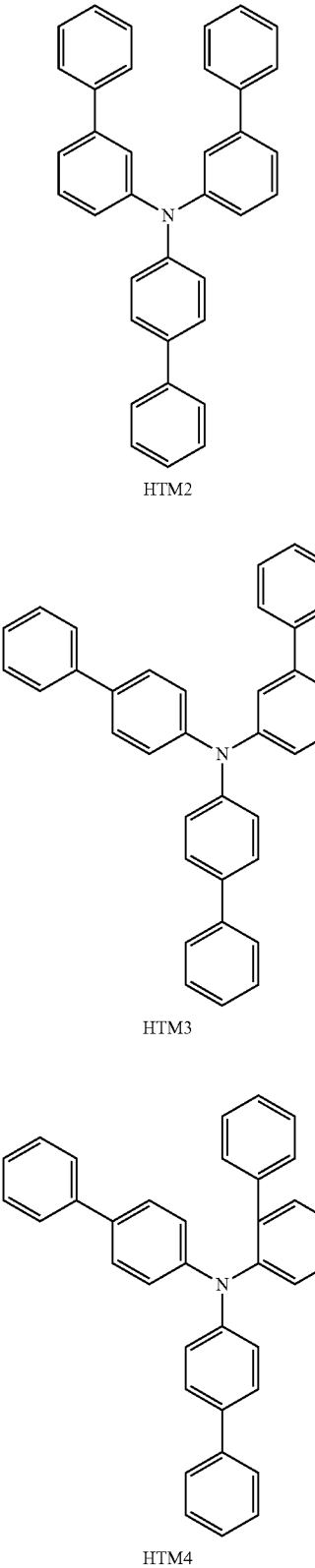

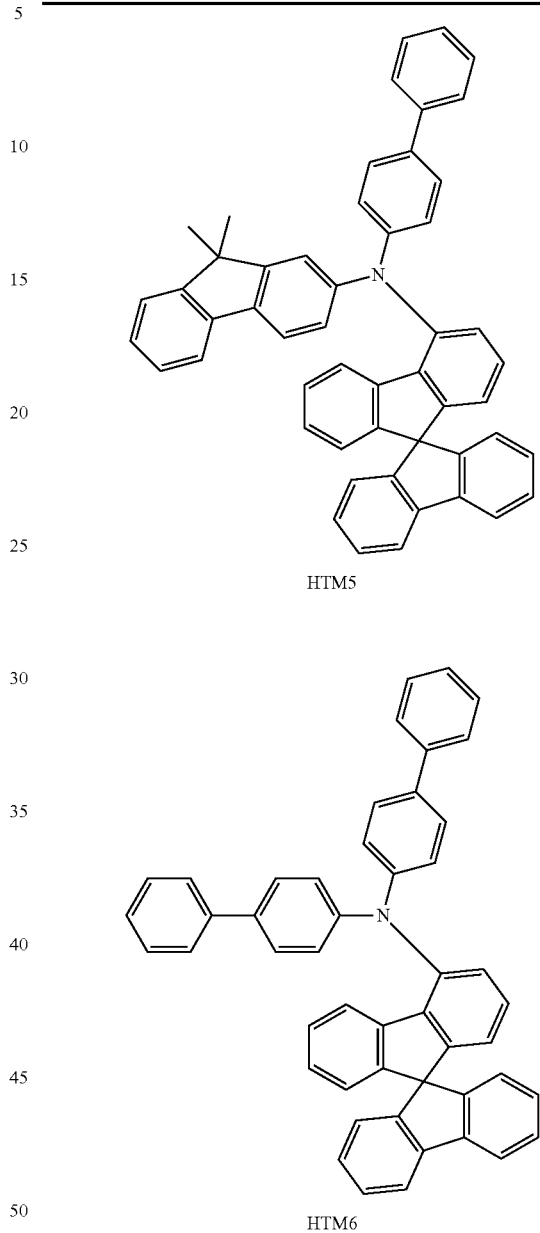

Synthesis of Compounds HTM1-HTM6:

Some of the compounds are known in the prior art with their synthesis. In all cases, the synthesis of similar compounds is known in the prior art. Synthesis and use of HTM4 is described in the as yet unpublished application EP 11009779.7. Synthesis and use of HTM5 and HTM6 are described in the as yet unpublished application EP 12000929.5.

The invention claimed is:

1. An organic electroluminescent device comprising an organic layer which consists of a mixture consisting of two different compounds of the formula (V)

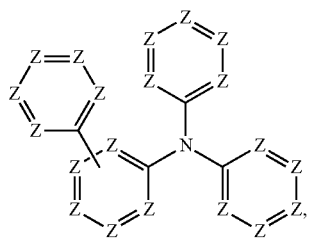

formula (V)

wherein
- R$^1$ is on each occurrence, identically or differently, H, D, F, a straight-chain alkyl having 1 to 20 C atoms or a branched or cyclic alkyl having 3 to 20 C atoms where the above-mentioned groups may each be substituted by one or more radicals R$^2$ and where one or more H atoms in the above-mentioned groups is optionally replaced by D, F or CN, or an aromatic or heteroaromatic ring system having 5 to 30 aromatic ring atoms, which may in each case be substituted by one or more radicals R$^2$;
- R$^2$ is on each occurrence, identically or differently, H, D, F or an aliphatic, aromatic or heteroaromatic organic radical having 1 to 20 C atoms, in which, in addition, one or more H atoms is optionally replaced by D or F; and
- Z is on each occurrence, identically or differently, CR$^1$;

and wherein each of the two compounds of the formula (V) is present in a proportion of at least 40% in the mixture and the difference in proportion by % is 0 to 20 percent points.

2. The organic electroluminescent device according to claim 1, wherein the at least two compounds of the formula (V) contain no further nitrogen atom which carries three substituents apart from the nitrogen atom shown in formula (V).

3. The organic electroluminescent device according to claim 1, wherein the mixture comprising two different compounds of the formula (V) is used in a hole-transport layer.

4. The organic electroluminescent device according to claim 1, wherein the mixture is present in a hole transport layer, and at least one further hole transport layer is arranged on the anode side of the hole transport layer in which the mixture is present.

5. The organic electroluminescent device according to claim 4, wherein at least one of the hole transport layers comprises a p-dopant.

6. The organic electroluminescent device according to claim 1, wherein R$^1$ is on each occurrence, identically or differently, H, a straight-chain alkyl group having 1 to 20 C atoms or a branched or cyclic alkyl group having 3 to 20 C atoms, or an aromatic or heteroaromatic ring system having 5 to 30 aromatic ring atoms, which may in each case be substituted by one or more radicals R$^2$; and R$^2$ is on each occurrence, identically or differently, H or an aliphatic, aromatic or heteroaromatic organic radical having 1 to 20 C atoms.

7. The organic electroluminescent device according to claim 6, wherein each of the compounds of the formula (V) is present in a proportion of at least 45% in the mixture and the difference in proportion by % is 0 to 10 percent points.

8. The organic electroluminescent device according to claim 1, wherein each of the compounds of the formula (V) is present in a proportion of at least 45% in the mixture and the difference in proportion by % is 0 to 10 percent points.

9. An organic electroluminescent device which comprises a hole-transport layer comprising a mixture which comprises two compounds of the formula (V)

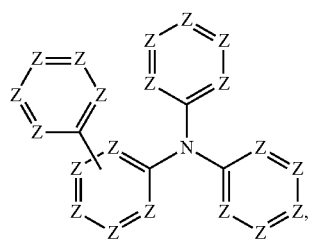

formula (V)

wherein
- R$^1$ is on each occurrence, identically or differently, H, D, F, CN, Si(R$^2$)$_3$, a straight-chain alkyl having 1 to 20 C atoms or a branched or cyclic alkyl having 3 to 20 C atoms, where the above-mentioned groups may each be substituted by one or more radicals R$^2$ and where one or more H atoms in the above-mentioned groups is optionally replaced by D, F or CN, or an aromatic or heteroaromatic ring system having 5 to 30 aromatic ring atoms, which may in each case be substituted by one or more radicals R$^2$;
- R$^2$ is on each occurrence, identically or differently, H, D, F or an aliphatic, aromatic or heteroaromatic organic radical having 1 to 20 C atoms, in which, in addition, one or more H atoms is optionally replaced by D or F;

where the following applies:

Z is on each occurrence, identically or differently, CR$^1$;

and wherein each of the two compounds of the formula (V) is present in a proportion of at least 40% in the mixture and the difference in proportion by % is 0 to 20 percent points.

10. The device according to claim 9, wherein the at least two compounds of the formula (V) contain no further nitrogen atom which carries three substituents apart from the nitrogen atom shown in formula (V).

11. The organic electroluminescent device according to claim 9, wherein R$^1$ is on each occurrence, identically or differently, H, a straight-chain alkyl group having 1 to 20 C atoms or a branched or cyclic alkyl group having 3 to 20 C atoms, or an aromatic or heteroaromatic ring system having 5 to 30 aromatic ring atoms, which may in each case be substituted by one or more radicals R$^2$; and R$^2$ is on each occurrence, identically or differently, H or an aliphatic, aromatic or heteroaromatic organic radical having 1 to 20 C atoms.

12. The organic electroluminescent device according to claim 11, wherein each of the compounds of the formula (V) is present in a proportion of at least 45% in the mixture and the difference in proportion by % is 0 to 10 percent points.

13. The organic electroluminescent device according to claim 9, wherein each of the compounds of the formula (V) is present in a proportion of at least 45% in the mixture and the difference in proportion by % is 0 to 10 percent points.

14. A mixture which comprises two compounds of the formula (V)

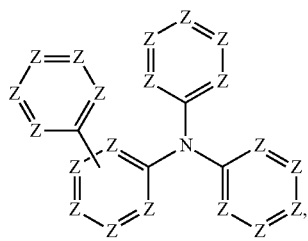

formula (V)

wherein
R¹ is on each occurrence, identically or differently, H, D, F, CN, Si(R²)₃, a straight-chain alkyl having 1 to 20 C atoms or a branched or cyclic alkyl having 3 to 20 C atoms, where the above-mentioned groups may each be substituted by one or more radicals R² and where one or more H atoms in the above-mentioned groups is optionally replaced by D, F or CN, or an aromatic or heteroaromatic ring system having 5 to 30 aromatic ring atoms, which may in each case be substituted by one or more radicals R²;
R² is on each occurrence, identically or differently, H, D, F or an aliphatic, aromatic or heteroaromatic organic radical having 1 to 20 C atoms, in which, in addition, one or more H atoms is optionally replaced by D or F; where the following applies:
Z is on each occurrence, identically or differently, CR¹;
and wherein each of the two compounds of the formula (V) is present in a proportion of at least 40% in the mixture and the difference in proportion by % is 0 to 20 percent points.

15. The mixture according to claim 14, wherein R¹ is on each occurrence, identically or differently, H, a straight-chain alkyl group having 1 to 20 C atoms or a branched or cyclic alkyl group having 3 to 20 C atoms, or an aromatic or heteroaromatic ring system having 5 to 30 aromatic ring atoms, which may in each case be substituted by one or more radicals R²; and
R² is on each occurrence, identically or differently, H or an aliphatic, aromatic or heteroaromatic organic radical having 1 to 20 C atoms.

16. The mixture according to claim 14, wherein each of the compounds of the formula (V) is present in a proportion of at least 45% in the mixture and the difference in proportion by % is 0 to 10 percent points.

\* \* \* \* \*